US010871711B2

(12) United States Patent
Hatakeyama et al.

(10) Patent No.: US 10,871,711 B2
(45) **Date of Patent: *Dec. 22, 2020**

(54) RESIST COMPOSITION AND PATTERNING PROCESS

(71) Applicant: Shin-Etsu Chemical Co., Ltd., Tokyo (JP)

(72) Inventors: Jun Hatakeyama, Joetsu (JP); Masaki Ohashi, Joetsu (JP); Masahiro Fukushima, Joetsu (JP); Takayuki Fujiwara, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 176 days.

This patent is subject to a terminal disclaimer.

(21) Appl. No.: 16/130,271

(22) Filed: Sep. 13, 2018

(65) Prior Publication Data

US 2019/0094690 A1 Mar. 28, 2019

(30) Foreign Application Priority Data

Sep. 25, 2017 (JP) ................................ 2017-183795
Mar. 22, 2018 (JP) ................................ 2018-054115

(51) Int. Cl.

| | |
|---|---|
| ***G03F 7/00*** | (2006.01) |
| ***G03F 7/004*** | (2006.01) |
| ***G03F 7/039*** | (2006.01) |
| ***C08L 41/00*** | (2006.01) |
| ***C08K 5/00*** | (2006.01) |
| ***C08K 5/42*** | (2006.01) |
| ***C08L 33/14*** | (2006.01) |
| ***C09D 125/08*** | (2006.01) |
| ***C09D 133/10*** | (2006.01) |
| *C08L 25/18* | (2006.01) |
| *C08F 12/24* | (2006.01) |
| *C08F 12/16* | (2006.01) |

(52) U.S. Cl.

CPC .......... *G03F 7/0045* (2013.01); *C08K 5/0025* (2013.01); *C08K 5/42* (2013.01); *C08L 33/14* (2013.01); *C08L 41/00* (2013.01); *C09D 125/08* (2013.01); *C09D 133/10* (2013.01); *G03F 7/0395* (2013.01); *G03F 7/0397* (2013.01); *C08F 12/16* (2013.01); *C08F 12/24* (2013.01); *C08L 25/18* (2013.01); *C08L 2312/00* (2013.01)

(58) Field of Classification Search

CPC ...................................................... G03F 7/004
See application file for complete search history.

(56) References Cited

U.S. PATENT DOCUMENTS

| | | | |
|---|---|---|---|
| 6,551,758 B2 | 4/2003 | Ohsawa et al. | |
| 6,692,893 B2 | 2/2004 | Ohsawa et al. | |
| 6,749,988 B2 | 6/2004 | Hatakeyama et al. | |
| 6,916,593 B2 | 7/2005 | Hatakeyama et al. | |
| 8,026,390 B2 * | 9/2011 | Oh ......................... | C07C 25/18 562/41 |
| 8,148,044 B2 | 4/2012 | Yamaguchi et al. | |
| 9,250,518 B2 | 2/2016 | Hatakeyama et al. | |
| 2009/0274978 A1 | 11/2009 | Ohashi et al. | |
| 2015/0212417 A1 | 7/2015 | Hatakeyama et al. | |
| 2017/0369616 A1 | 12/2017 | Hatakeyama et al. | |

FOREIGN PATENT DOCUMENTS

| | | |
|---|---|---|
| CN | 102289149 A | 12/2011 |
| JP | 5-204157 A | 8/1993 |
| JP | 2001-194776 A | 7/2001 |
| JP | 2002-226470 A | 8/2002 |
| JP | 2002-363148 A | 12/2002 |
| JP | 2011-252147 A | 12/2011 |
| JP | 2015-25789 A | 2/2015 |
| JP | 2015-90382 A | 5/2015 |
| JP | 2015-161823 A | 9/2015 |
| JP | 2018-5224 A | 1/2018 |
| TW | 201009493 A | 3/2010 |
| TW | 201533528 A | 9/2015 |
| WO | 2013/024777 A1 | 2/2013 |

OTHER PUBLICATIONS

Yamamoto et al., "Polymer-Structure Dependence of Acid Gerneration in Chemically Amplified Extreme Ultraviolet Resists", Japanese Journal of Applied Physics, (2007), vol. 46, No. 7, pp. L142-L144, Cited in Specification. (6 pages).
Wang et al., "Photobase generator and photo decomposable quencher for high-resolution photoresist applications," SPIE vol. 7639, 2010, p. 76390W1-15.
Lio, "EUV Resists: What's Next?," SPIE vol. 9776, 2016, p. 97760V-1-14.
Office Action dated Feb. 26, 2018, issued in Taiwanese Application No. 106121402. (12 pages).
Non-Final Office Action dated Jun. 27, 2019, issued in U.S. Appl. No. 15/920,641 (10 pages).
Non-Final Office Action dated Aug. 9, 2018, issued in U.S. Appl. No. 15/623,561 (8 pages).

* cited by examiner

*Primary Examiner* — Chanceity N Robinson
(74) *Attorney, Agent, or Firm* — Westerman, Hattori, Daniels & Adrian, LLP

(57) ABSTRACT

A resist composition is provided comprising a base polymer containing an iodized polymer, and an acid generator containing a sulfonium salt and/or iodonium salt of iodized benzene ring-containing fluorosulfonic acid. When processed by lithography, the resist composition exhibits a high sensitivity, low LWR and improved CDU independent of whether it is of positive tone or negative tone.

19 Claims, No Drawings

RESIST COMPOSITION AND PATTERNING PROCESS

CROSS-REFERENCE TO RELATED APPLICATION

This non-provisional application claims priority under 35 U.S.C. § 119(a) on Patent Application Nos. 2017-183795 and 2018-054115 filed in Japan on Sep. 25, 2017 and Mar. 22, 2018, respectively, the entire contents of which are hereby incorporated by reference.

TECHNICAL FIELD

This invention relates to a resist composition comprising a polymer containing iodized recurring units and a sulfonium or iodonium salt of iodized fluorosulfonic acid, and a patterning process using the composition.

BACKGROUND ART

To meet the demand for higher integration density and operating speed of LSIs, the effort to reduce the pattern rule is in rapid progress. The logic devices used in smart phones drive forward the miniaturization technology. Logic devices of 10-nm node are manufactured in a large scale using a multi-patterning lithography process based on ArF lithography.

In the application of lithography to next 7-nm or 5-nm node devices, the increased expense and overlay accuracy of multi-patterning lithography become tangible. The advent of EUV lithography capable of reducing the number of exposures is expected.

Since the wavelength (13.5 nm) of extreme ultraviolet (EUV) is shorter than 1/10 of the wavelength (193 nm) of ArF excimer laser, the EUV lithography achieves a high light contrast, from which a high resolution is expectable. Because of the short wavelength and high energy density of EUV, an acid generator is sensitive to a small dose of photons. It is believed that the number of photons available with EUV exposure is 1/14 of that of ArF exposure. In the EUV lithography, the phenomenon that the edge roughness (LWR) of line patterns or the critical dimension uniformity (CDU) of hole patterns is degraded by a variation of photon number is considered a problem.

Aiming to reduce a photon number variation, an attempt was made to render the resist more absorptive so that the number of photons absorbed in the resist is increased.

Patent Document 1 discloses a halogen-substituted styrene base resin. Among the halogen atoms, iodine is highly absorptive to EUV radiation of wavelength 13.5 nm. Recently Patent Documents 2 and 3 propose to use iodine-substituted resins as EUV resist component. Regrettably, it is not true that a higher sensitivity is obtainable by merely incorporating iodine to increase the number of photons absorbed. With respect to the acid generation in EUV exposure, Non-Patent Document 1 reports that the acid generation efficiency of iodized styrene is only 14% of that of hydroxystyrene.

CITATION LIST

Patent Document 1: JP-A H05-204157

Patent Document 2: JP-A 2015-161823

Patent Document 3: WO 2013/024777

Non-Patent Document 1: Jpn. J. Appl. Physics, Vol. 46, No. 7, pp. L142-L144, 2007

SUMMARY OF INVENTION

For the acid-catalyzed chemically amplified resist, it is desired to develop a resist composition providing a high sensitivity and reducing LWR or improving CDU of hole patterns.

An object of the invention is to provide a resist composition which exhibits a high sensitivity, low LWR and improved CDU independent of whether it is of positive tone or negative tone, and a pattern forming process using the same.

The inventors have found that a resist composition comprising an iodized polymer and a sulfonium salt and/or iodonium salt of iodized benzene ring-containing fluorosulfonic acid exhibits a high sensitivity, low LWR, improved CDU, and wide process margin when exposed to high-energy radiation.

In one aspect, the invention provides a resist composition comprising a base polymer containing an iodized polymer, and an acid generator containing a sulfonium salt and/or iodonium salt of iodized benzene ring-containing fluorosulfonic acid.

In a preferred embodiment, the sulfonium salt and iodonium salt of iodized benzene ring-containing fluorosulfonic acid are a sulfonium salt having the formula (A-1) and an iodonium salt having the formula (A-2), respectively.

(A-1)

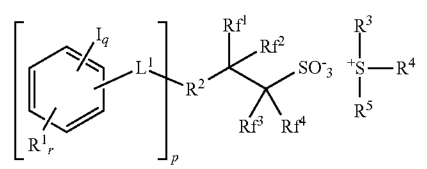

(A-2)

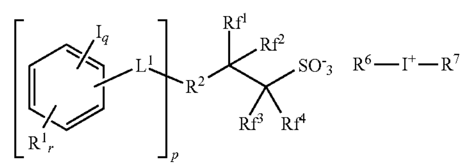

Herein $L^1$ is a single bond, ether bond, ester bond, or a $C_1$-$C_6$ alkylene group which may contain an ether bond or ester bond. $R^1$ is a hydroxyl, carboxyl, fluorine, chlorine, bromine, or amino group, or a $C_1$-$C_{20}$ alkyl, $C_1$-$C_{20}$ alkoxy, $C_2$-$C_{10}$ alkoxycarbonyl, $C_2$-$C_{20}$ acyloxy or $C_1$-$C_{20}$ alkylsulfonyloxy group, which may contain fluorine, chlorine, bromine, hydroxyl, amino or $C_1$-$C_{10}$ alkoxy moiety, or $—NR^8—C(=O)—R^9$ or $—NR^8—C(=O)—O—R^9$, $R^8$ is hydrogen, or a $C_1$-$C_6$ alkyl group which may contain halogen, hydroxyl, $C_1$-$C_6$ alkoxy, $C_2$-$C_6$ acyl or $C_2$-$C_6$ acyloxy moiety, $R^9$ is a $C_1$-$C_{16}$ alkyl, $C_2$-$C_{16}$ alkenyl, or $C_6$-$C_{12}$ aryl group, which may contain a halogen, hydroxyl, $C_1$-$C_6$ alkoxy, $C_2$-$C_6$ acyl or $C_2$-$C_6$ acyloxy moiety. $R^2$ is a single bond or $C_1$-$C_{20}$ divalent linking group when p=1, or a $C_1$-$C_{20}$ tri- or tetravalent linking group when p=2 or 3, the linking group optionally containing an oxygen, sulfur or nitrogen atom. $Rf^1$ to $Rf^4$ are each independently hydrogen, fluorine or trifluoromethyl, at least one of $Rf^1$ to $Rf^4$ being fluorine or trifluoromethyl, $Rf^1$ and $Rf^2$ taken together may form a carbonyl group. $R^3$, $R^4$, $R^5$, $R^6$ and $R^7$ are each independently a $C_1$-$C_{20}$ monovalent hydrocarbon group which may contain a heteroatom, any two of $R^3$, $R^4$, and $R^5$ may bond together to form a ring with the sulfur atom to which they are attached, p is an integer of 1 to 3, q is an integer of 1 to 5, r is an integer of 0 to 3, and $1 \leq q+r \leq 5$.

In a preferred embodiment, the iodized polymer comprises recurring units having the formula (a1) or (a2).

(a1)

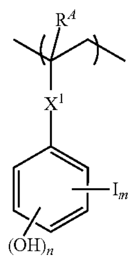

(a2)

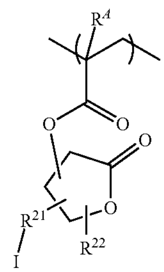

Herein $R^A$ is each independently hydrogen or methyl, $R^{21}$ is a single bond or methylene, $R^{22}$ is hydrogen or $C_1$-$C_4$ alkyl, $X^1$ is a single bond, ether bond, ester bond, amide bond, —C(═O)—O—$R^{23}$—, phenylene, -Ph-C(═O)—O—$R^{24}$—, or -Ph-$R^{25}$—O—C(═O)—$R^{26}$—, Ph is phenylene, $R^{23}$ is a $C_1$-$C_{10}$ alkylene group which may contain an ether bond or ester bond, $R^{24}$, $R^{25}$ and $R^{26}$ are each independently a single bond or a $C_1$-$C_6$ straight or branched alkylene group, m is an integer of 1 to 5, n is an integer of 0 to 4, and $1 \leq m+n \leq 5$. Preferably, n is an integer of 1 to 3.

The resist composition may further comprise an organic solvent.

In a preferred embodiment, the iodized polymer further comprises recurring units having the formula (b1) or (b2).

(b1)

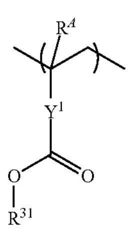

(b2)

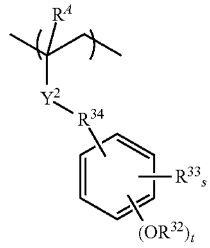

Herein $R^A$ is each independently hydrogen or methyl, $Y^1$ is a single bond, phenylene group, naphthylene group, or a $C_1$-$C_{12}$ linking group containing an ester bond or lactone ring, $Y^2$ is a single bond or ester bond, $R^{31}$ and $R^{32}$ are each independently an acid labile group, $R^{33}$ is fluorine, trifluoromethyl, cyano, $C_1$-$C_6$ alkyl, $C_1$-$C_6$ alkoxy, $C_2$-$C_7$ acyl, $C_2$-$C_7$ acyloxy, or $C_2$-$C_7$ alkoxycarbonyl group, $R^{34}$ is a single bond or a $C_1$-$C_6$ alkylene group in which at least one carbon may be substituted by an ether or ester bond, t is 1 or 2, s is an integer of 0 to 4, and $1 \leq t+s \leq 5$.

The resist composition may further comprise a dissolution inhibitor.

In a preferred embodiment, the resist composition is a chemically amplified positive resist composition.

In another preferred embodiment, the iodized polymer is free of an acid labile group. The resist composition may further comprise a crosslinker. In this case, the resist composition is a chemically amplified negative resist composition.

The resist composition may further comprise a quencher and/or a surfactant.

In a preferred embodiment, the iodized polymer further comprises recurring units of at least one type selected from recurring units having the formulae (g1), (g2) and (g3).

(g1)

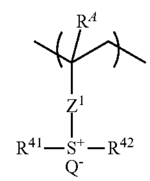

(g2)

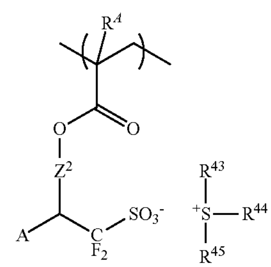

(g3)

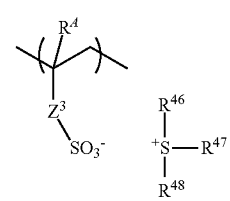

Herein $R^A$ is each independently hydrogen or methyl. $Z^1$ is a single bond, phenylene group, —O—$Z^{12}$—, or —C(═O)—$Z^{11}$—$Z^{12}$—, $Z^{11}$ is —O— or —NH—, $Z^{12}$ is a $C_1$-$C_6$ alkylene, $C_2$-$C_6$ alkenylene or phenylene group, which may contain a carbonyl, ester bond, ether bond or hydroxyl moiety. $Z^2$ is a single bond, —$Z^{21}$—C(═O)—O— or —$Z^{21}$—O—C(═O)—, $Z^{21}$ is a $C_1$-$C_{12}$ alkylene group which may contain a carbonyl moiety, ester bond or ether bond. A is hydrogen or trifluoromethyl. $Z^3$ is a single bond, methylene, ethylene, phenylene or fluorinated phenylene group, —O—$Z^{32}$—, or —C(═O)—$Z^{31}$—$Z^{32}$—, $Z^{31}$ is —O— or —NH—, $Z^{32}$ is a $C_1$-$C_6$ alkylene, phenylene, fluorinated phenylene, trifluoromethyl-substituted phenylene, or $C_2$-$C_6$ alkenylene group, which may contain a carbonyl, ester bond, ether bond or hydroxyl moiety. $R^{41}$ to $R^{48}$ are each independently a $C_1$-$C_{20}$ monovalent hydrocarbon group which may contain a heteroatom, any two of $R^{43}$, $R^{44}$ and $R^{45}$ or any two of $R^{46}$, $R^{47}$ and $R^{48}$ may bond together to form a ring with the sulfur atom to which they are attached. $Q^-$ is a non-nucleophilic counter ion.

In another aspect, the invention provides a pattern forming process comprising the steps of coating the resist composition defined above onto a substrate, baking to form a resist film, exposing the resist film to high-energy radiation, and developing the exposed resist film in a developer.

Typically, the high-energy radiation is ArF excimer laser of wavelength 193 nm, KrF excimer laser of wavelength 248 nm, EB, or EUV of wavelength 3 to 15 nm.

Advantageous Effects of Invention

A resist composition comprising an iodized polymer and an acid generator capable of generating an iodized benzene ring-containing fluorosulfonic acid has the advantage of controlled acid diffusion due to the high atomic weight of iodine. Since iodine is highly absorptive to EUV of wavelength 13.5 nm, it effectively generates secondary electrons during exposure. This contributes to a higher sensitivity than a combination of an iodized polymer with an acid generator capable of generating an iodine-free fluorosulfonic acid. Thus, a resist material having a high sensitivity, low LWR and improved CDU may be designed.

DESCRIPTION OF EMBODIMENTS

As used herein, the singular forms "a," "an" and "the" include plural referents unless the context clearly dictates otherwise. The notation ($C_n$-$C_m$) means a group containing from n to m carbon atoms per group. As used herein, the term "iodized" or "fluorinated" indicates that a compound contains iodine or fluorine. Me stands for methyl, Ac for acetyl, and Ph for phenyl.

The abbreviations and acronyms have the following meaning.

EB: electron beam
EUV: extreme ultraviolet
Mw: weight average molecular weight
Mn: number average molecular weight
Mw/Mn: molecular weight distribution or dispersity
GPC: gel permeation chromatography
PEB: post-exposure bake
PAG: photoacid generator
LWR: line width roughness
CDU: critical dimension uniformity Resist Composition The resist composition of the invention is defined as comprising an iodized polymer, and an acid generator containing a sulfonium salt and/or iodonium salt of iodized benzene ring-containing fluorosulfonic acid, which are sometimes collectively referred to as "iodized benzene ring-containing fluorosulfonic acid onium salt". These sulfonium and iodonium salts are acid generators capable of generating an iodized benzene ring-containing fluorosulfonic acid upon exposure to radiation. To the resist composition, an acid generator capable of generating a sulfonic acid (different from the iodized sulfonic acid), imide acid or methide acid may be added, or a polymer-bound acid generator may be used in combination.

When a resist composition containing the sulfonium salt of iodized benzene ring-containing fluorosulfonic acid in admixture with a sulfonium salt of weaker acid (sulfonic acid or carboxylic acid) is exposed to radiation, an iodized benzene ring-containing fluorosulfonic acid and a weaker acid (sulfonic acid or carboxylic acid) generate. Since the acid generator is not entirely decomposed, the undecomposed acid generator is present nearby. When the iodized benzene ring-containing fluorosulfonic acid co-exists with the weaker acid (sulfonic or carboxylic acid), first the iodized benzene ring-containing fluorosulfonic acid undergoes ion exchange with the sulfonium salt of weaker acid (sulfonic or carboxylic acid), whereby a sulfonium salt of iodized benzene ring-containing fluorosulfonic acid is created and a weaker acid (sulfonic or carboxylic acid) is released. This is because the salt of iodized benzene ring-containing fluorosulfonic acid having a high acid strength is more stable. In contrast, when a sulfonium salt of iodized benzene ring-containing fluorosulfonic acid co-exists with a weaker acid (sulfonic or carboxylic acid), no ion exchange takes place. The ion exchange reaction according to the acid strength series occurs not only with sulfonium salts, but also similarly with iodonium salts. When combined with an acid generator of fluorosulfonic acid, a sulfonium or iodonium salt of weak acid functions as a quencher. Since iodine is highly absorptive to EUV of wavelength 13.5 nm, it generates secondary electrons upon EUV exposure. The energy of secondary electrons is transferred to the acid generator to promote its decomposition, contributing to a higher sensitivity. The effect becomes significant when the number of iodine substitution is 3 or more.

For the LWR improving purpose, it is effective to prevent a polymer and/or acid generator from agglomeration. Effective means for preventing agglomeration of a polymer is by reducing the difference between hydrophobic and hydrophilic properties, by lowering the glass transition temperature (Tg) thereof, or by reducing the molecular weight thereof. Specifically, it is effective to reduce the polarity difference between a hydrophobic acid labile group and a hydrophilic adhesive group or to lower the Tg by using a compact adhesive group like monocyclic lactone. One effective means for preventing agglomeration of an acid generator is by introducing a substituent into the triphenylsulfonium cation. In particular, with respect to a methacrylate polymer containing an alicyclic protective group and a lactone adhesive group for ArF lithography, a triphenylsulfonium composed solely of aromatic groups has a heterogeneous structure and low compatibility. As the substituent to be introduced into triphenylsulfonium, an alicyclic group or lactone similar to those used in the base polymer is regarded adequate. When lactone is introduced in a sulfonium salt which is hydrophilic, the resulting sulfonium salt becomes too hydrophilic and thus less compatible with a polymer, with a likelihood that the sulfonium salt will agglomerate. When a hydrophobic alkyl group is introduced, the sulfonium salt may be uniformly dispersed within the resist film. WO 2011/048919 discloses the technique for improving LWR by introducing an alkyl group into a sulfonium salt capable of generating an α-fluorinated sulfone imide acid.

Since iodine with a high atomic weight is introduced in the anion moiety, the iodized benzene ring-containing fluorosulfonic acid onium salt is reduced in acid diffusion and is highly compatible with the iodized polymer and effectively dispersible therein. These lead to improved LWR and CDU.

The iodized benzene ring-containing fluorosulfonic acid onium salt exerts LWR and CDU improving effects, which may stand good either in positive and negative tone pattern formation by alkaline development or in negative tone pattern formation by organic solvent development.

Iodized benzene ring-containing fluorosulfonic acid onium salt

The sulfonium salt and iodonium salt of iodized benzene ring-containing fluorosulfonic acid have the formulae (A-1) and (A-2), respectively.

(A-1)

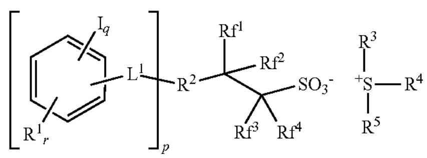

(A-2)

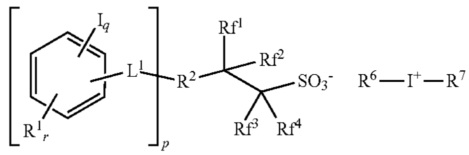

In formulae (A-1) and (A-2), $L^1$ is a single bond, ether bond, ester bond, or a $C_1$-$C_6$ alkylene group which may contain an ether bond or ester bond. The alkylene group may be straight, branched or cyclic.

$R^1$ is a hydroxyl group, carboxyl group, fluorine atom, chlorine atom, bromine atom, or amino group, or a $C_1$-$C_{20}$ alkyl, $C_1$-$C_{20}$ alkoxy, $C_2$-$C_{10}$ alkoxycarbonyl, $C_2$-$C_{20}$ acyloxy or $C_1$-$C_{20}$ alkylsulfonyloxy group, which may contain fluorine, chlorine, bromine, hydroxyl, amino or $C_1$-$C_{10}$ alkoxy moiety, or —$NR^8$—C(═O)—$R^9$ or —$NR^8$—C(═O)—O—$R^9$, wherein $R^8$ is hydrogen, or a $C_1$-$C_6$ alkyl group which may contain halogen, hydroxyl, $C_1$-$C_6$ alkoxy, $C_2$-$C_6$ acyl or $C_2$-$C_6$ acyloxy moiety, and $R^9$ is a $C_1$-$C_{16}$ alkyl, $C_2$-$C_{16}$ alkenyl, or $C_6$-$C_{12}$ aryl group, which may contain a halogen, hydroxyl, $C_1$-$C_6$ alkoxy, $C_2$-$C_6$ acyl or $C_2$-$C_6$ acyloxy moiety. The alkyl, alkoxy, alkoxycarbonyl, acyloxy, acyl and alkenyl groups may be straight, branched or cyclic. Inter alia, $R^1$ is preferably selected from hydroxyl, —$NR^8$—C(═O)—$R^9$, fluorine, chlorine, bromine, methyl and methoxy.

$R^2$ is a single bond or $C_1$-$C_{20}$ divalent linking group when p=1, or a $C_1$-$C_{20}$ tri- or tetravalent linking group when p=2 or 3. The linking group may contain an oxygen, sulfur or nitrogen atom.

$Rf^1$ to $Rf^4$ are each independently hydrogen, fluorine or trifluoromethyl, at least one of $Rf^1$ to $Rd^4$ being fluorine or trifluoromethyl. Also, $Rf^1$ and $Rf^2$ taken together may form a carbonyl group. Preferably both $Rd^3$ and $Rf^4$ are fluorine.

$R^3$, $R^4$, $R^5$, $R^6$ and $R^7$ are each independently a $C_1$-$C_{20}$ monovalent hydrocarbon group which may contain a heteroatom. Any two of $R^3$, $R^4$, and $R^5$ may bond together to form a ring with the sulfur atom to which they are attached. The monovalent hydrocarbon group may be straight, branched or cyclic. Examples include $C_1$-$C_{12}$ alkyl groups, $C_2$-$C_{12}$ alkenyl groups, $C_2$-$C_{12}$ alkynyl groups, $C_6$-$C_{20}$ aryl groups, and $C_7$-$C_{12}$ aralkyl groups. Also included are substituted forms of the foregoing in which at least one (one or more or even all) hydrogen is substituted by hydroxyl, carboxyl, halogen, cyano, amide, nitro, mercapto, sultone, sulfone moiety or sulfonium salt-containing moiety, or in which at least one carbon is substituted by an ether bond, ester bond, carbonyl moiety, carbonate moiety or sulfonic acid ester bond.

The subscript p is an integer of 1 to 3, q is an integer of 1 to 5, r is an integer of 0 to 3, and 1≤q+r≤5. Preferably, q is an integer of 1 to 3, more preferably 2 or 3, and r is an integer of 0 to 2.

The preferred cation in the sulfonium salt having formula (A-1) is a cation having formula (A-3) or (A-4). The preferred cation in the iodonium salt having formula (A-2) is a cation having formula (A-5).

(A-3)

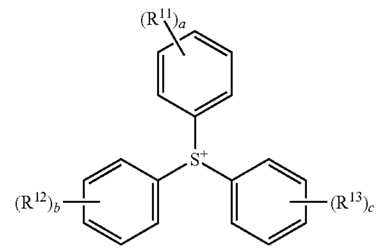

(A-4)

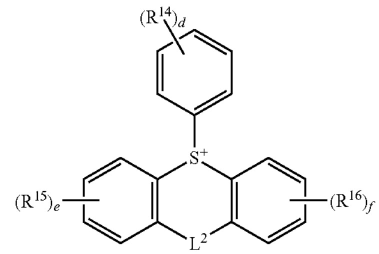

(A-5)

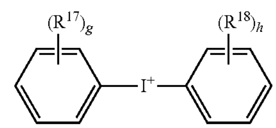

Herein $R^{11}$ to $R^{18}$ are each independently hydroxyl, halogen, cyano, nitro or a $C_1$-$C_{14}$ monovalent hydrocarbon group. Suitable monovalent hydrocarbon groups include $C_1$-$C_{14}$ alkyl groups, $C_2$-$C_{14}$ alkenyl groups, $C_6$-$C_{14}$ aryl groups, and $C_7$-$C_{14}$ aralkyl groups, which may contain hydroxyl, carboxyl, halogen, cyano, amide, nitro, sultone, sulfone moiety or sulfonium salt-containing moiety. Also included are substituted forms of the foregoing in which at least one (one or more or even all) hydrogen is substituted by hydroxyl, carboxyl, halogen, cyano, amide, nitro, sultone, sulfone moiety or sulfonium salt-containing moiety, or in which at least one carbon is substituted by an ether bond, ester bond, carbonyl moiety, carbonate moiety or sulfonic acid ester bond. $L^2$ is a single bond, methylene group, ether bond, thioether bond, or carbonyl group. The subscripts a to h are each independently an integer of 0 to 5.

Examples of the cation in the sulfonium salt having formula (A-1) are given below, but not limited thereto.

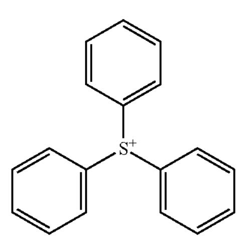

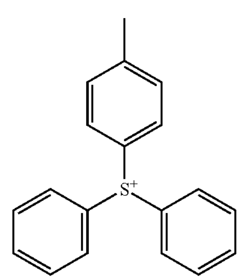

-continued
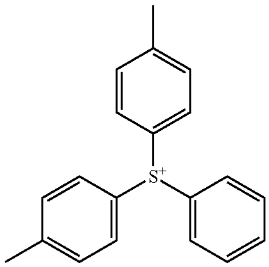
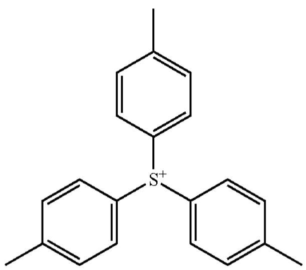
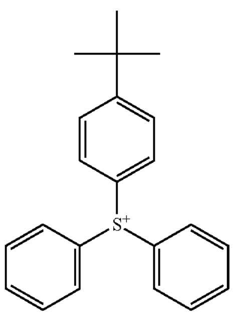
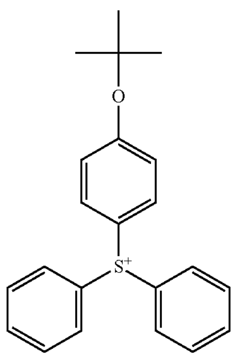
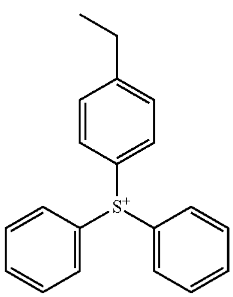
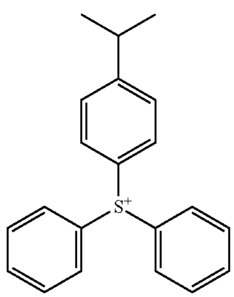
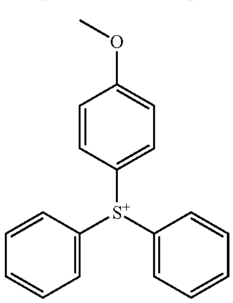
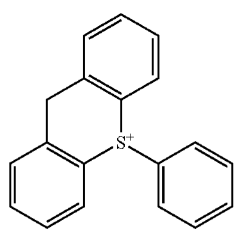
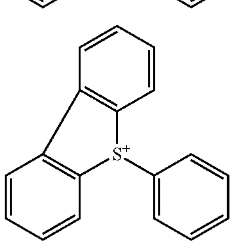
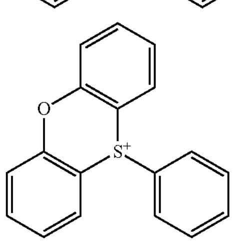
-continued
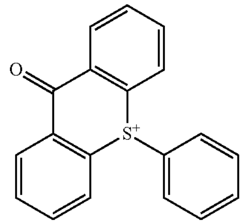
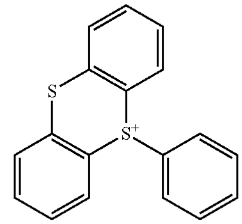
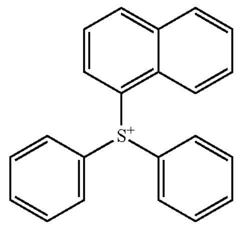
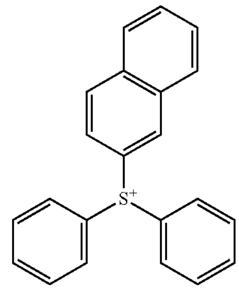
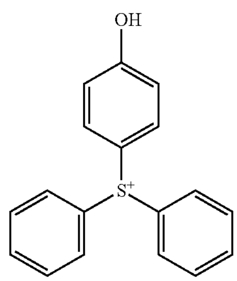
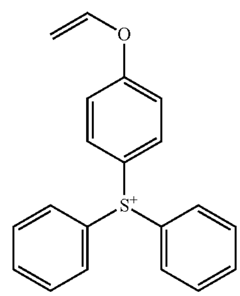
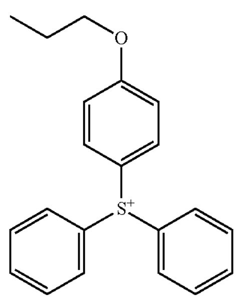
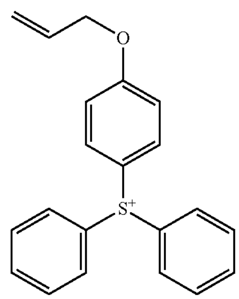
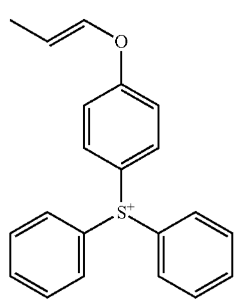
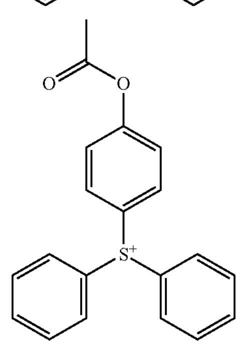

-continued
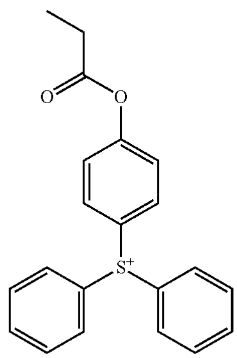
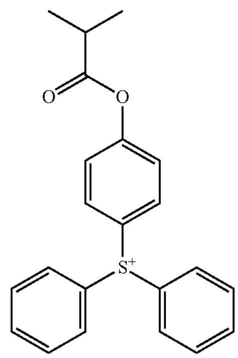
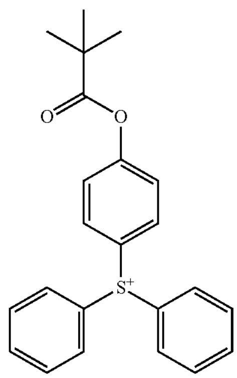
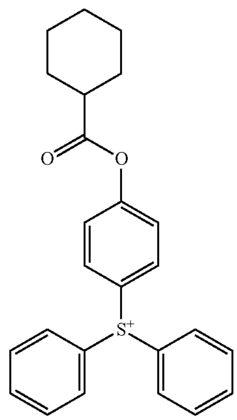
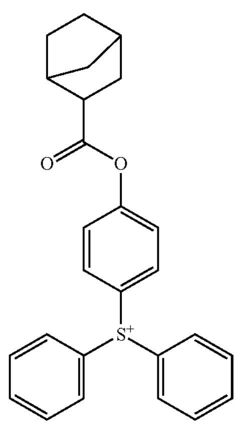
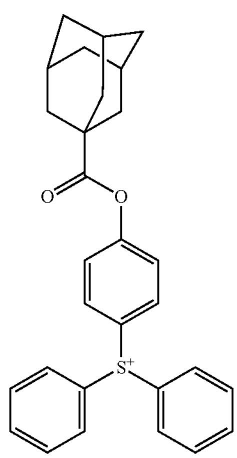
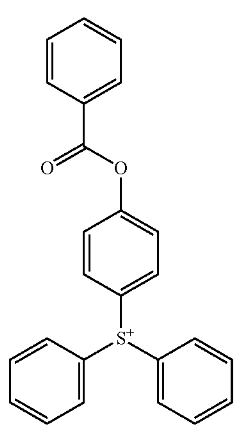
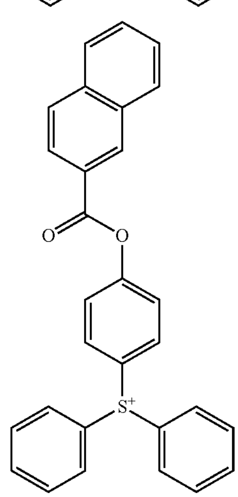
-continued
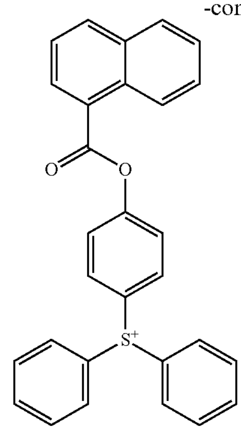
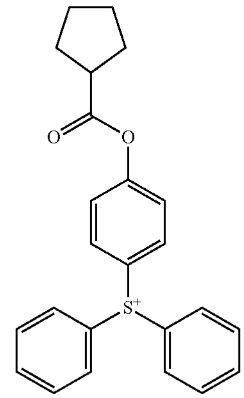
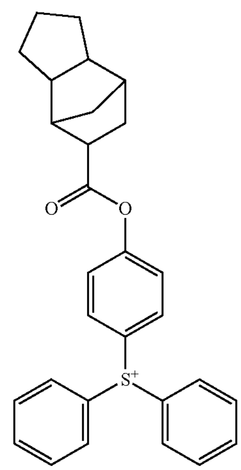
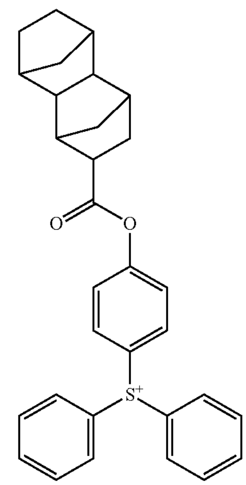
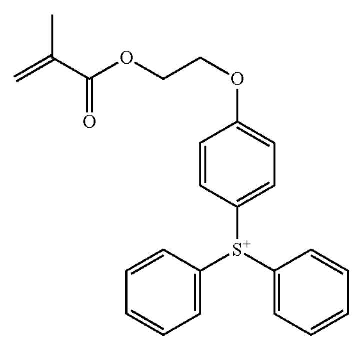
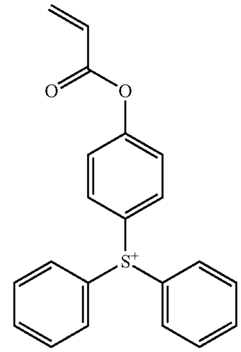
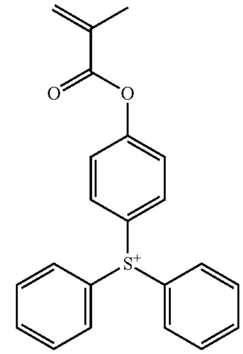

-continued
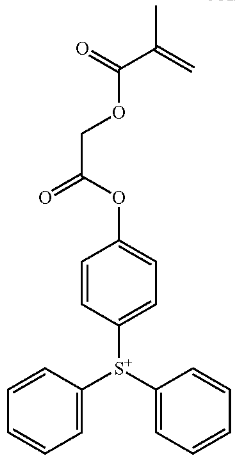
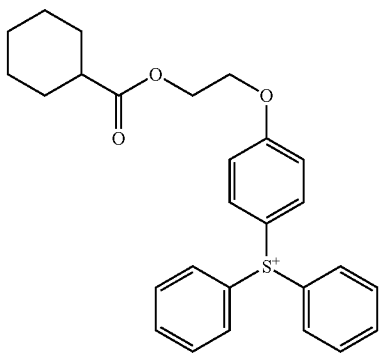
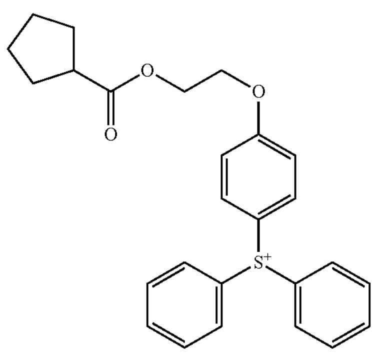
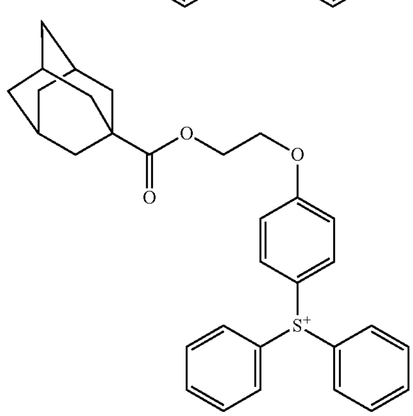
-continued
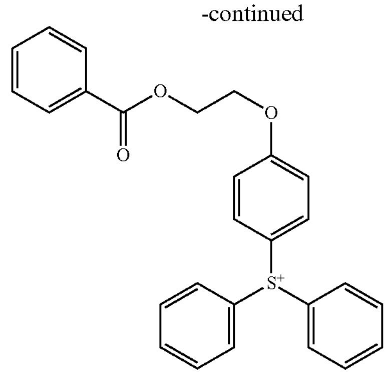
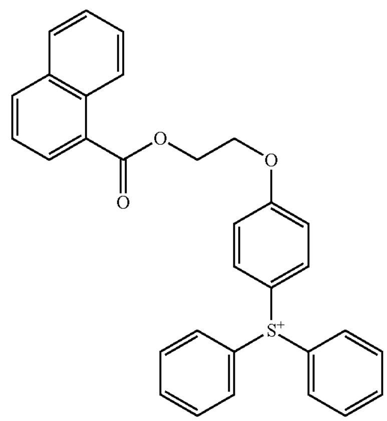
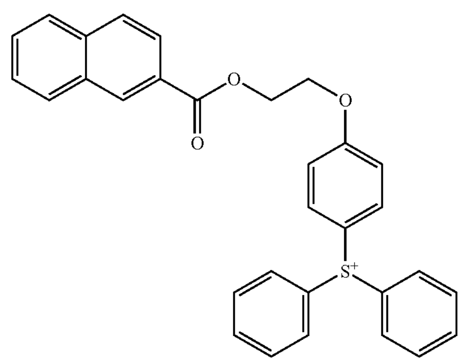
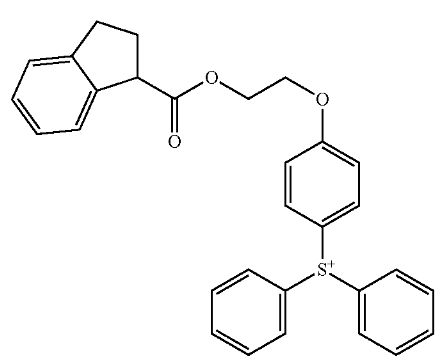

-continued
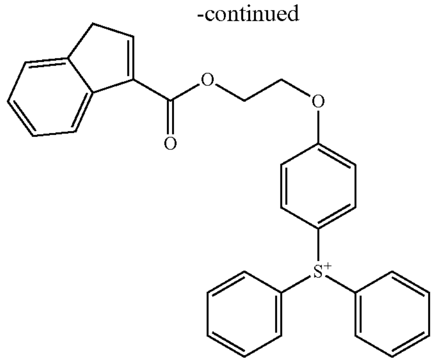
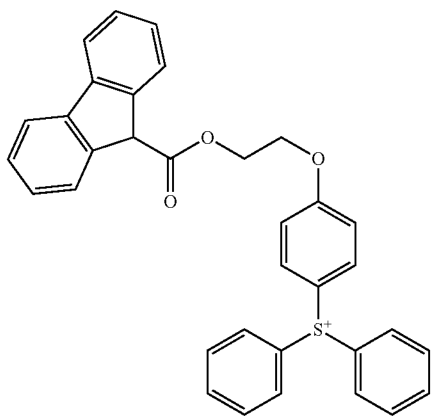
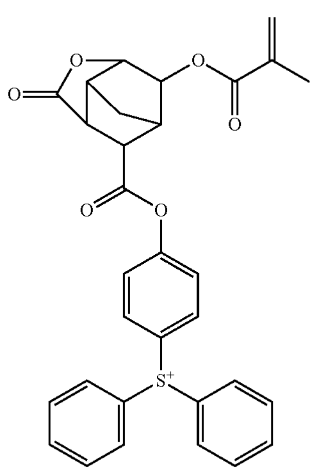
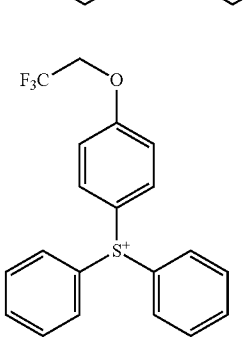
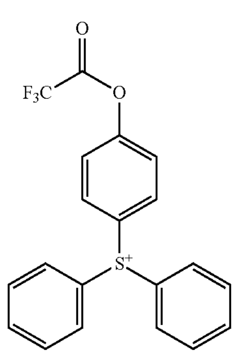
-continued
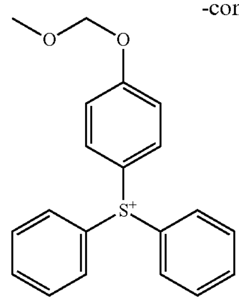
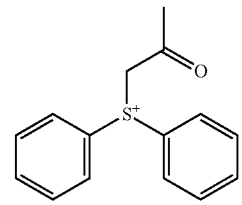
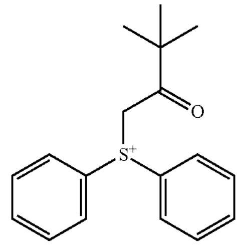
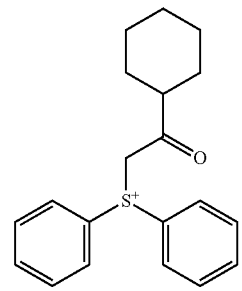
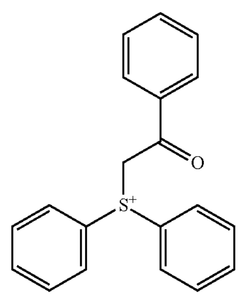
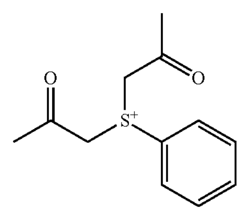
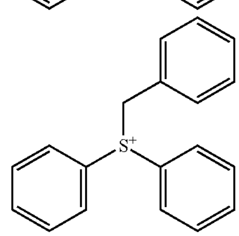
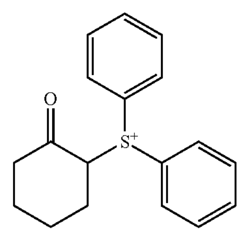
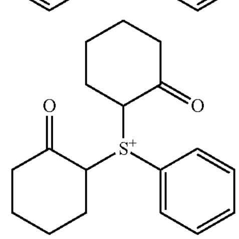
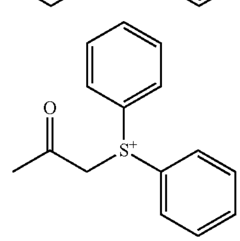
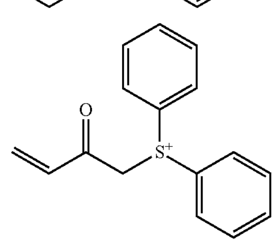

-continued
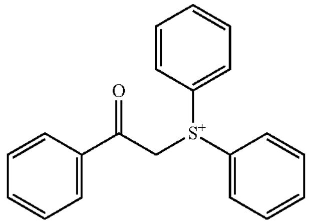
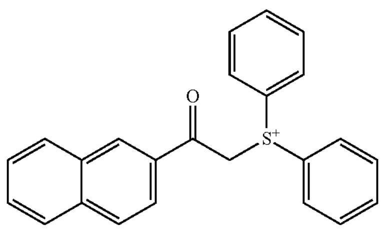
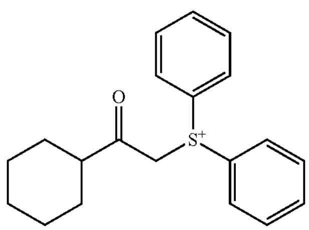
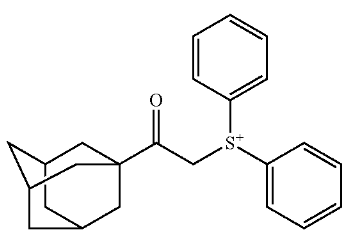
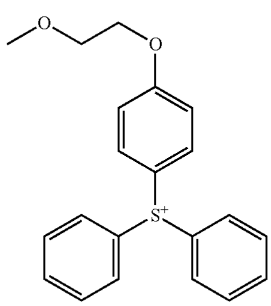
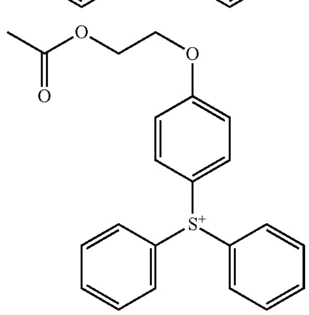
-continued
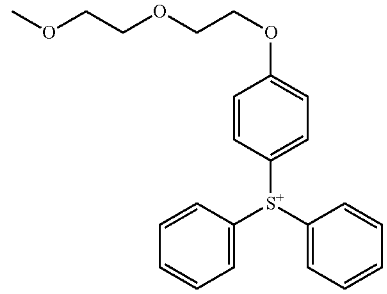
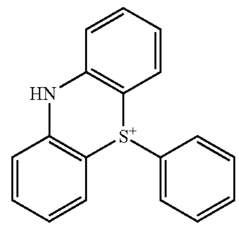
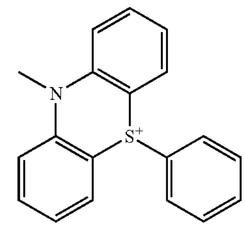
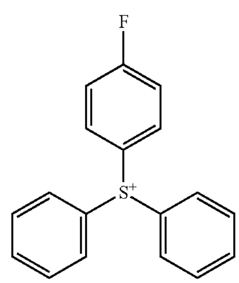
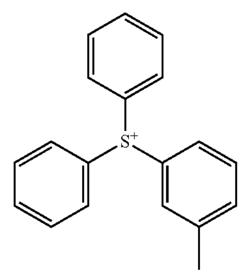
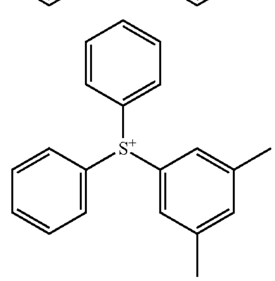
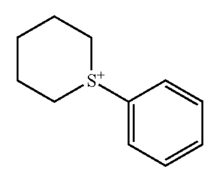
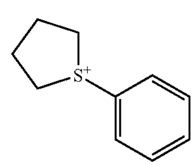
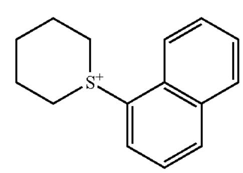
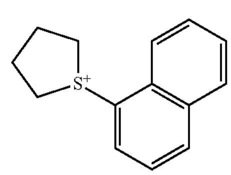
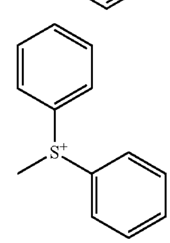
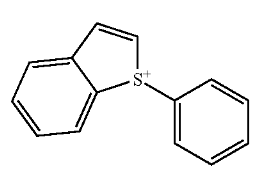
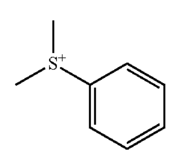

-continued
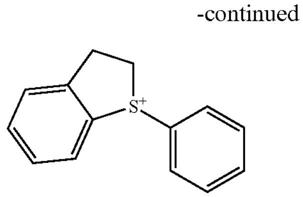
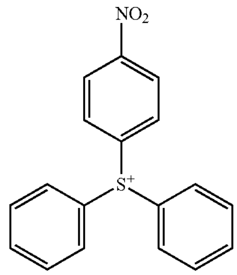
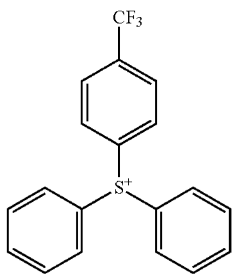
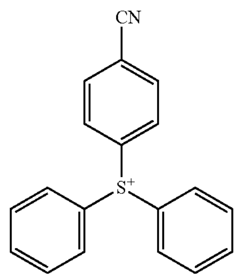
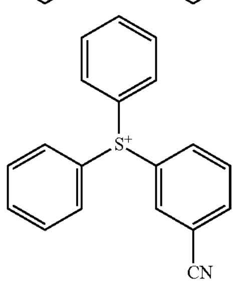
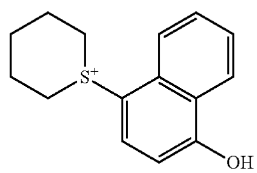
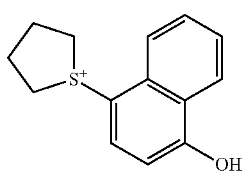
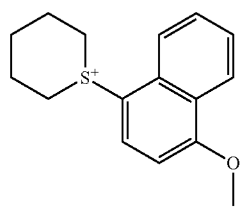
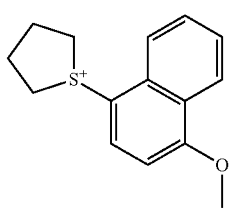
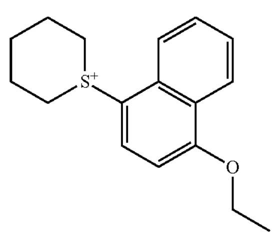
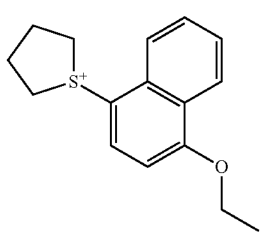
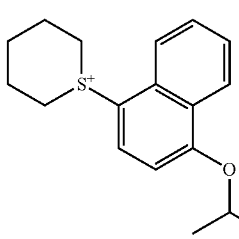
-continued
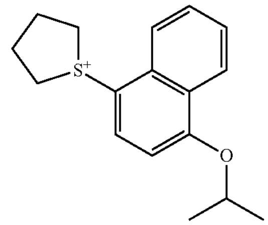
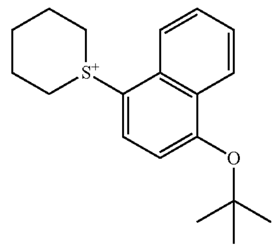
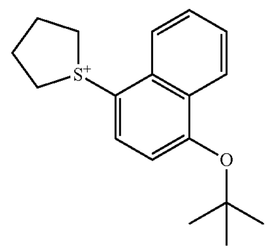
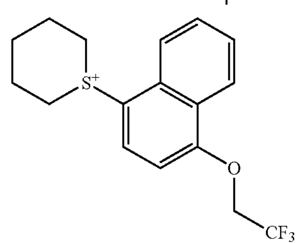
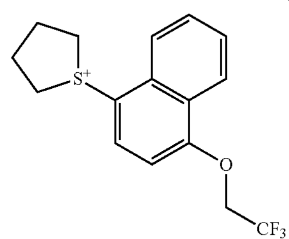
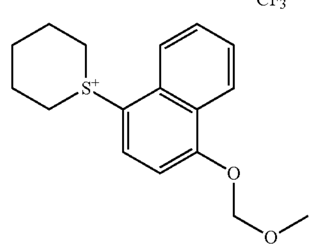
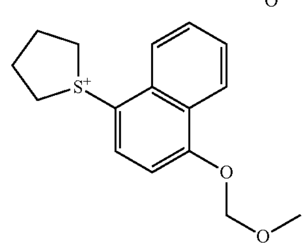

-continued
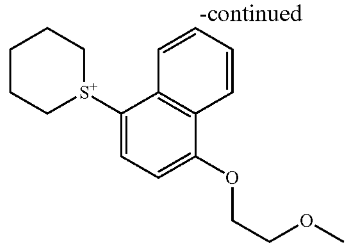
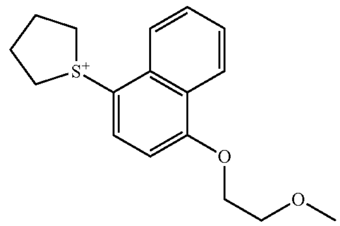
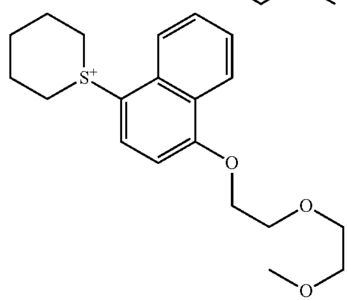
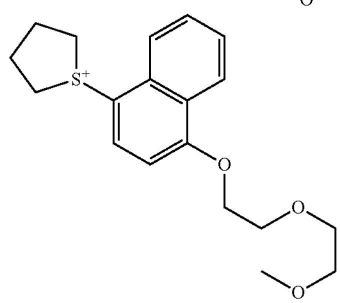
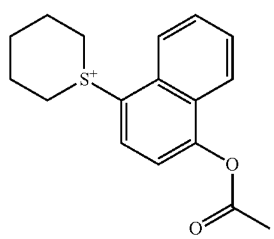
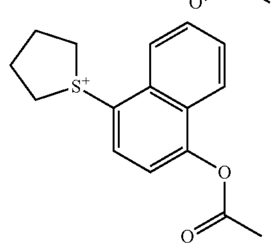
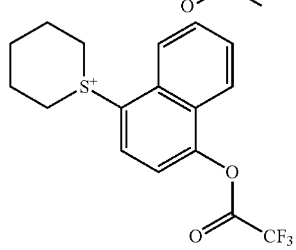
-continued
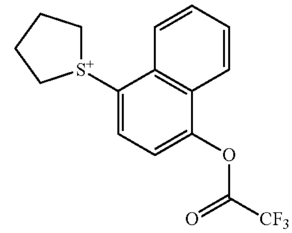
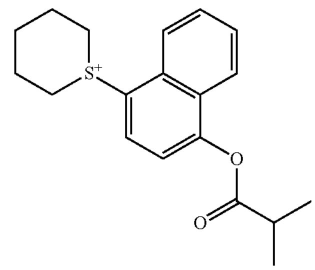
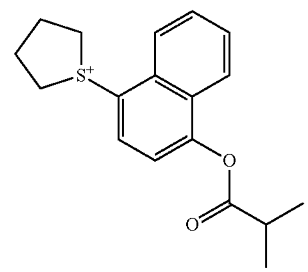
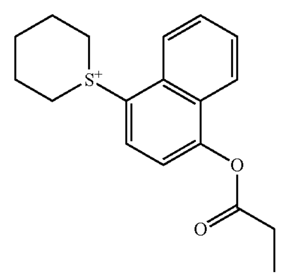
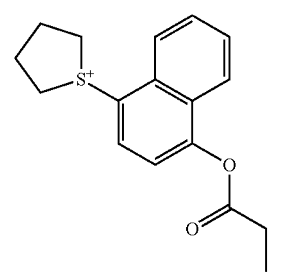
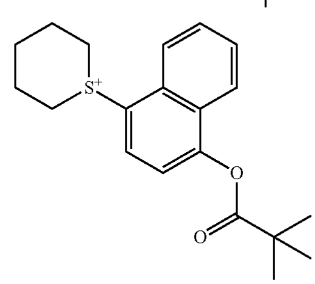

-continued
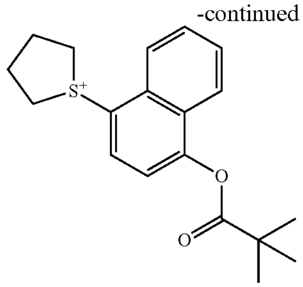
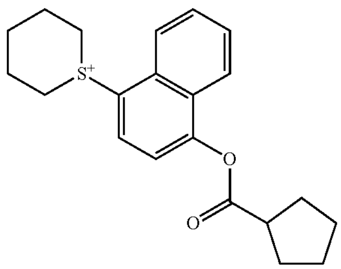
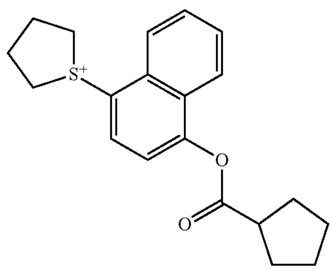
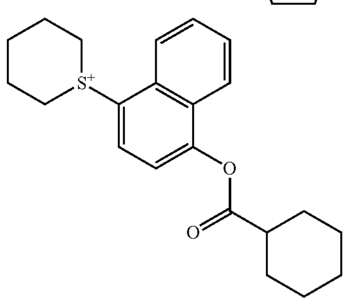
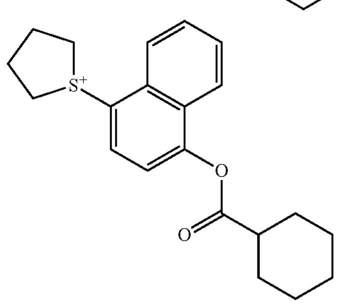
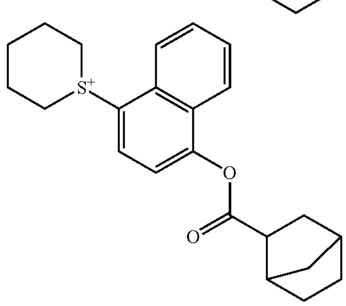
-continued
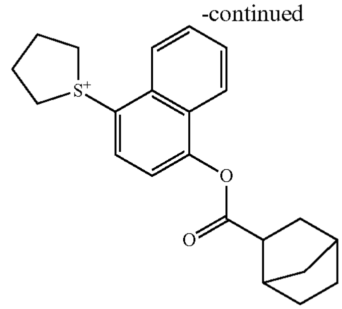
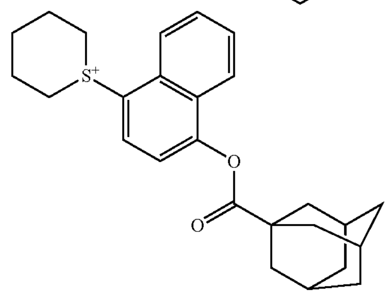
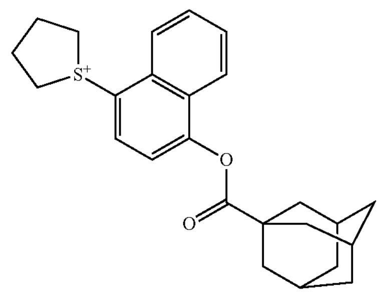
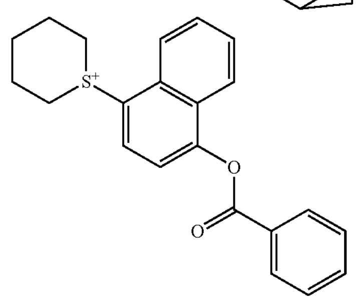
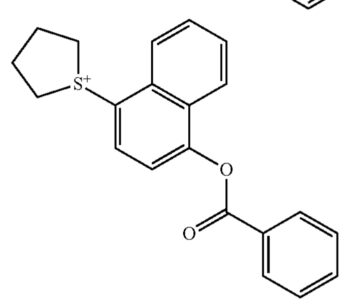
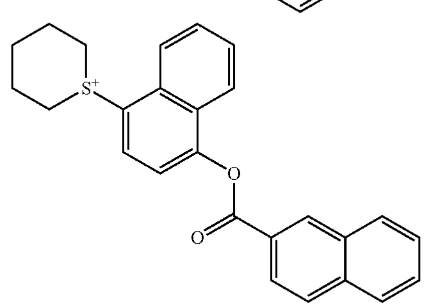

-continued
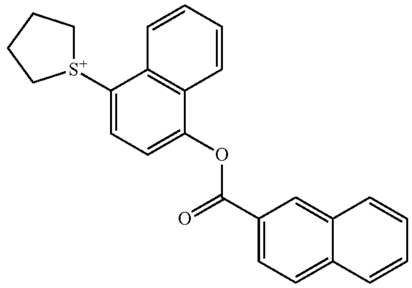
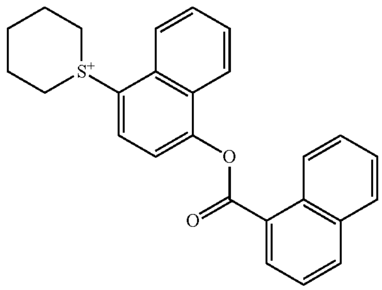
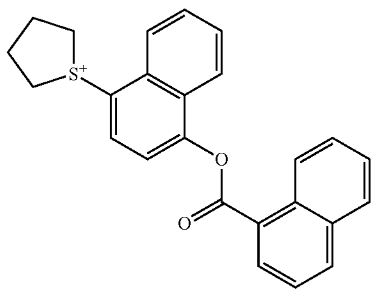
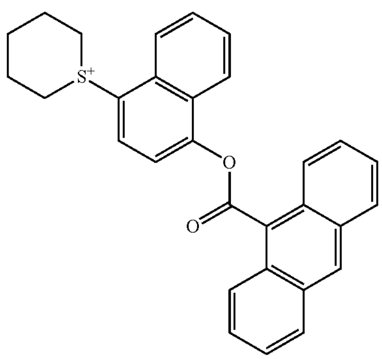
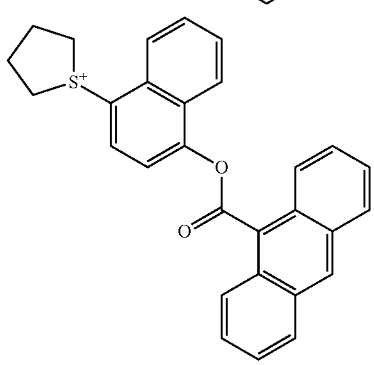
-continued
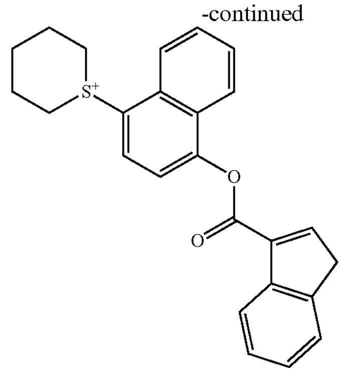
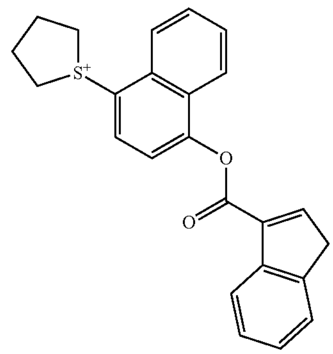
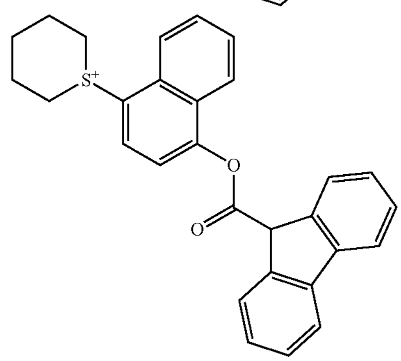
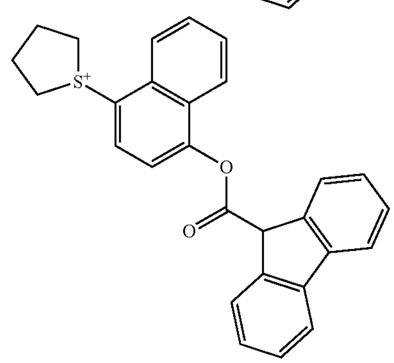
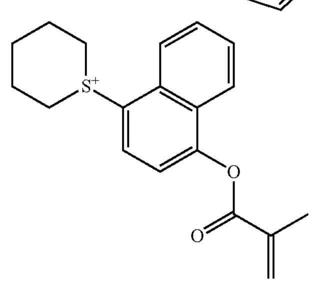

-continued
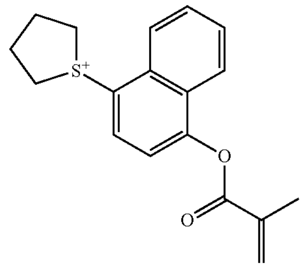
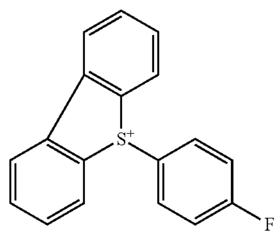
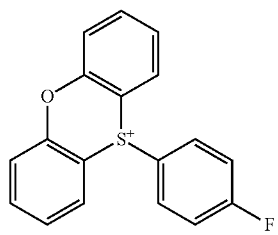
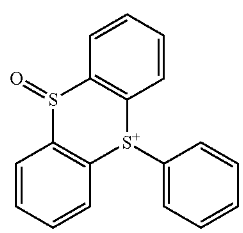
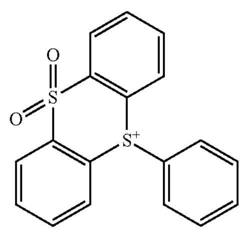
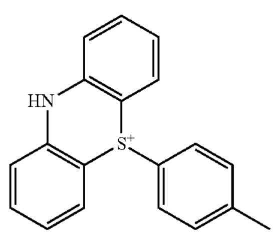
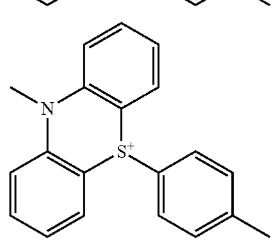
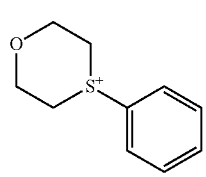
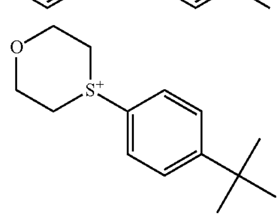
-continued
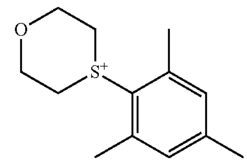
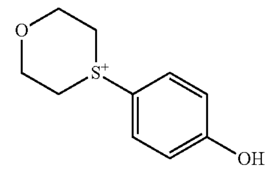
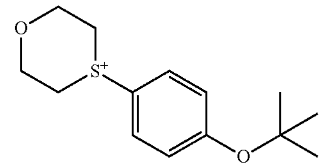
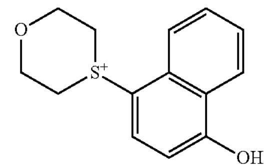
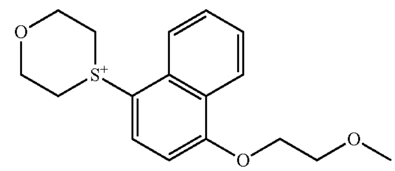
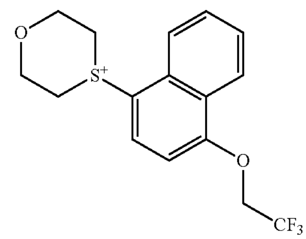
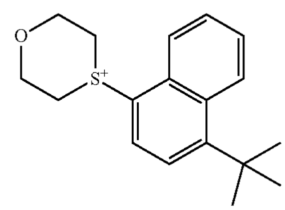
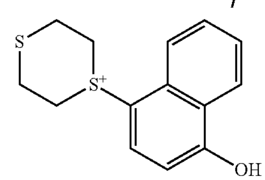
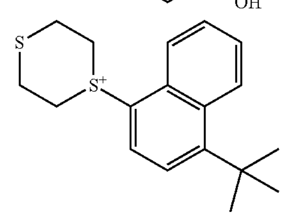
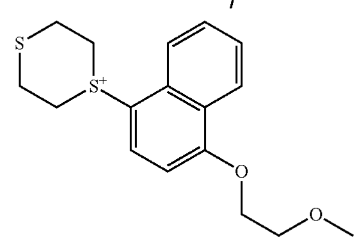

-continued
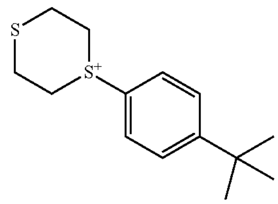
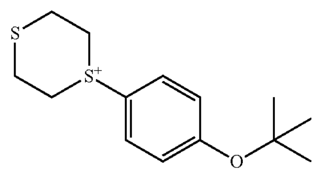
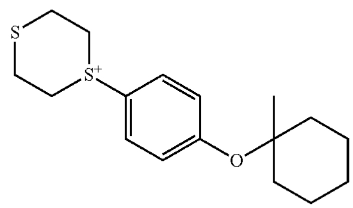
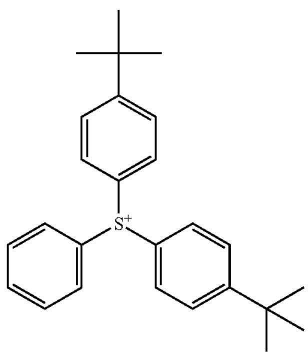
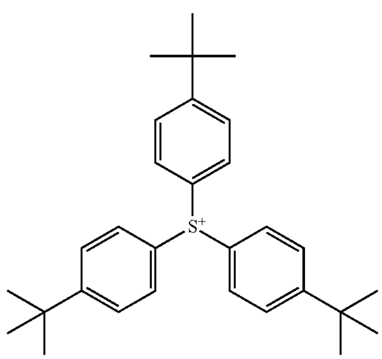
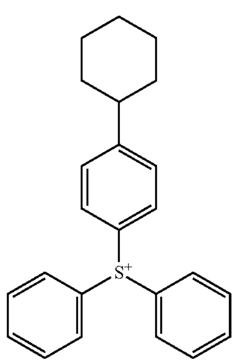
-continued
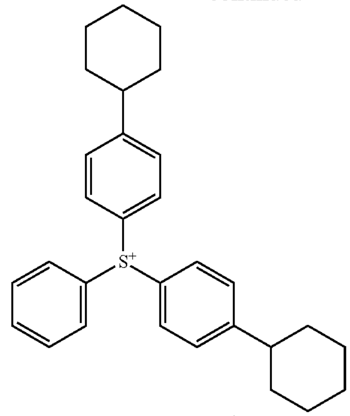
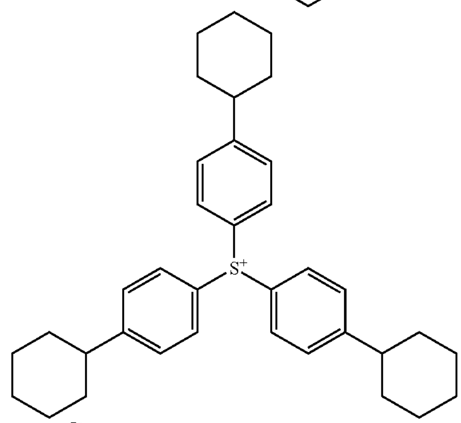
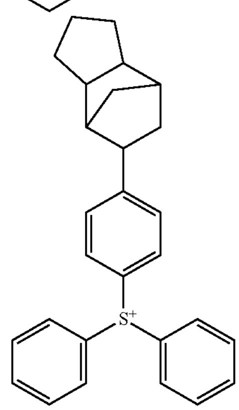
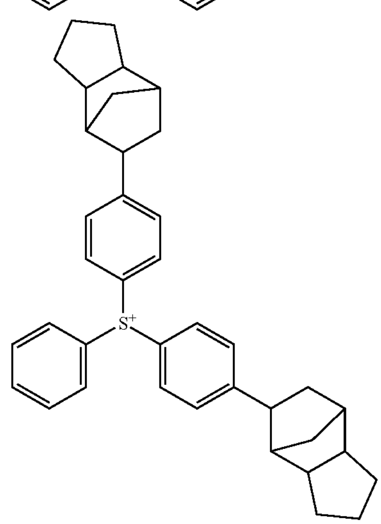

-continued
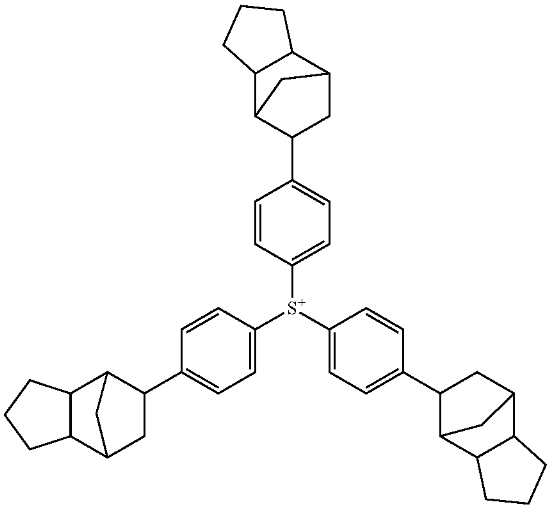
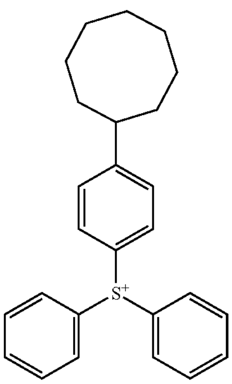
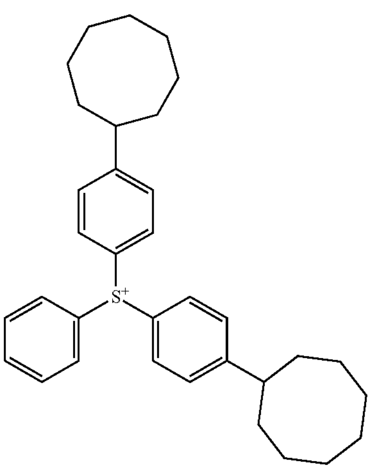
-continued
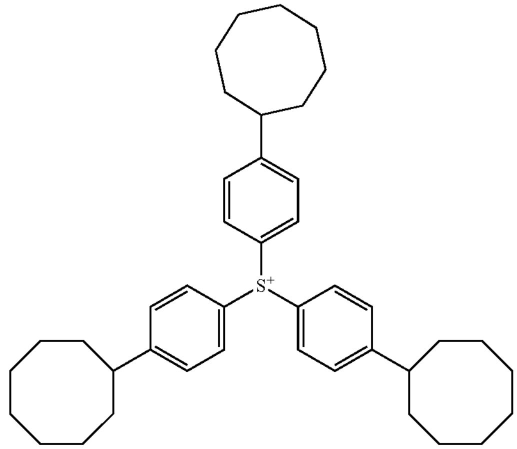
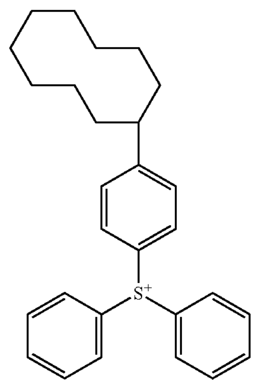
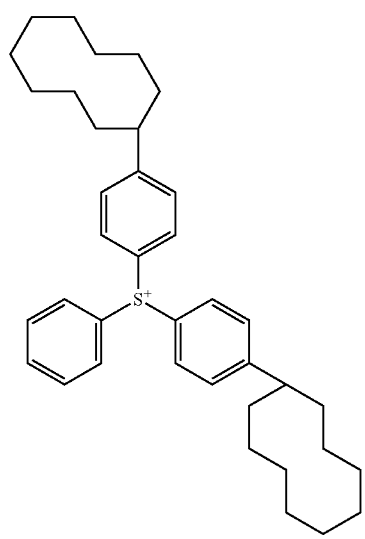

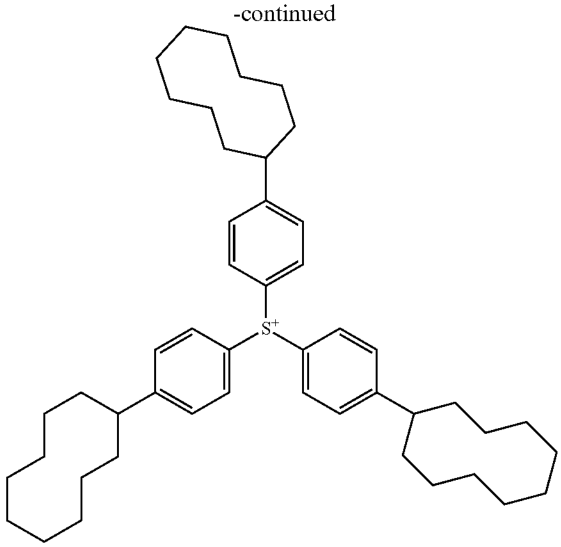
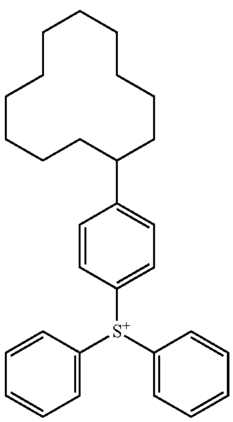
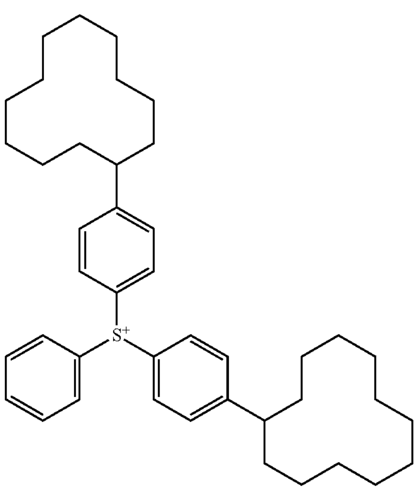
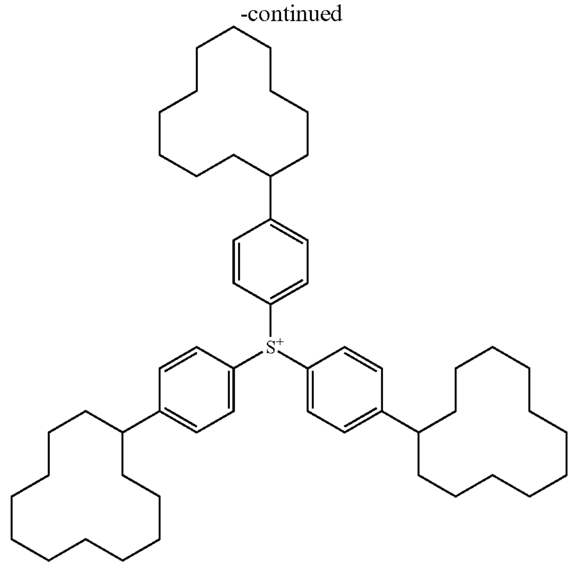
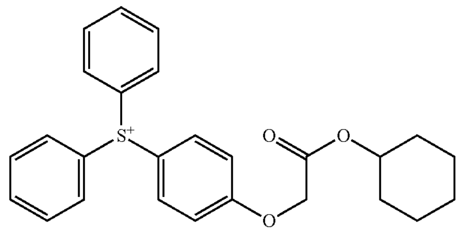
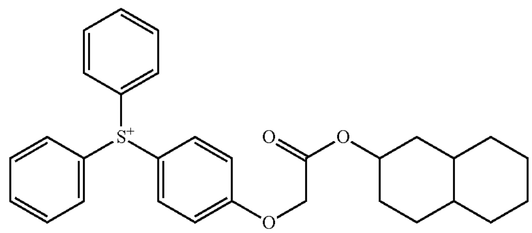
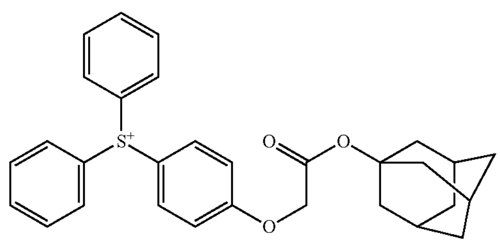
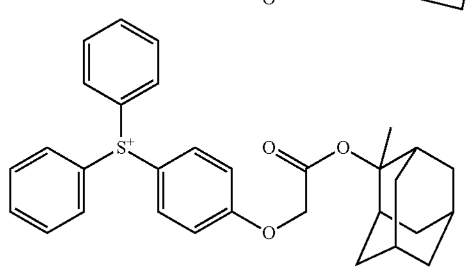
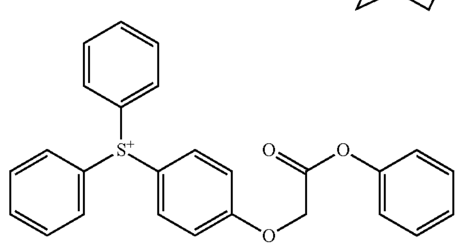

-continued
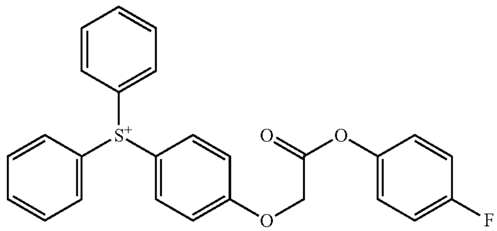
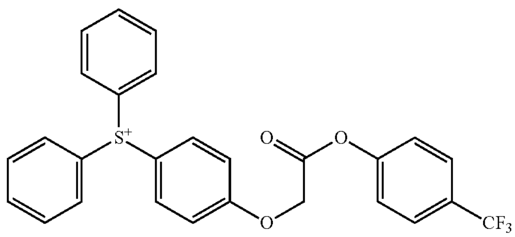
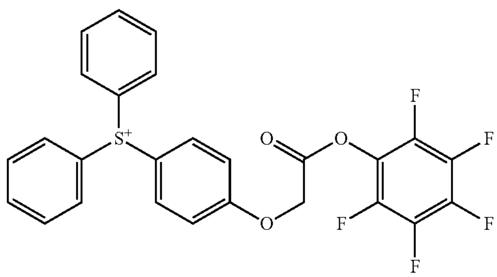
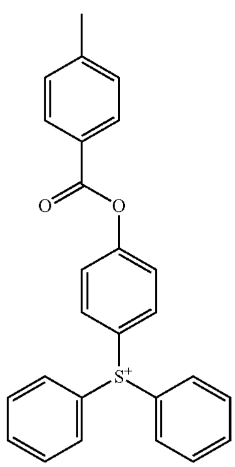
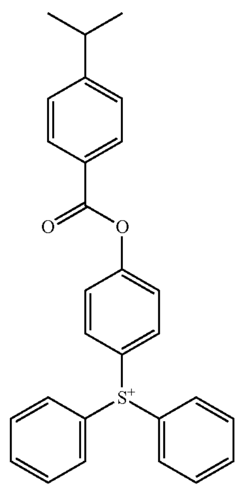
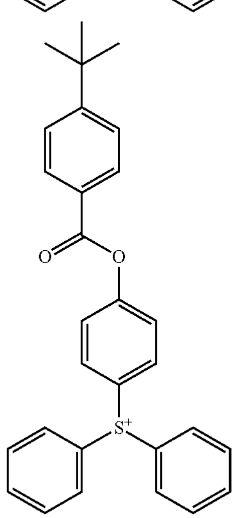
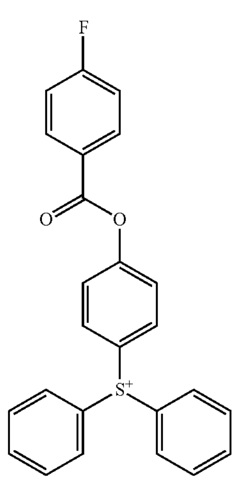
-continued
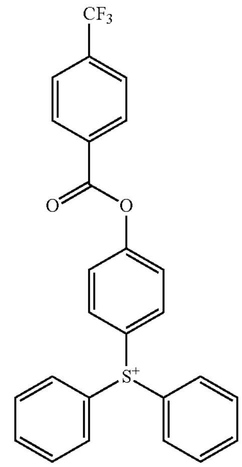
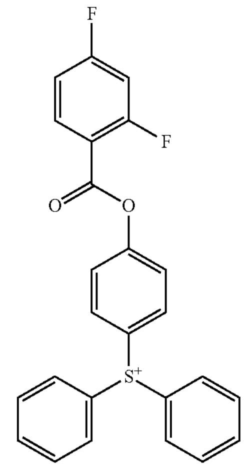
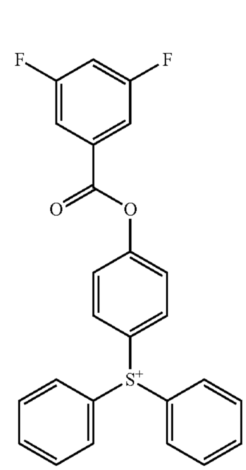
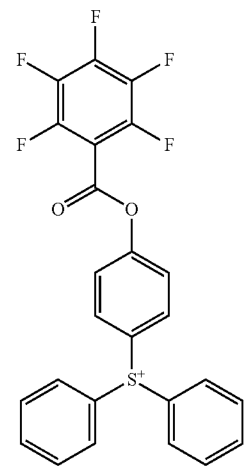
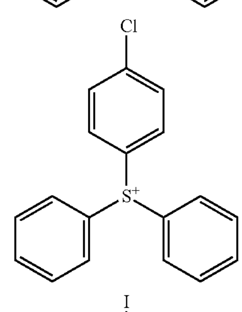
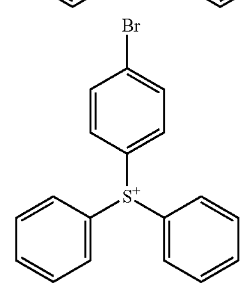
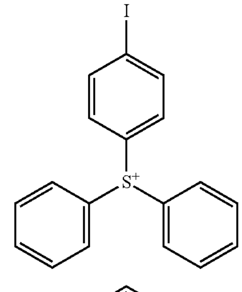
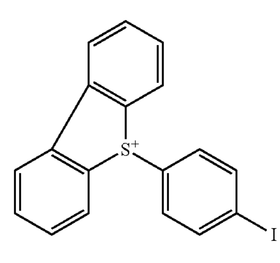
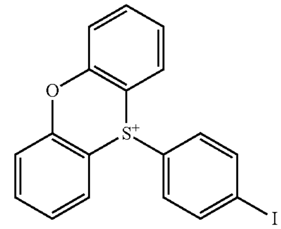

-continued
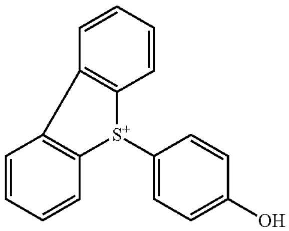
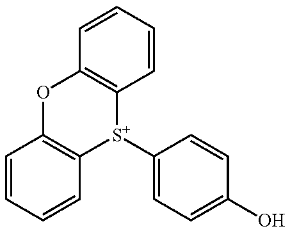
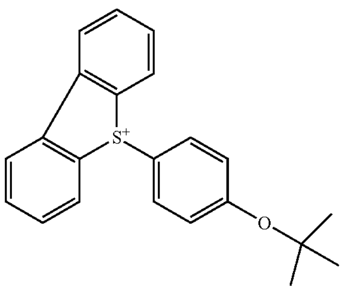
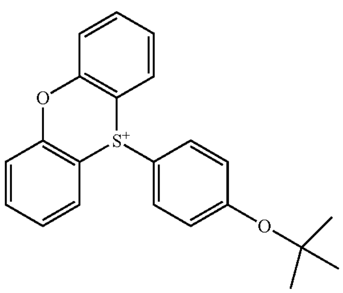
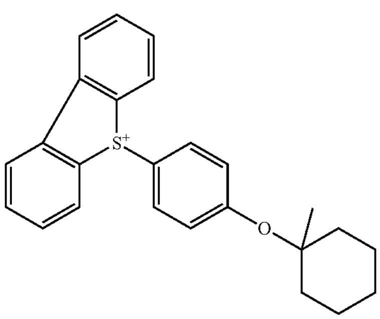
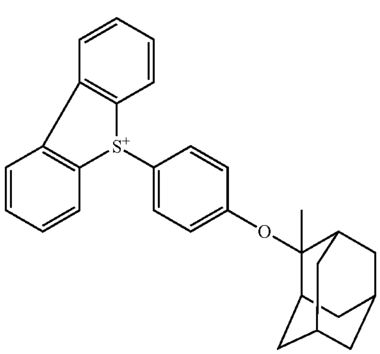
-continued
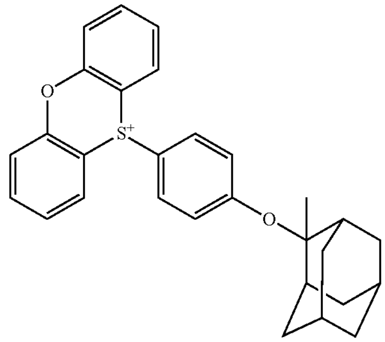
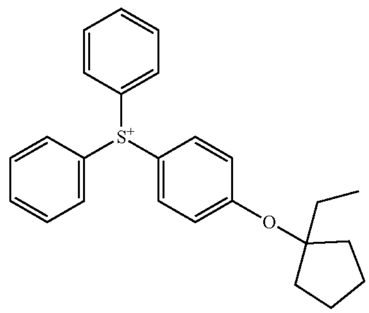
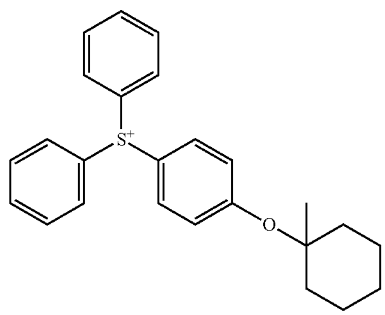
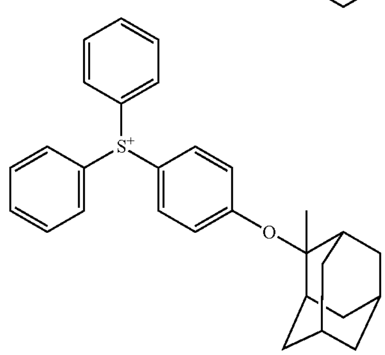
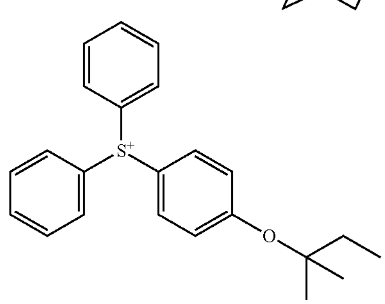

-continued
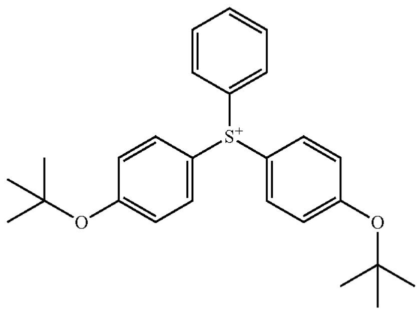
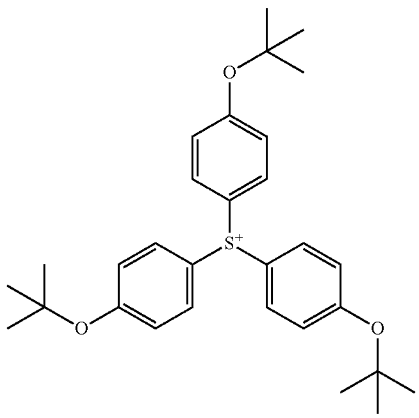
Examples of the cation in the iodonium salt having formula (A-2) are given below, but not limited thereto.
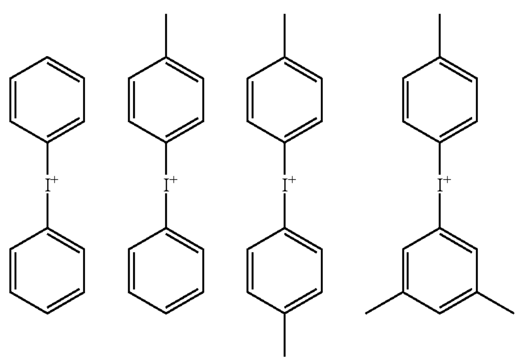
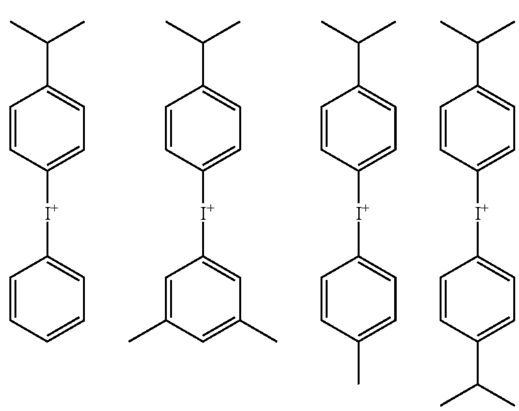
-continued
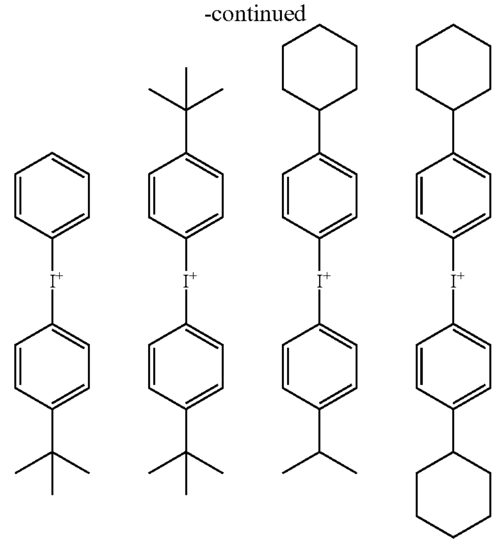
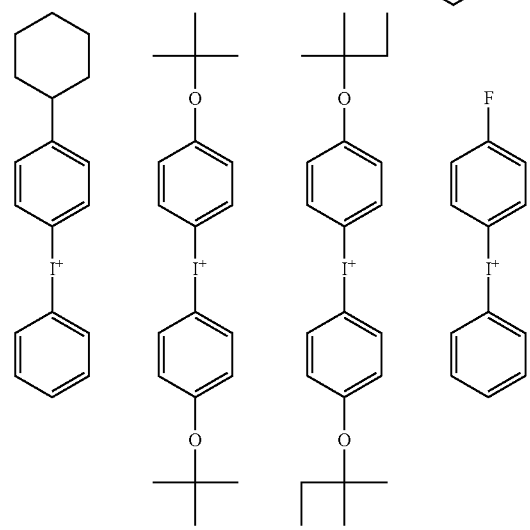
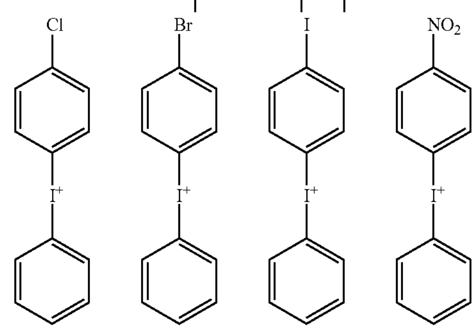
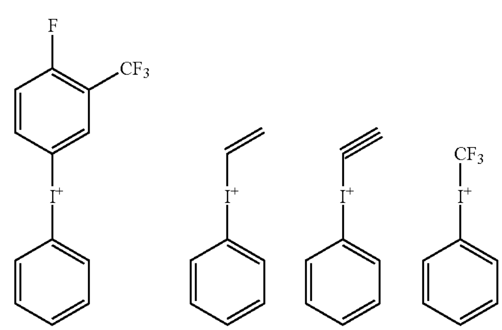

-continued
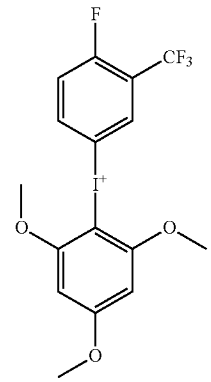
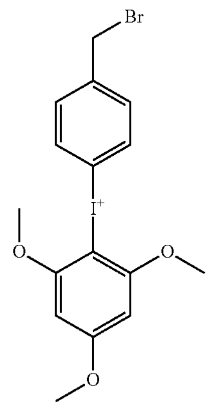
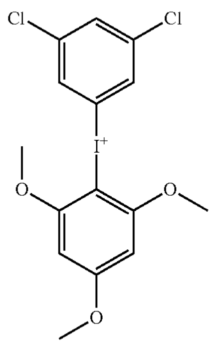
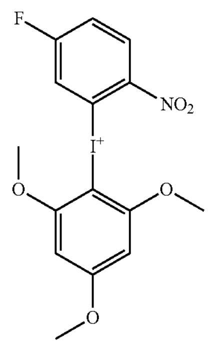
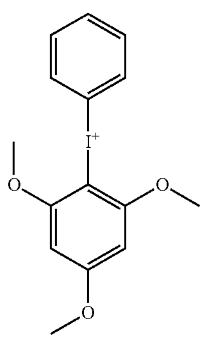
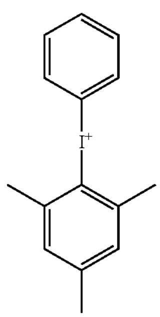
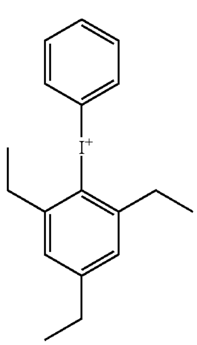
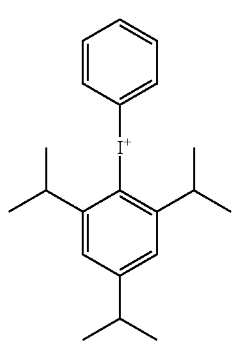
-continued
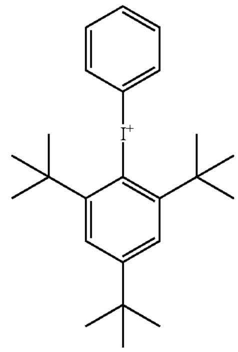
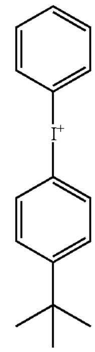
Examples of the anion in the sulfonium salt having formula (A-1) and the iodonium salt having formula (A-2) are given below, but not limited thereto.
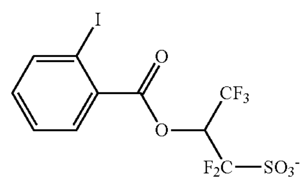
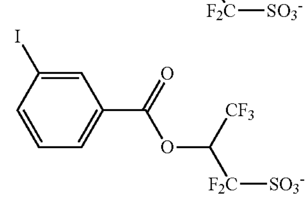
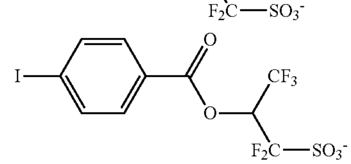
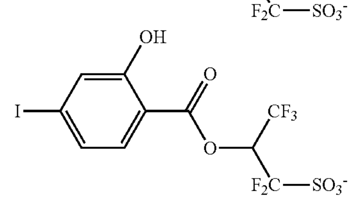
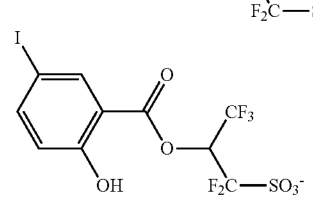
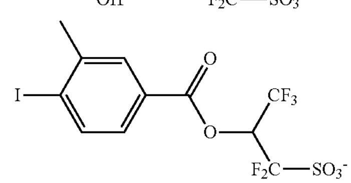
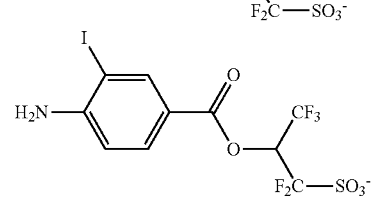

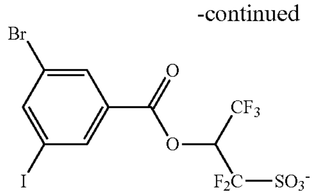
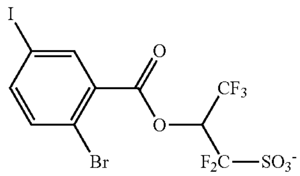
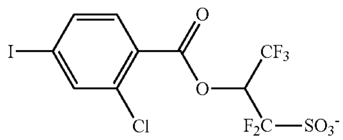
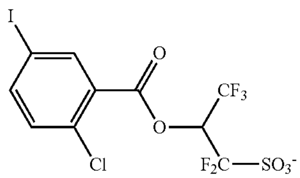
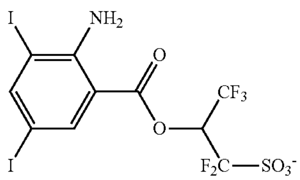
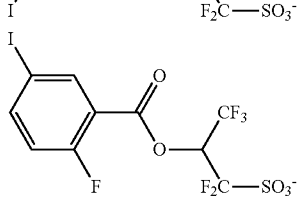
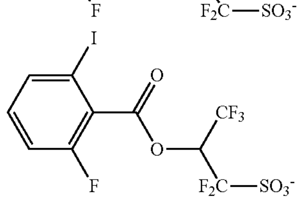
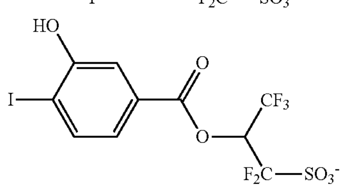
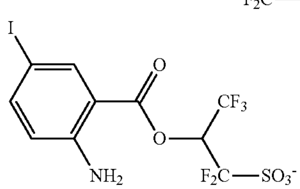
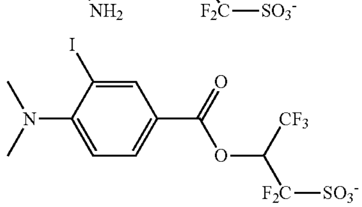
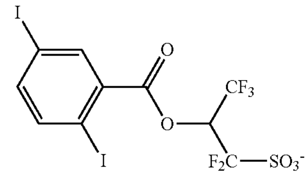
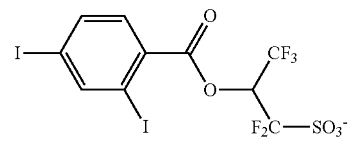
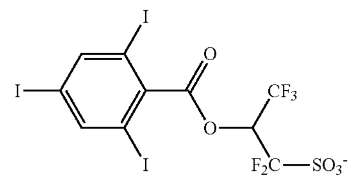
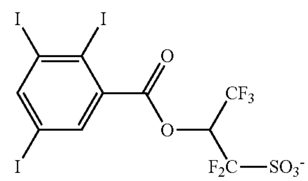
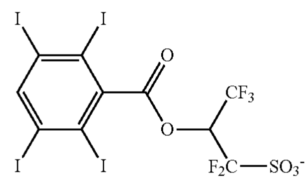
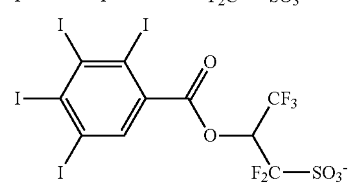
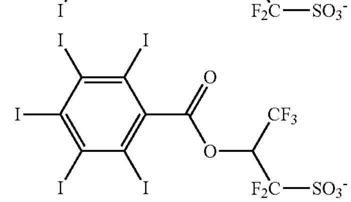
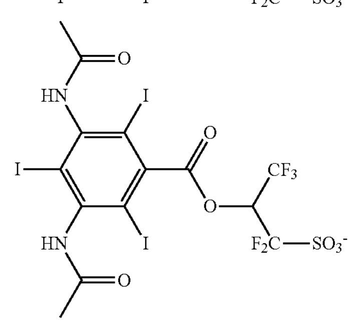

-continued
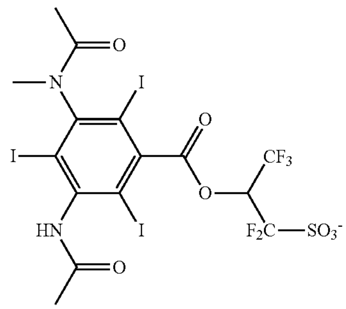
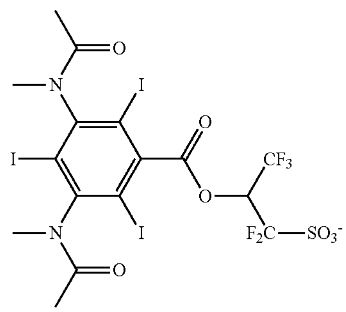
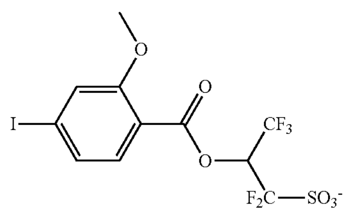
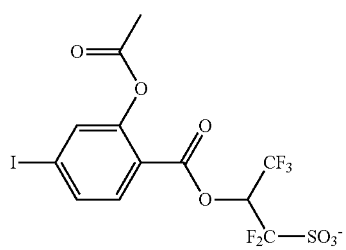
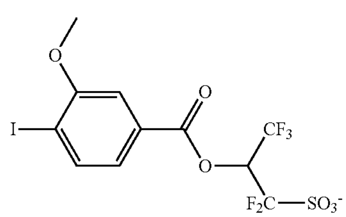
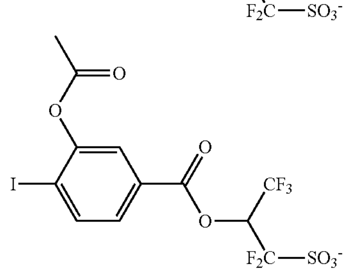
-continued
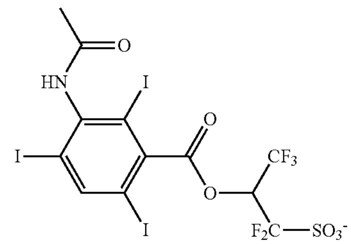
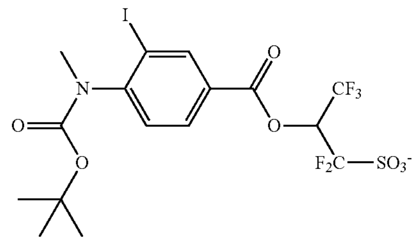
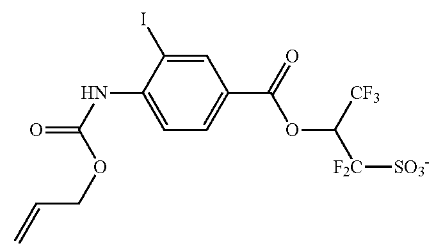
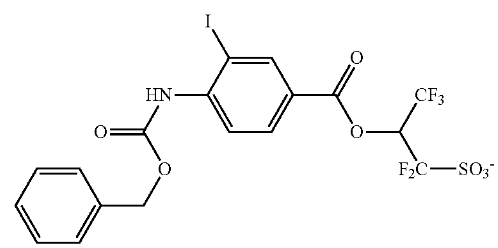
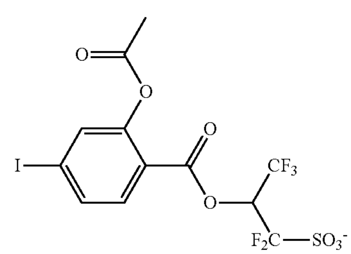
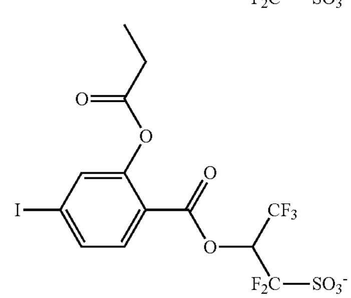

-continued
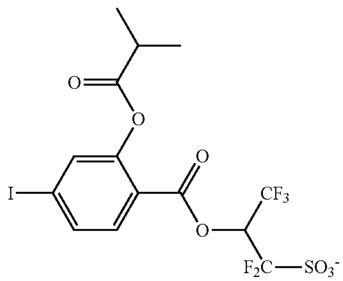
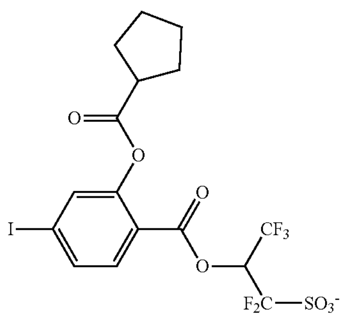
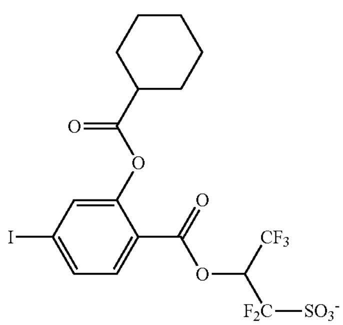
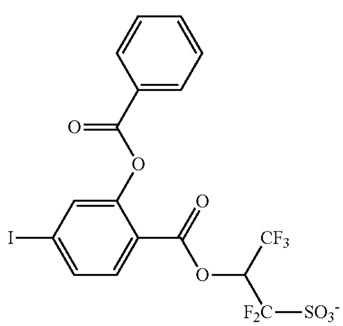
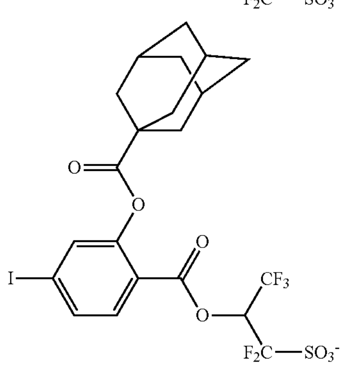
-continued
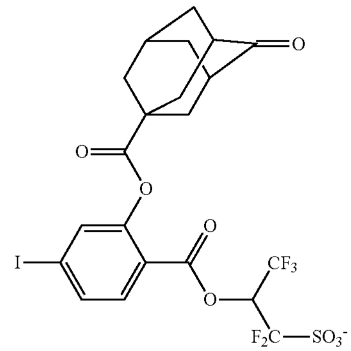
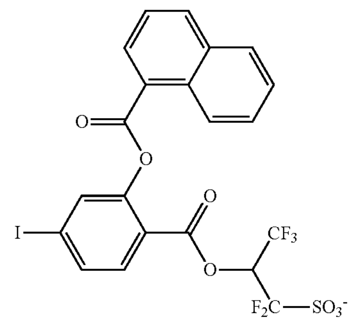
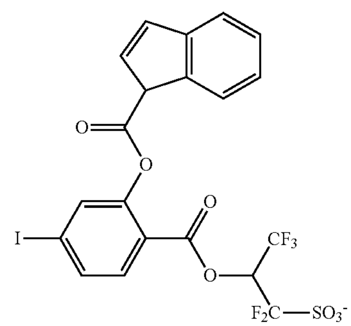
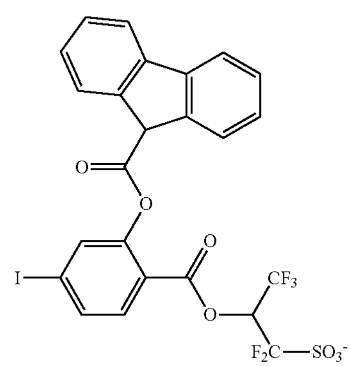
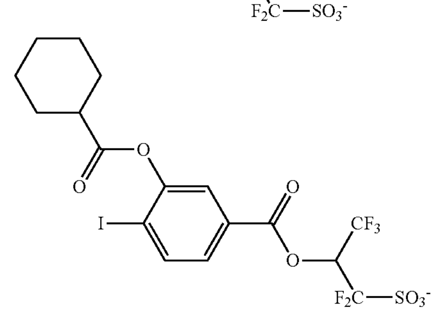

-continued
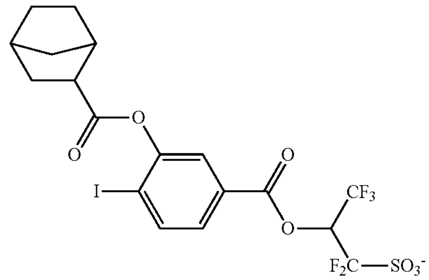
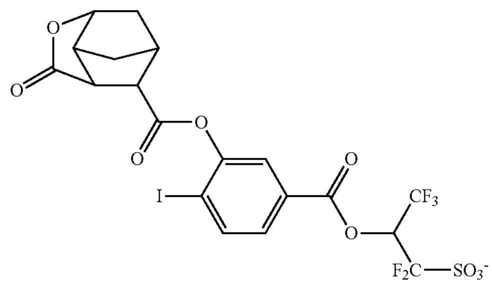
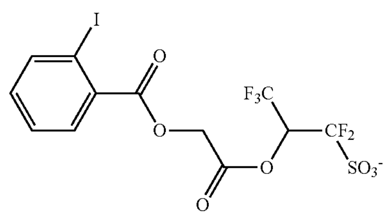
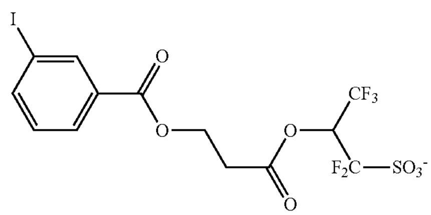
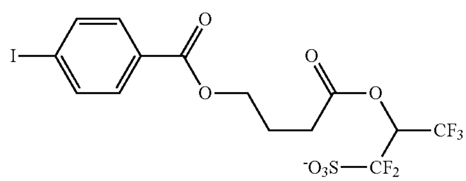
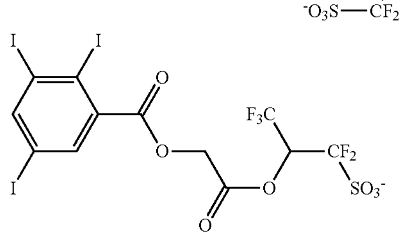
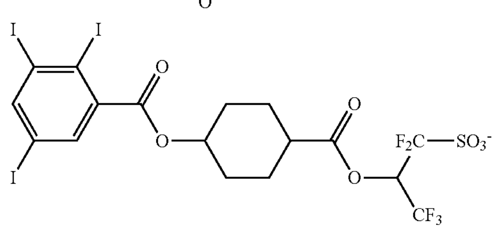
-continued
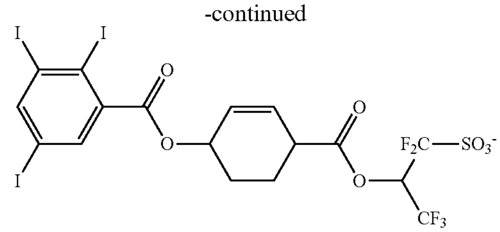
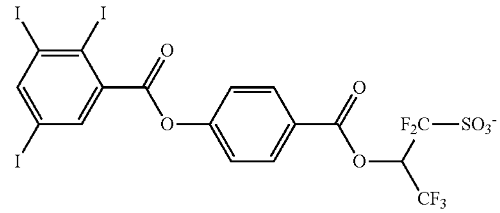
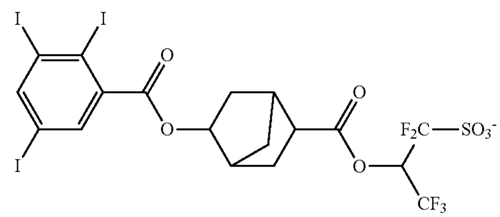
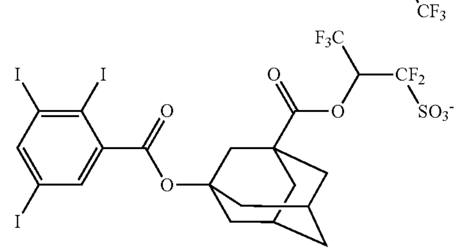
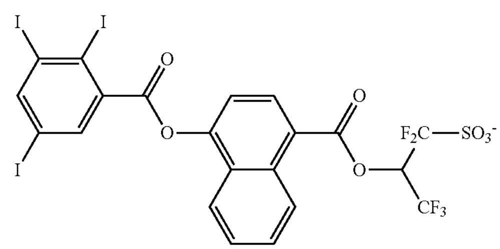
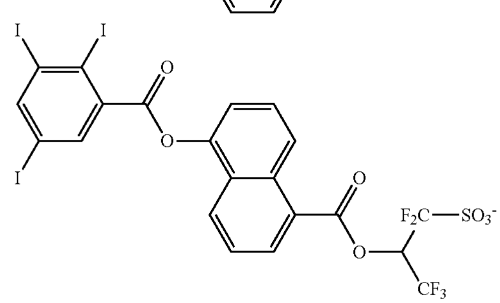
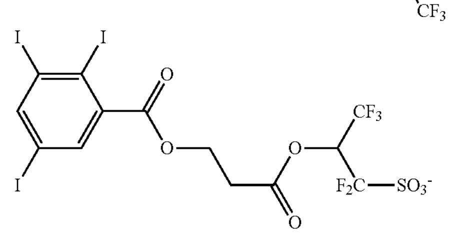

-continued
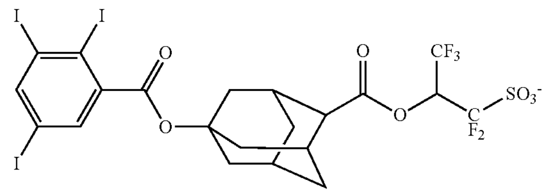
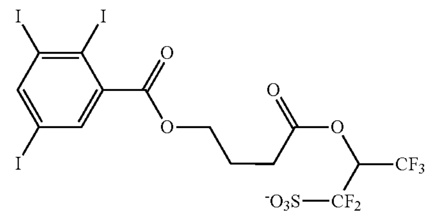
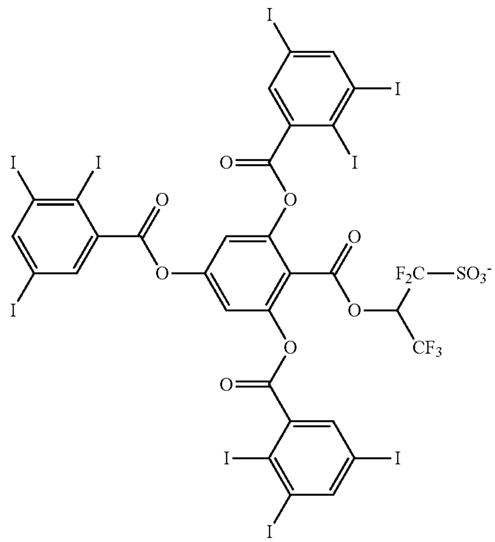
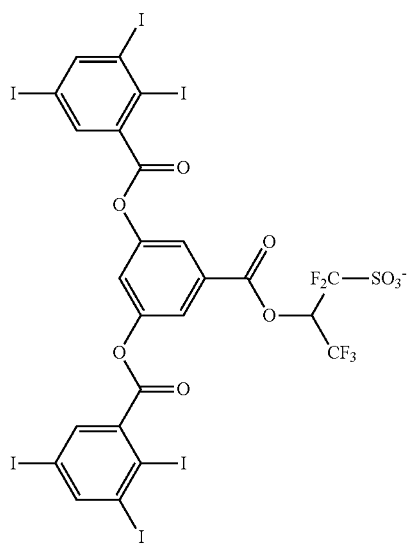
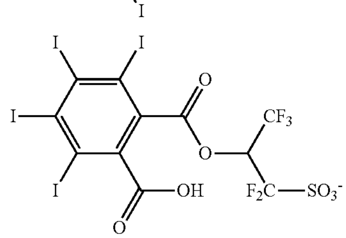
-continued
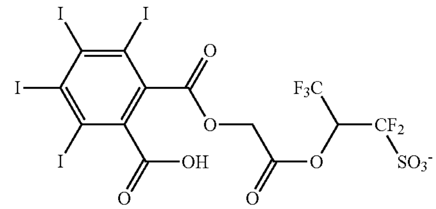
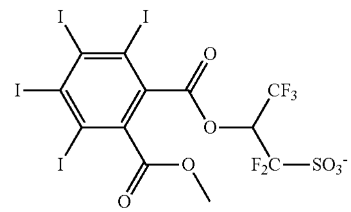
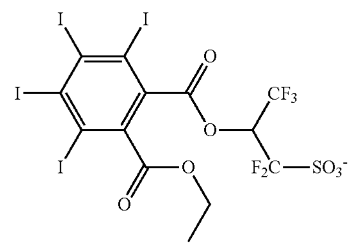
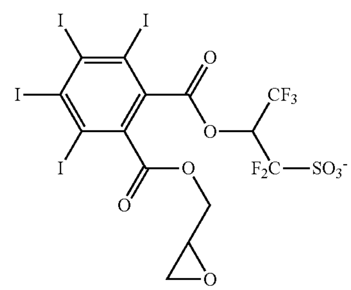
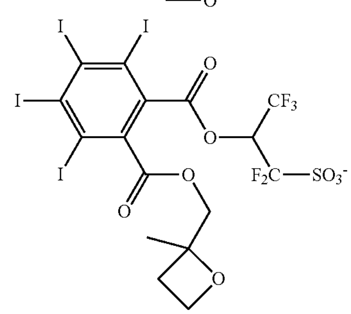
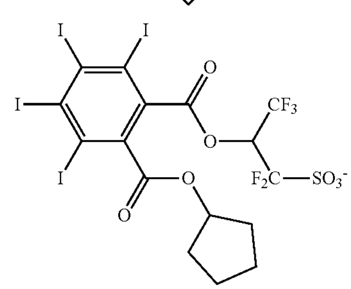

-continued
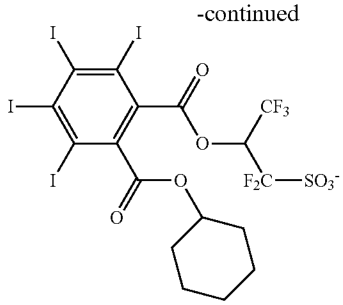
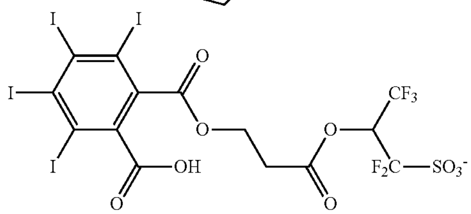
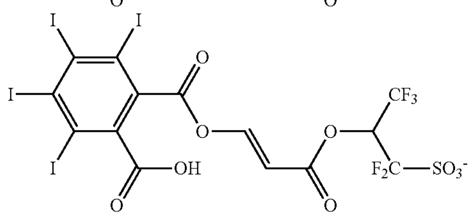
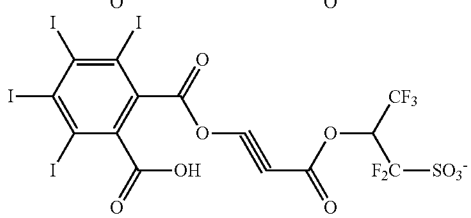
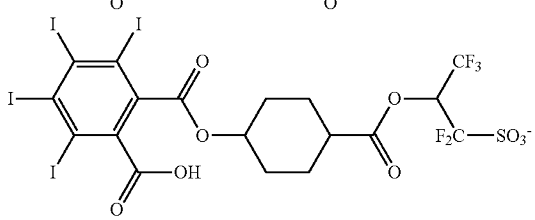
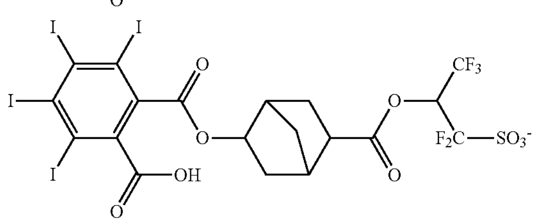
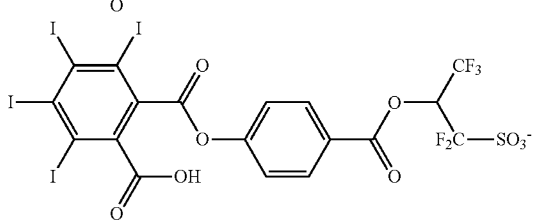
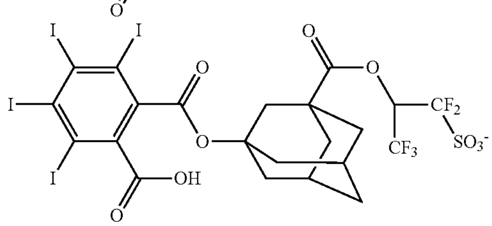
-continued
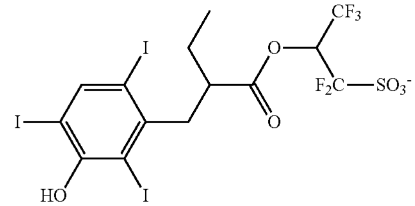
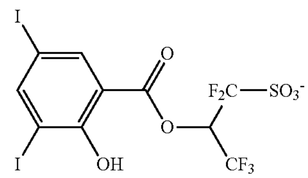
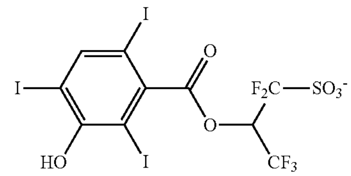
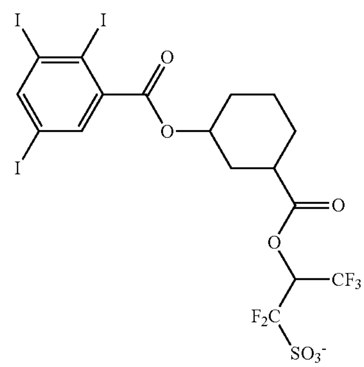
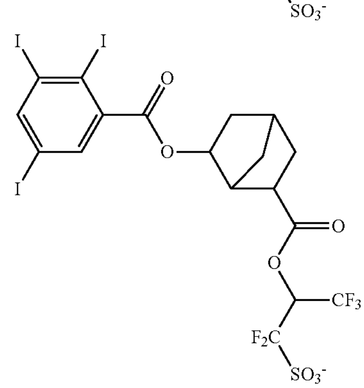
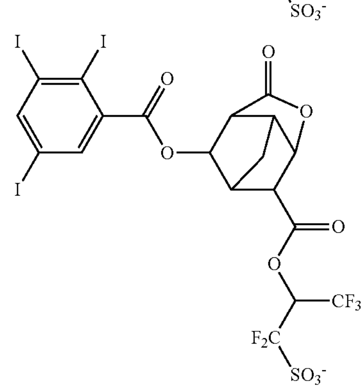

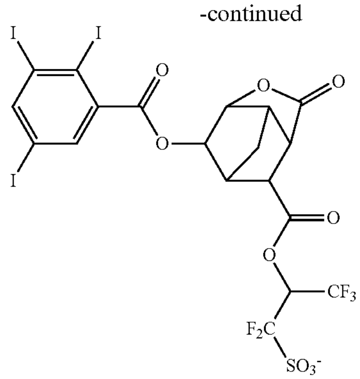
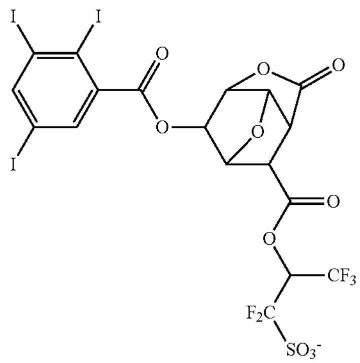
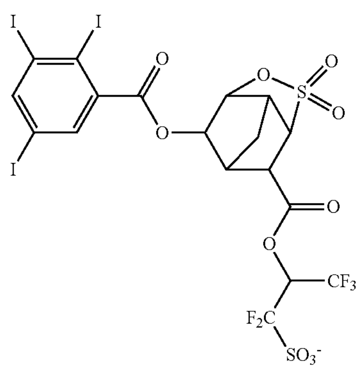
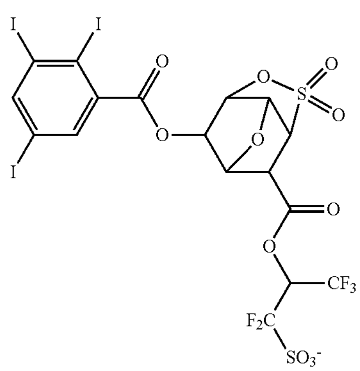
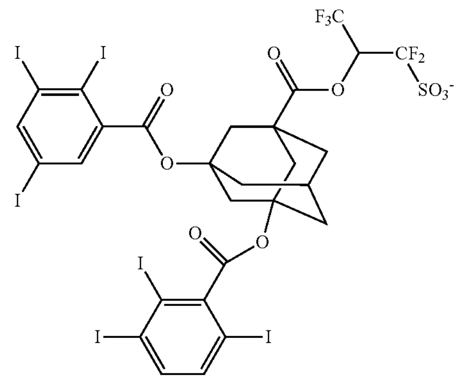
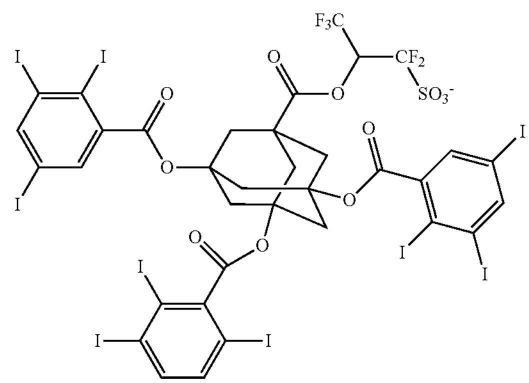
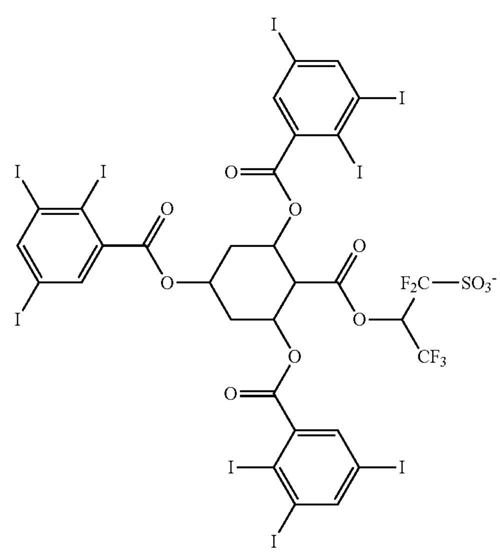

-continued
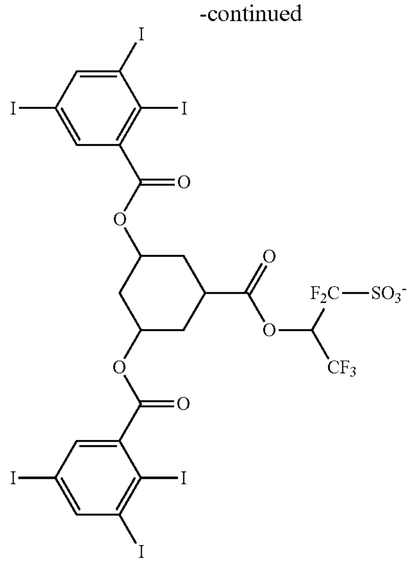
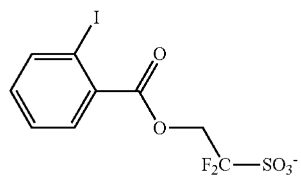
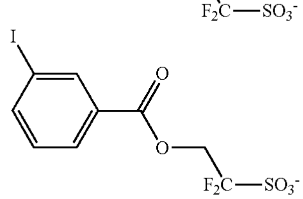
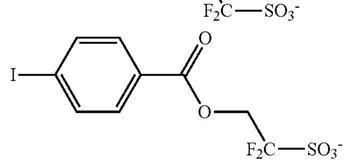
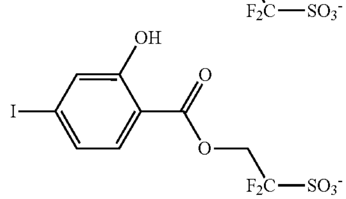
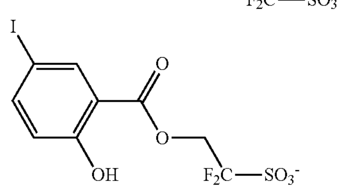
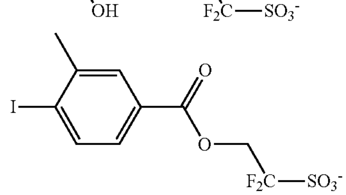
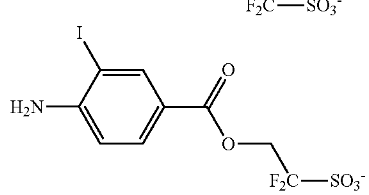
-continued
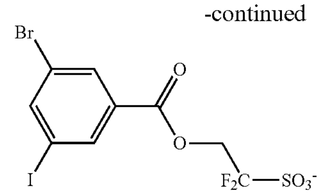
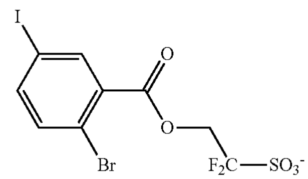
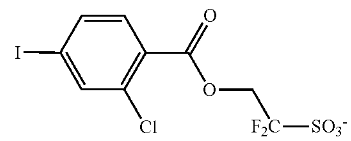
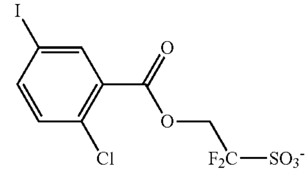
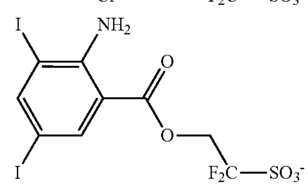
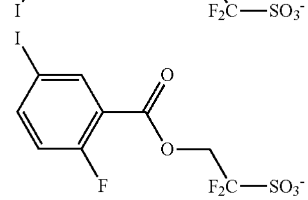
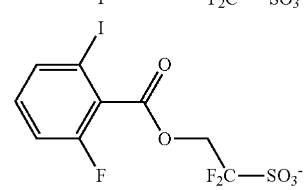
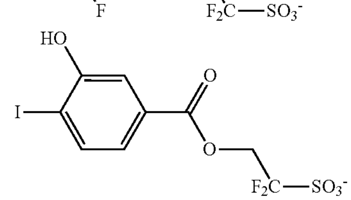
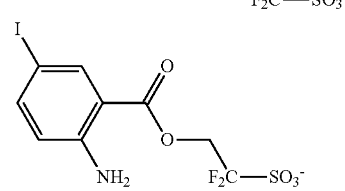
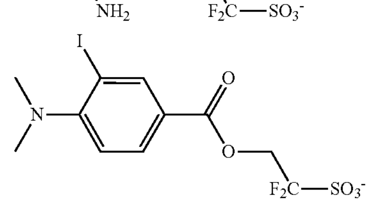

-continued
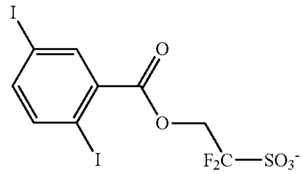
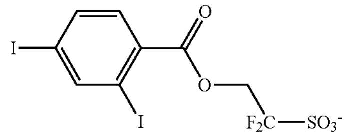
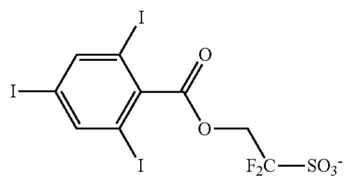
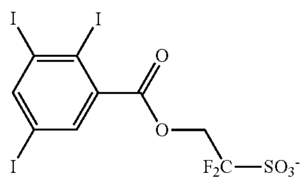
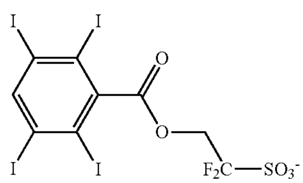
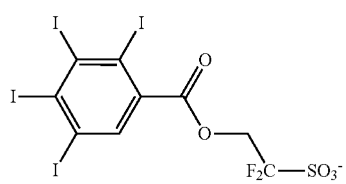
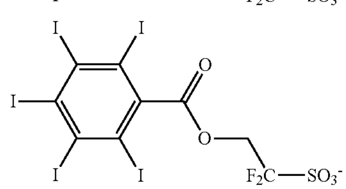
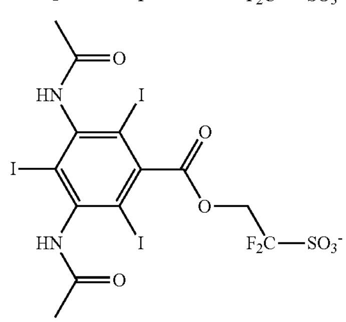
-continued
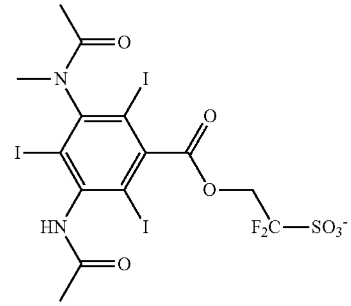
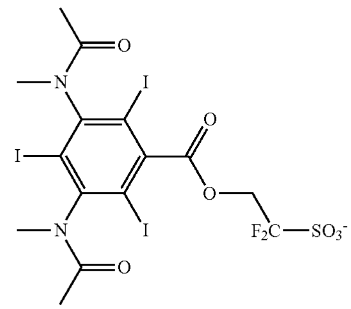
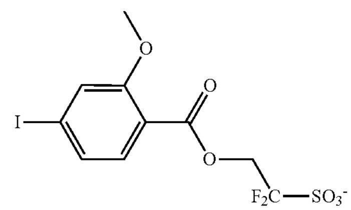
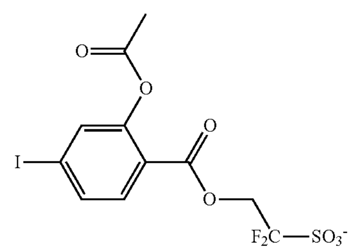
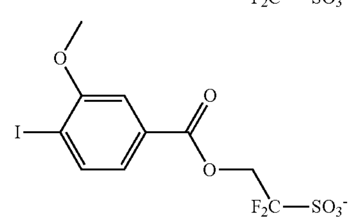
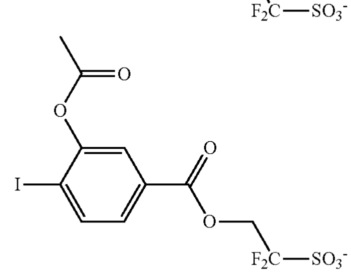

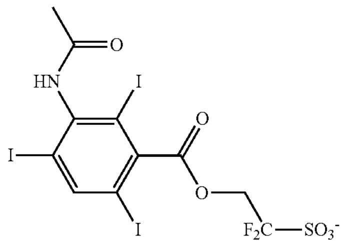
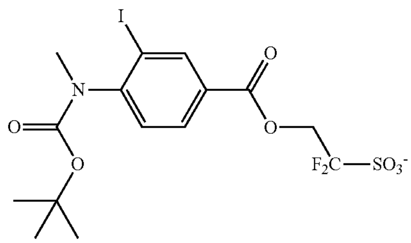
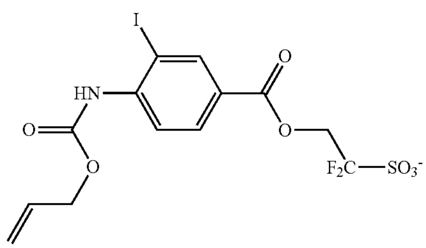
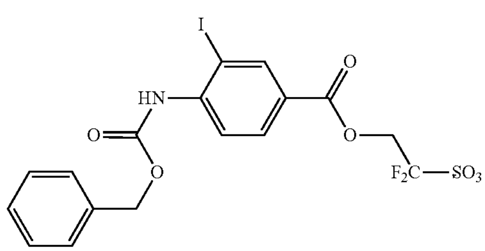
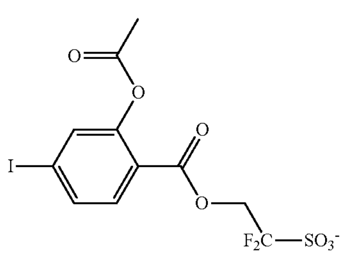
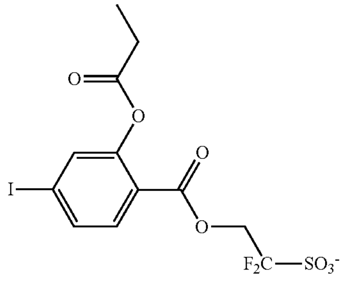
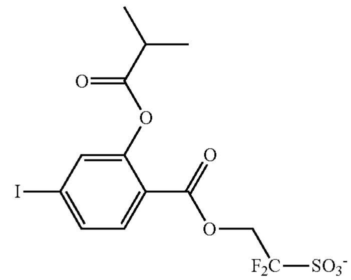
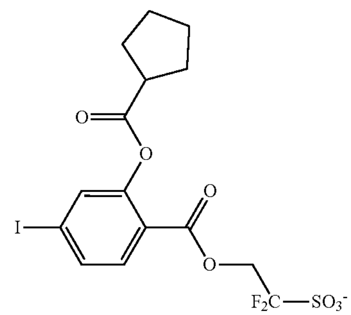
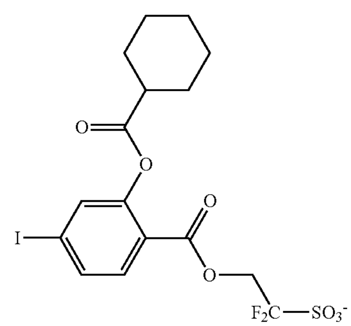
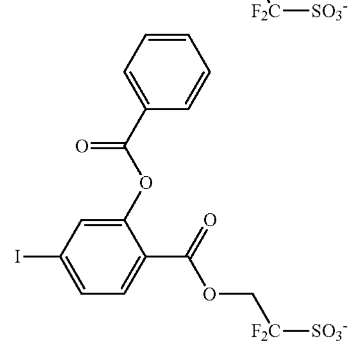
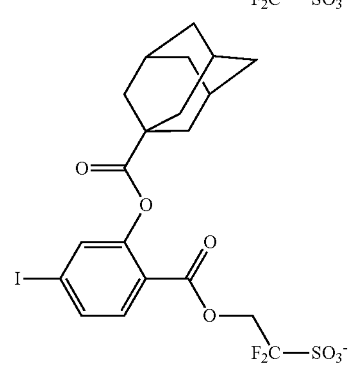

-continued
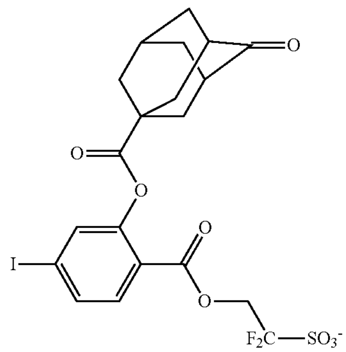
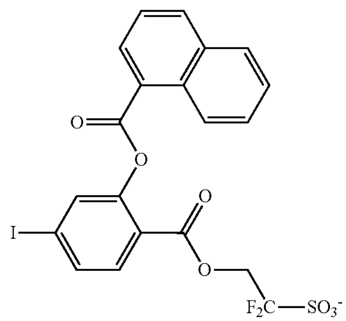
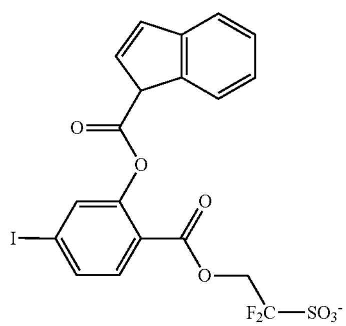
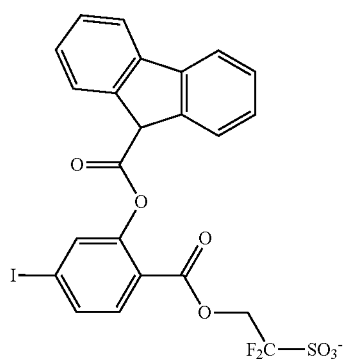
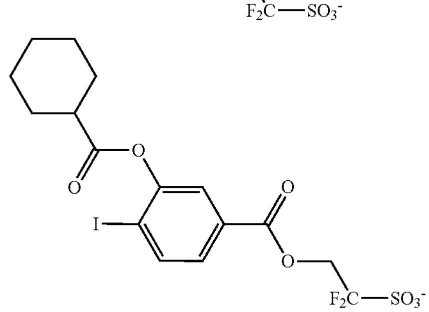
-continued
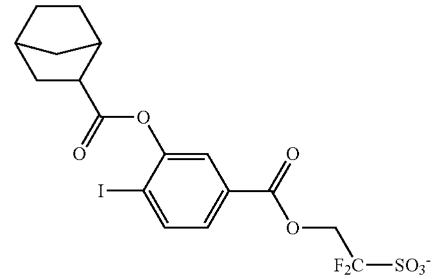
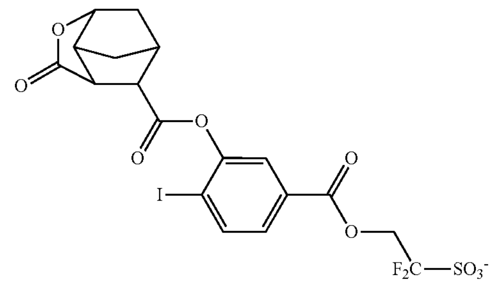
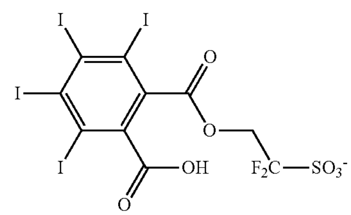
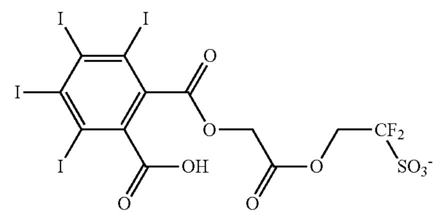
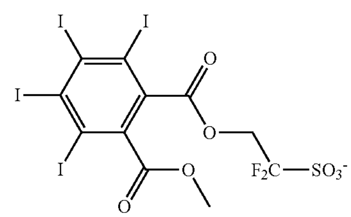
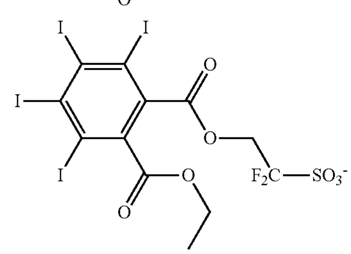
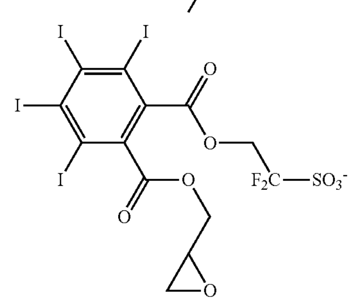

-continued
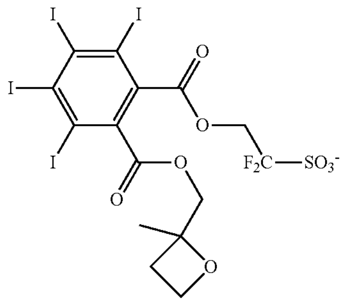
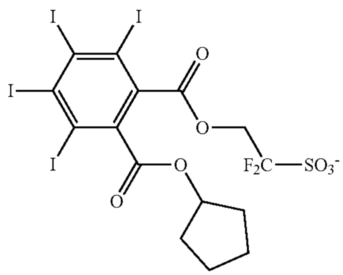
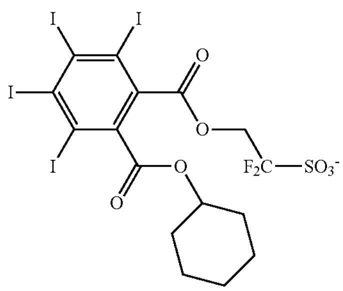
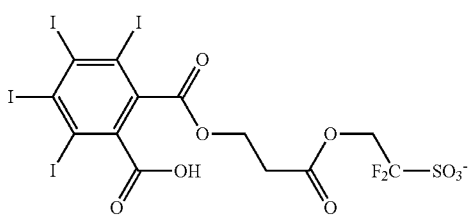
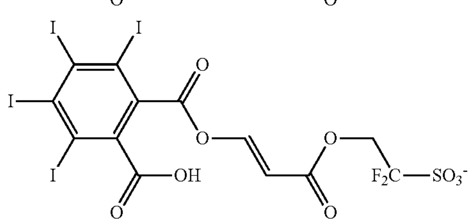
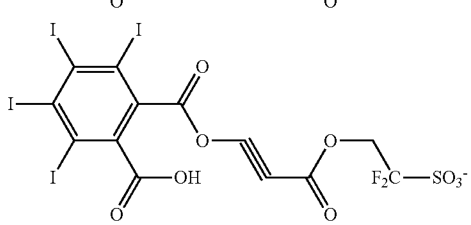
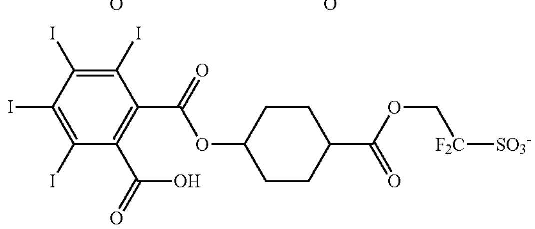
-continued
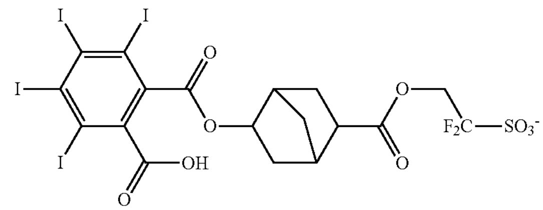
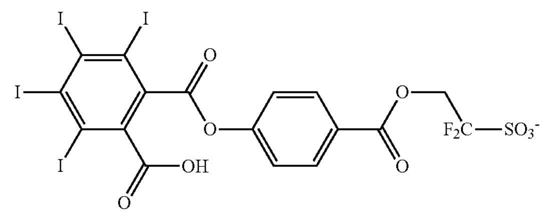
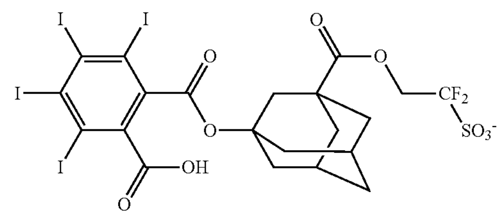
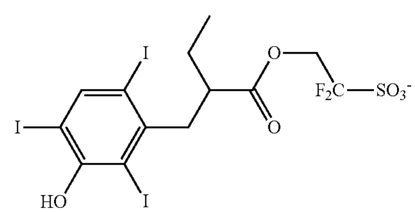
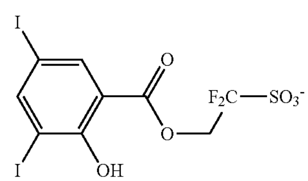
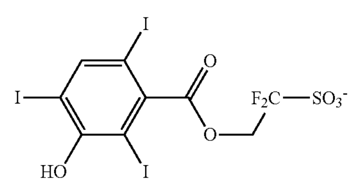
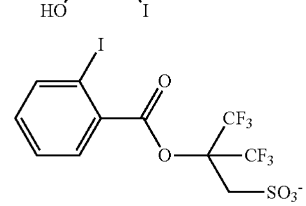
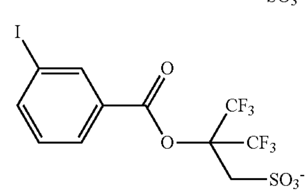
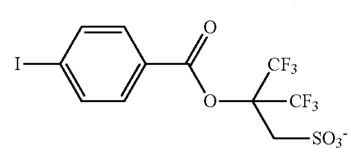

-continued
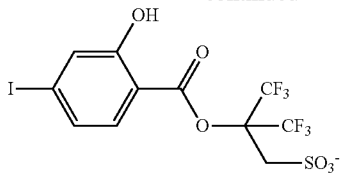
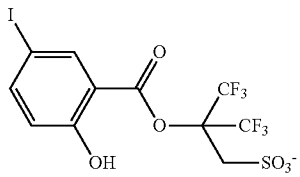
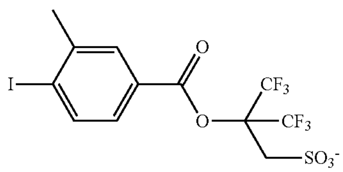
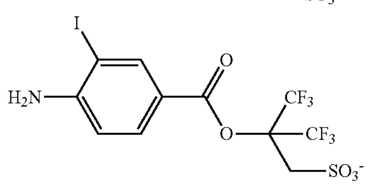
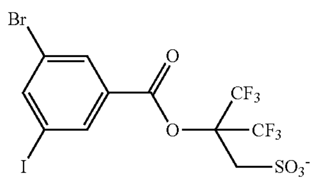
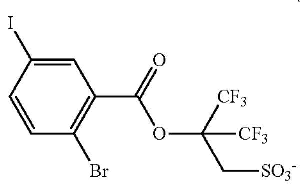
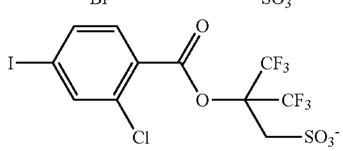
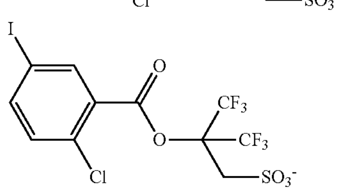
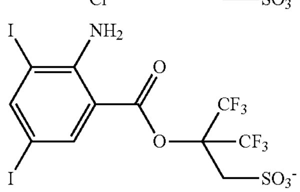
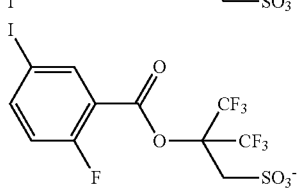
-continued
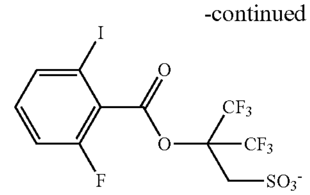
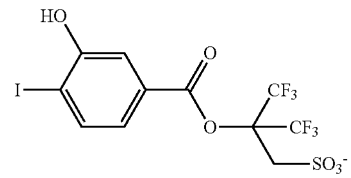
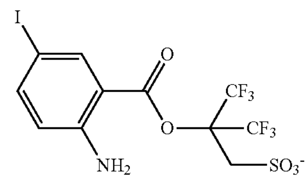
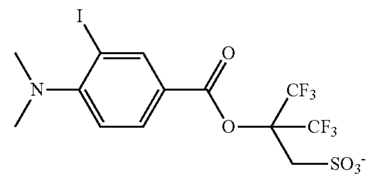
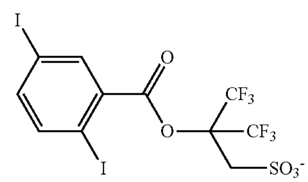
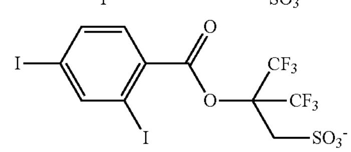
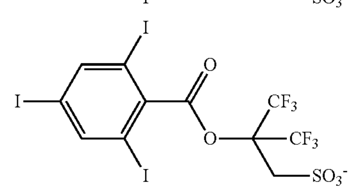
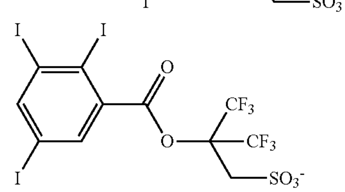
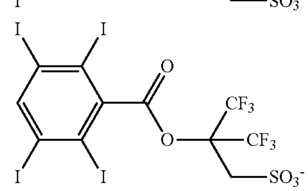
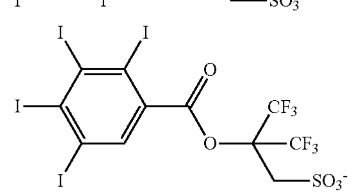

-continued
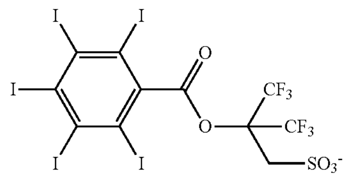
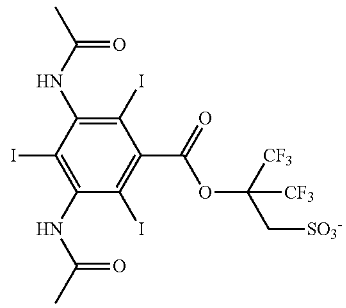
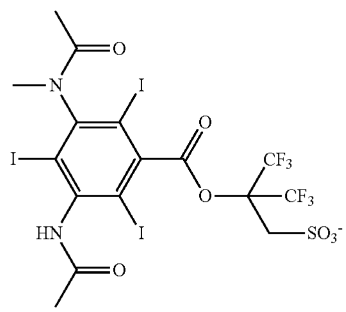
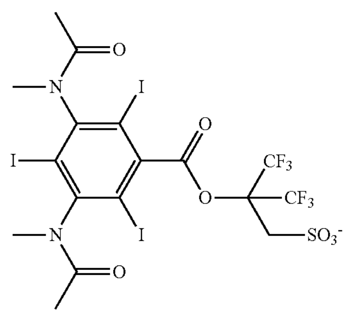
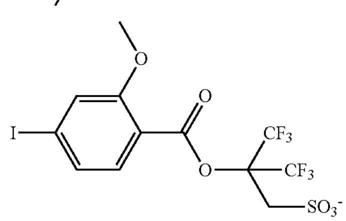
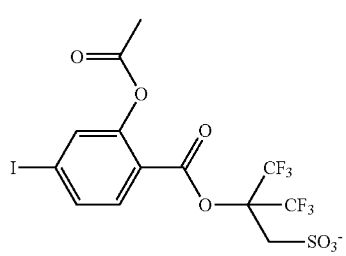
-continued
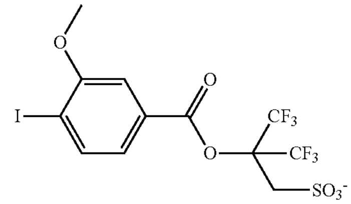
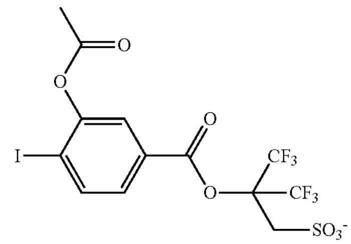
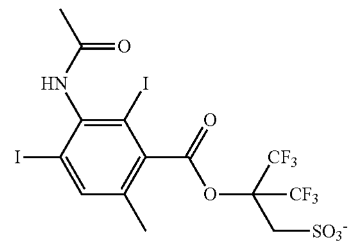
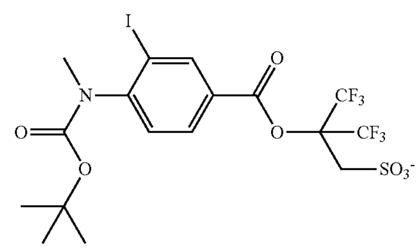
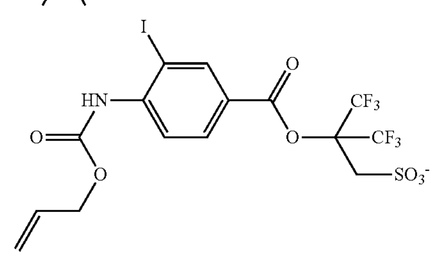
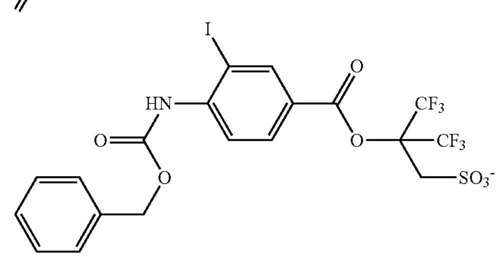
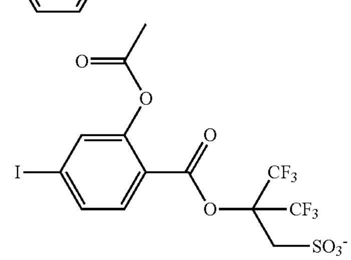

-continued
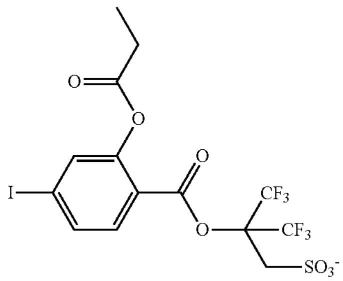
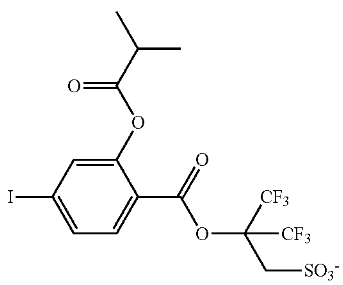
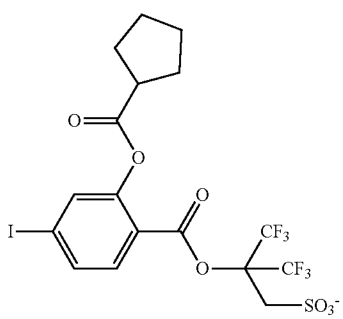
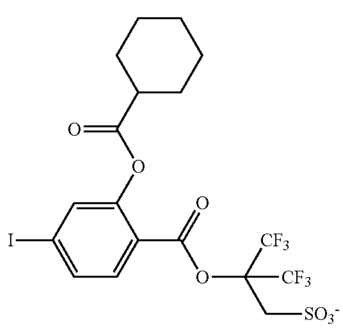
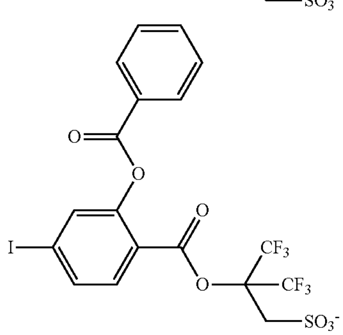
-continued
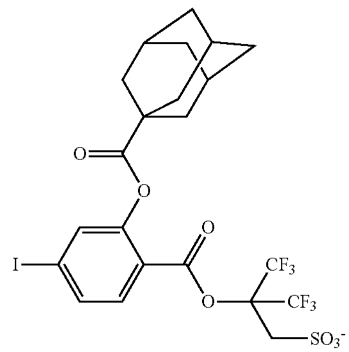
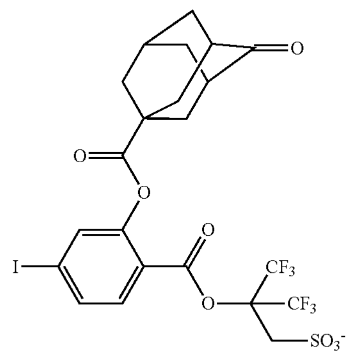
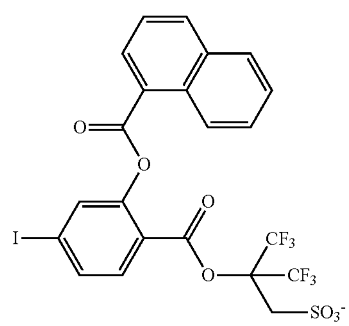
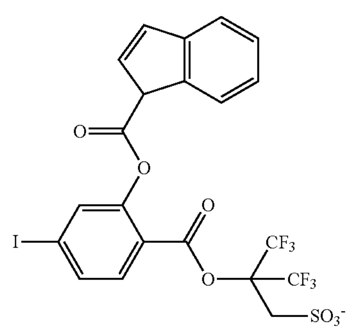
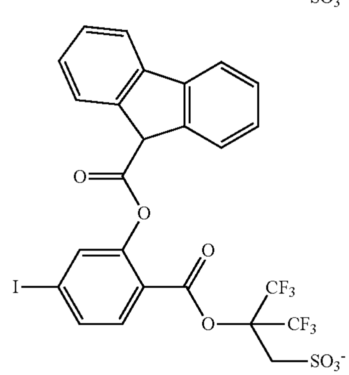

-continued
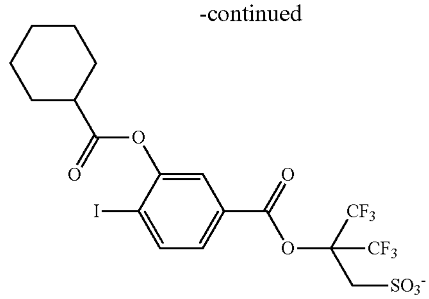
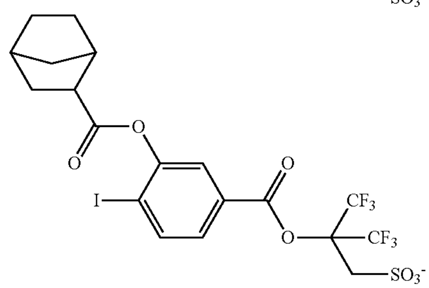
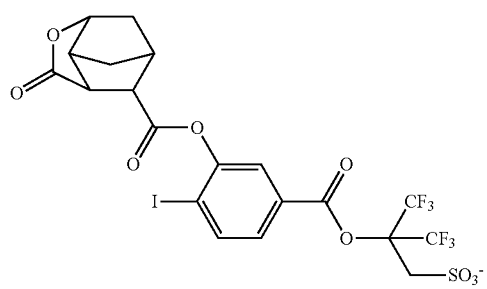
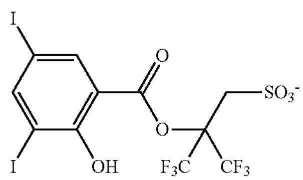
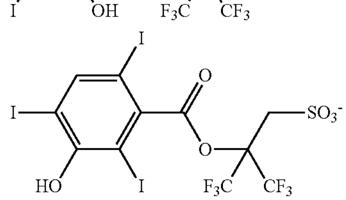
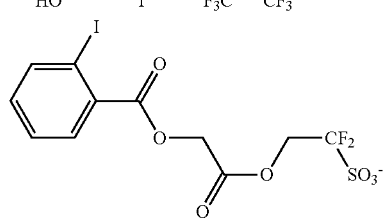
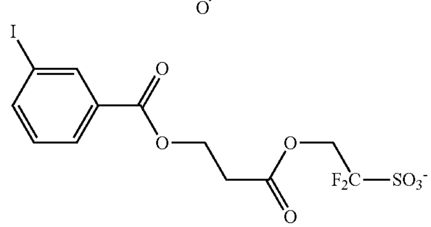
-continued
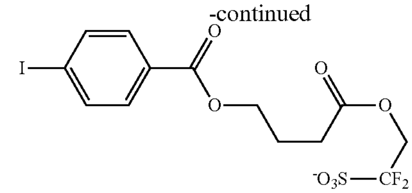
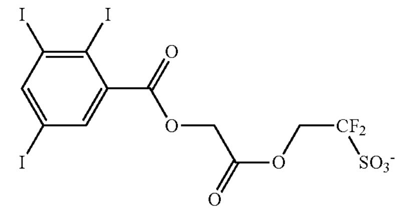
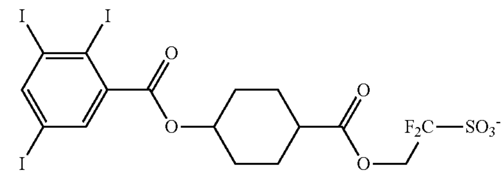
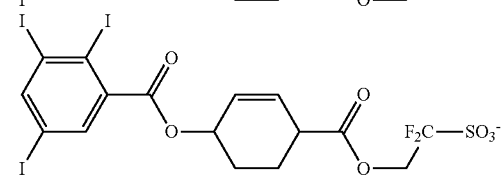
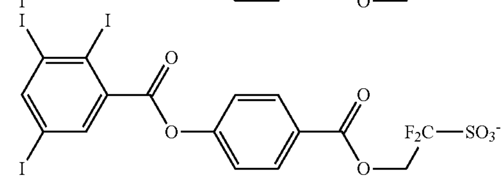
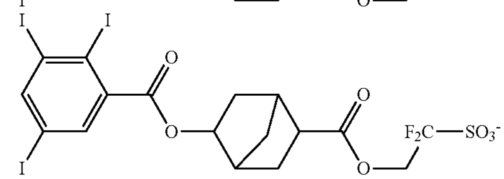
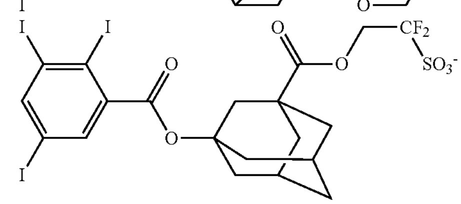
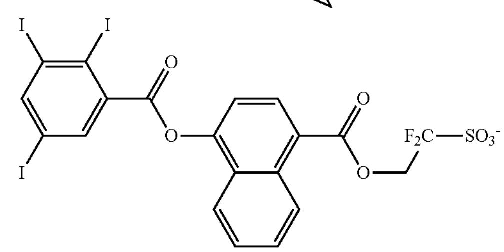
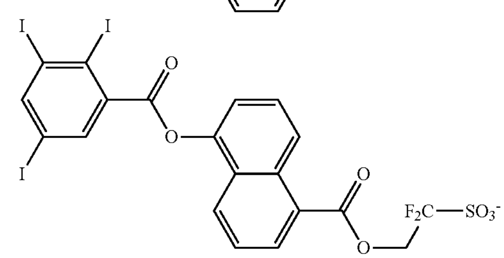

-continued
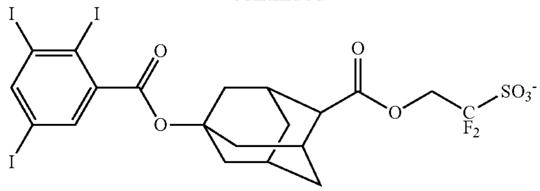
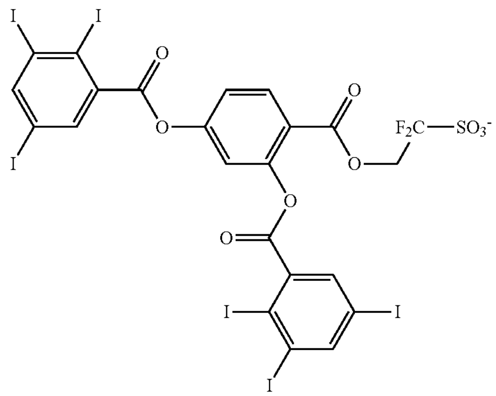
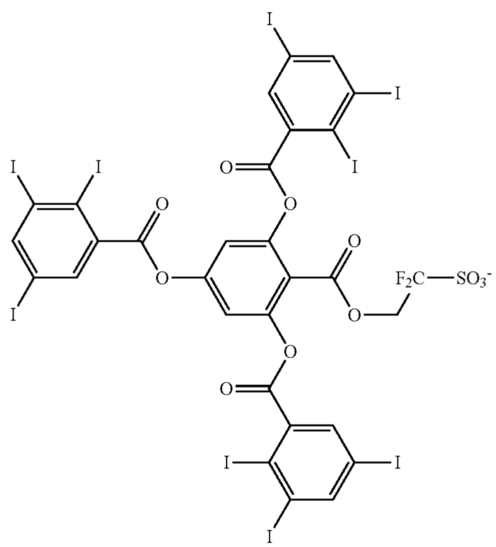
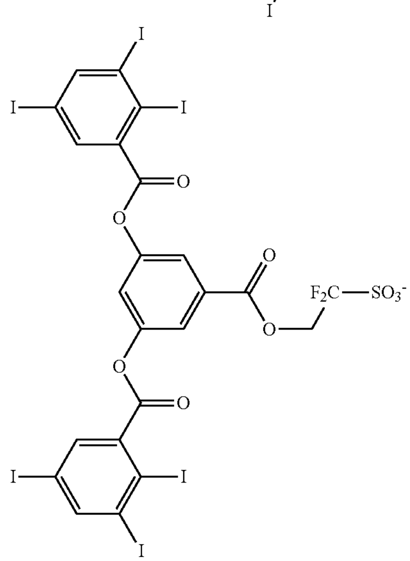
-continued
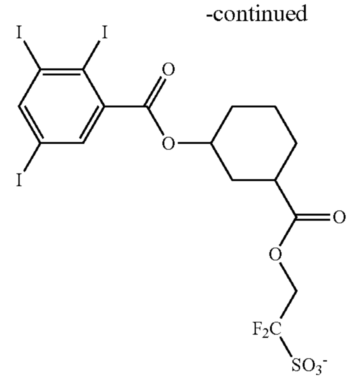
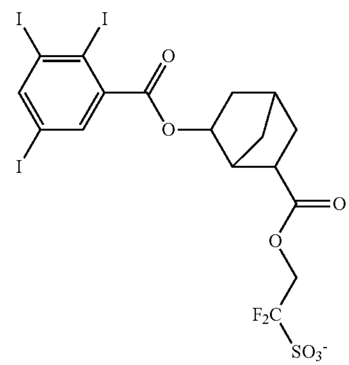
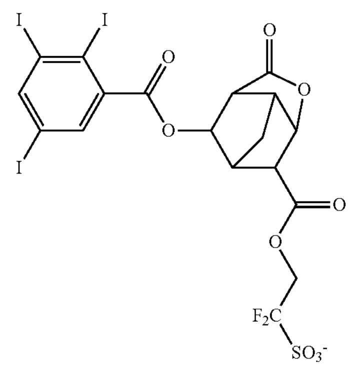
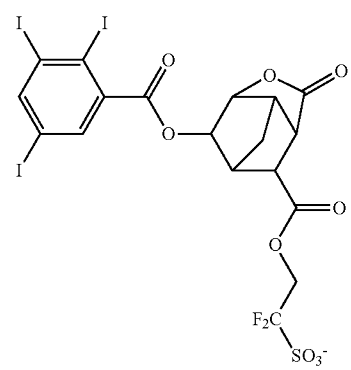

-continued
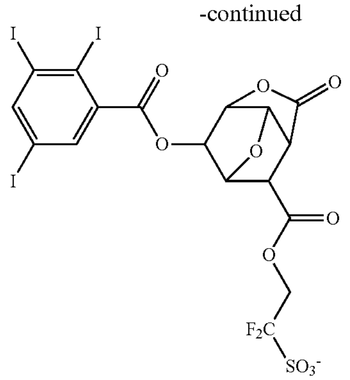
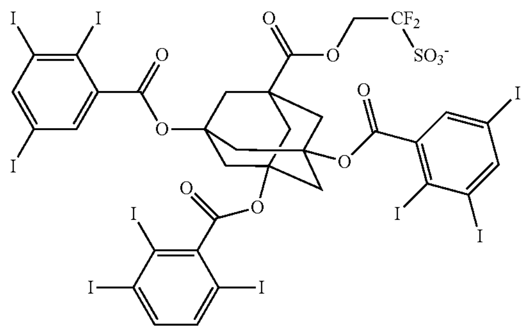
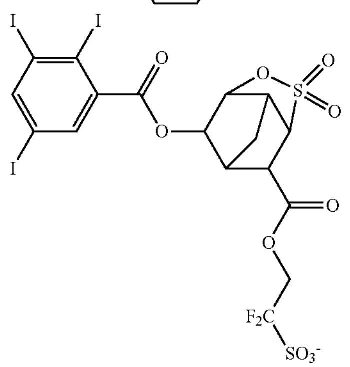
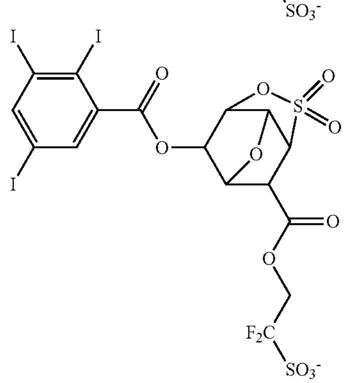
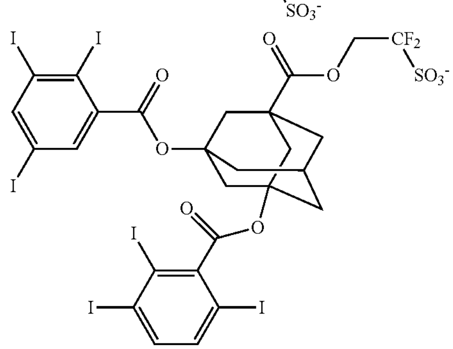
-continued
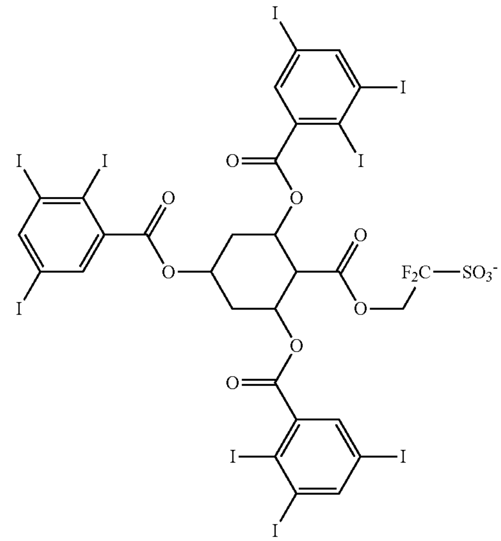
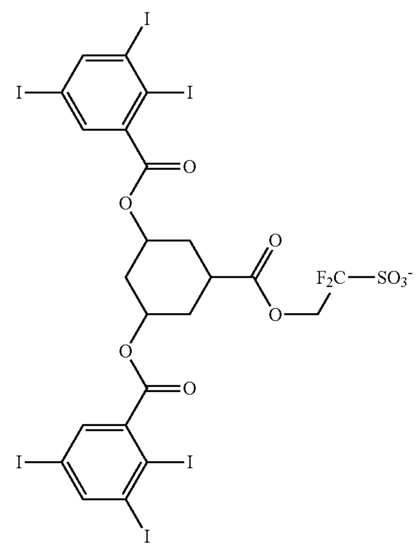
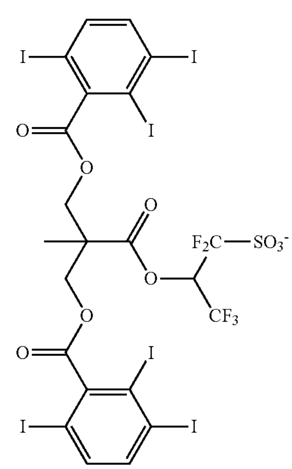

-continued
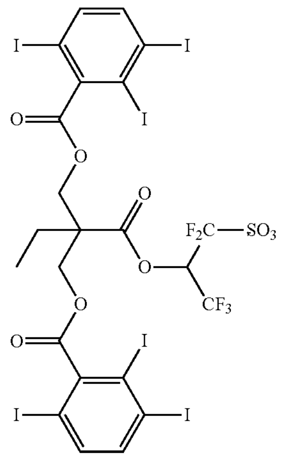
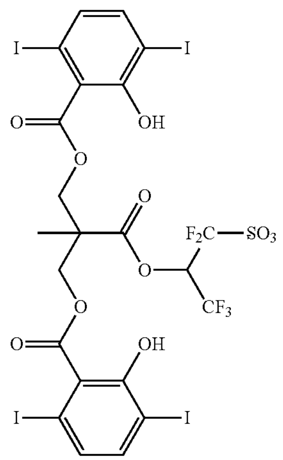
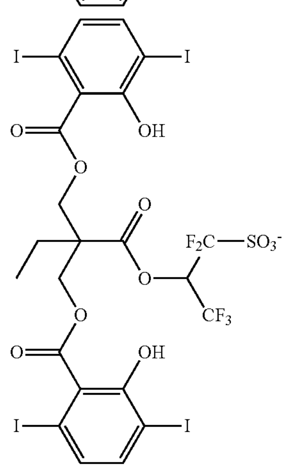
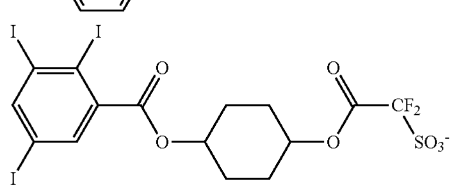
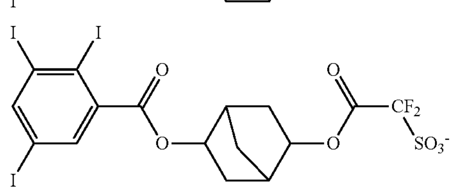
-continued
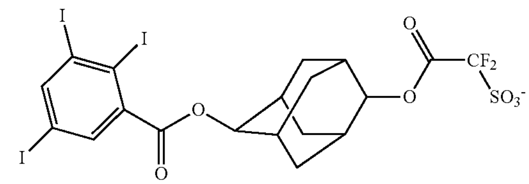
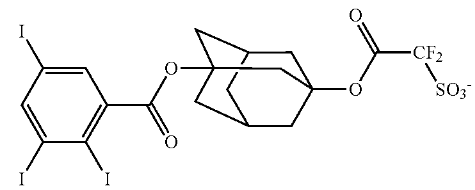
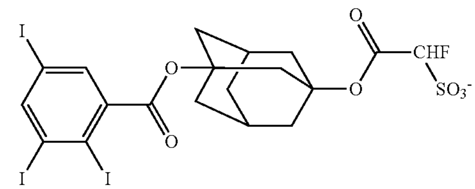
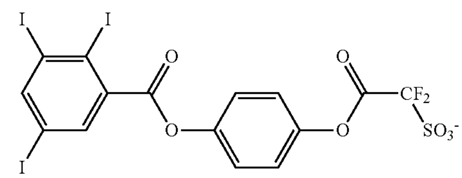
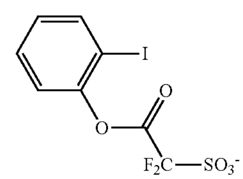
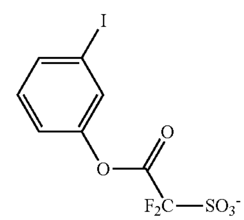
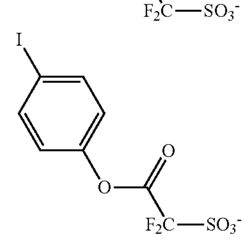
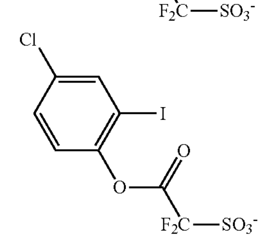
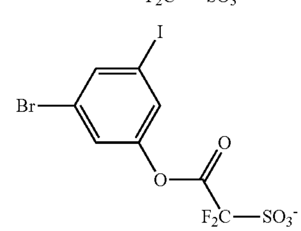
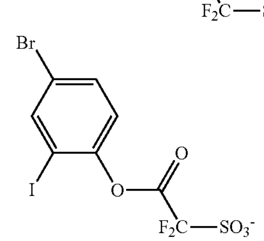
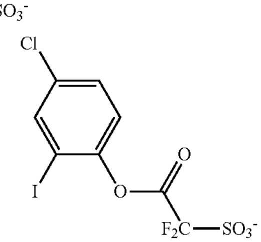

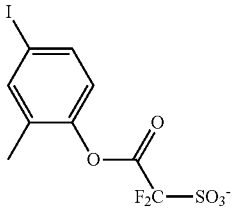
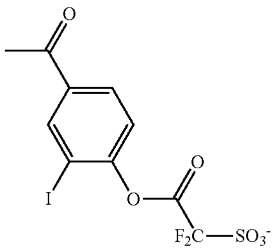
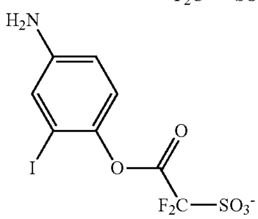
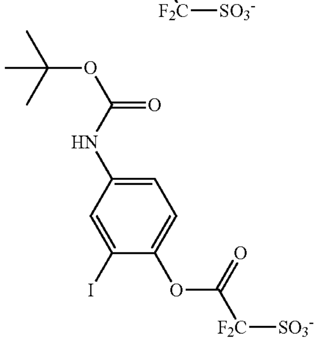
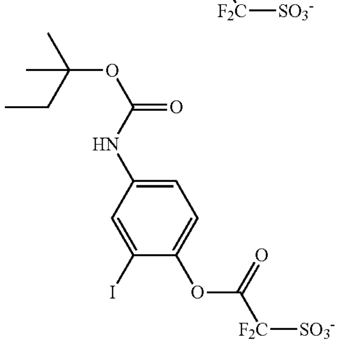
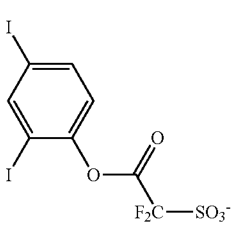
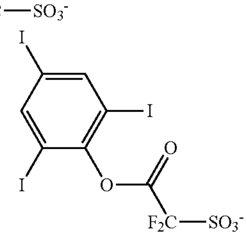
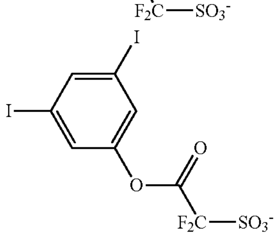
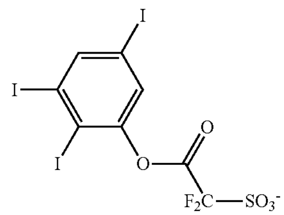
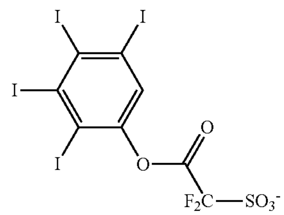
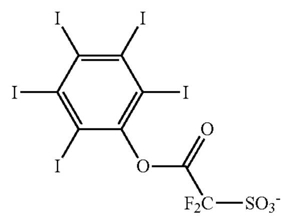
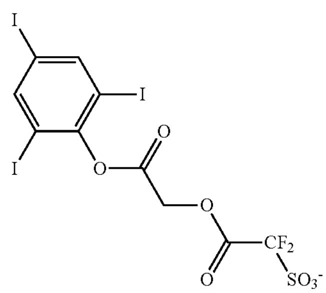
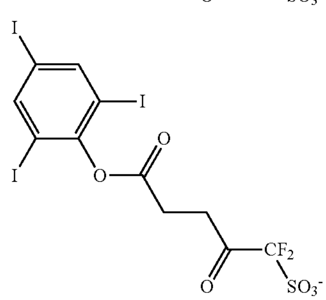
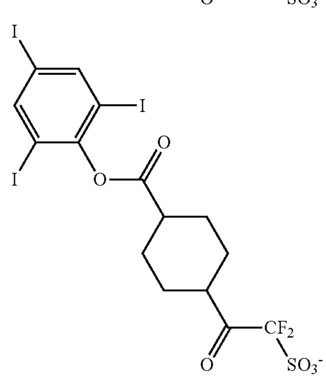

-continued
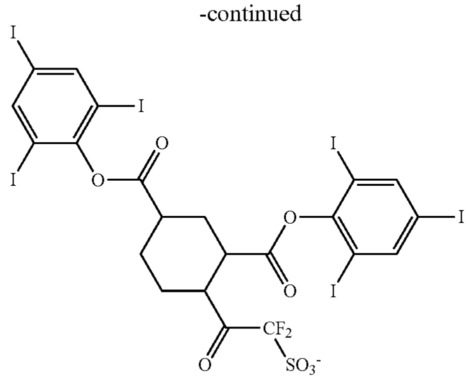
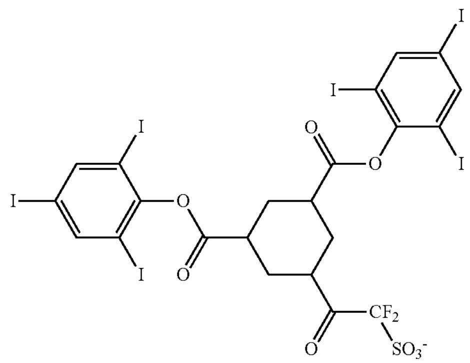
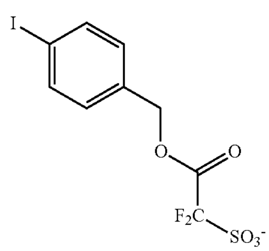
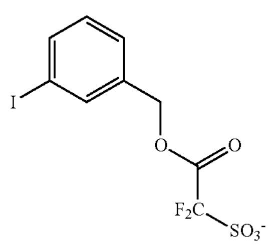
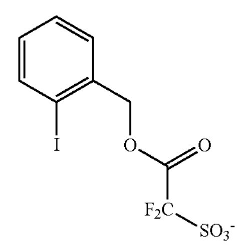
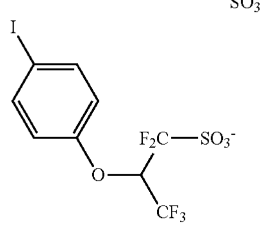
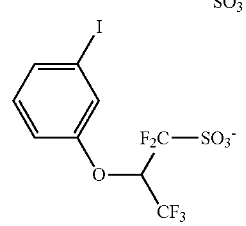
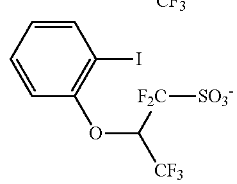
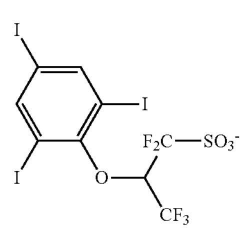
-continued
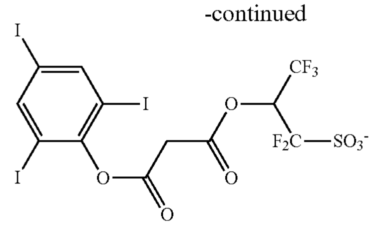
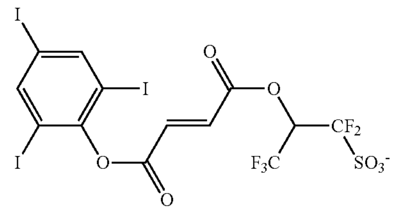
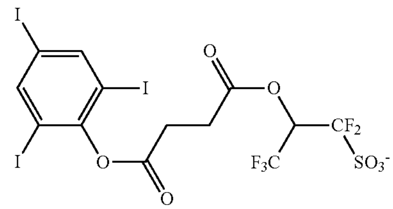
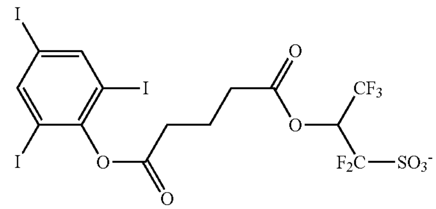
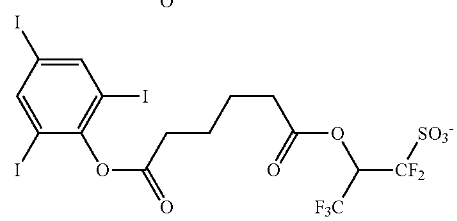
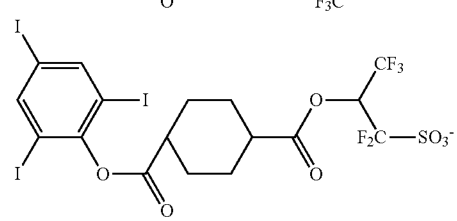
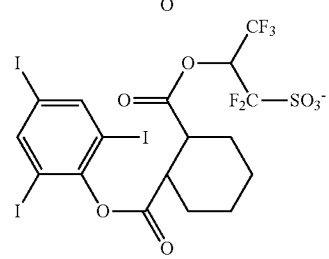
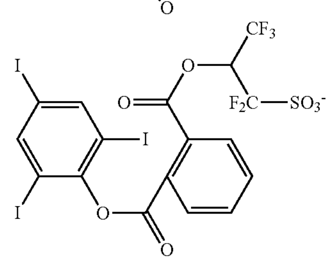

-continued
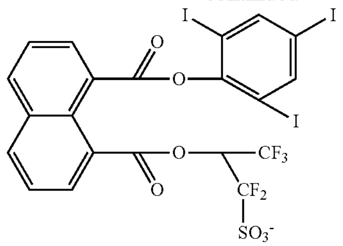
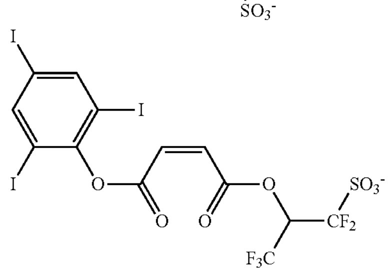
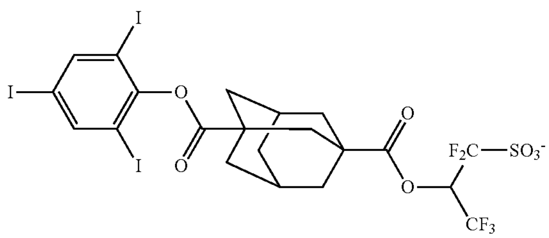
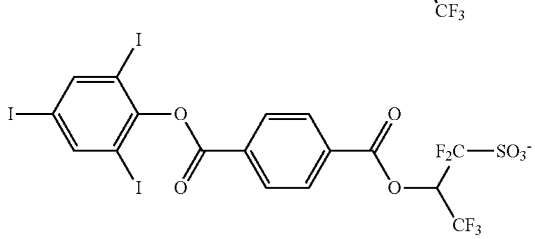
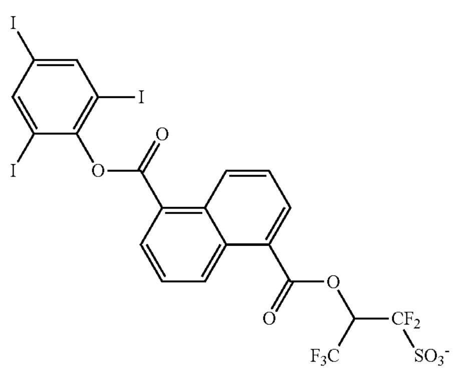
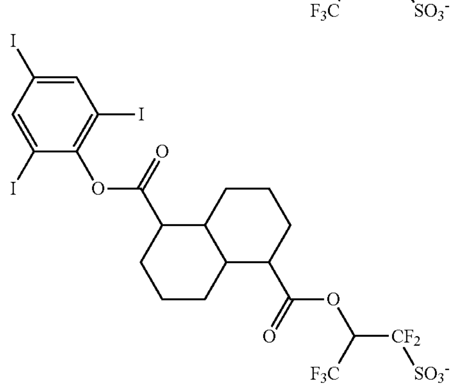
-continued
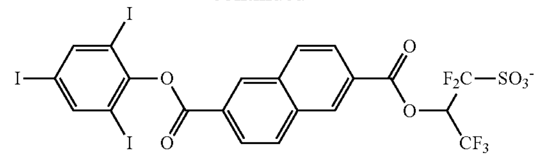
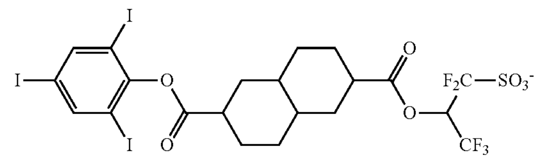
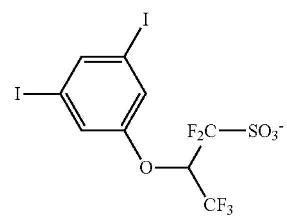
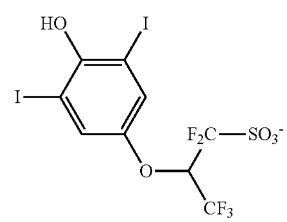
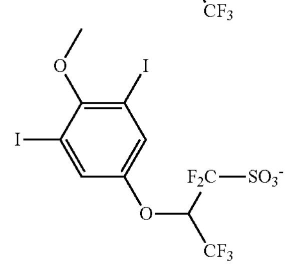
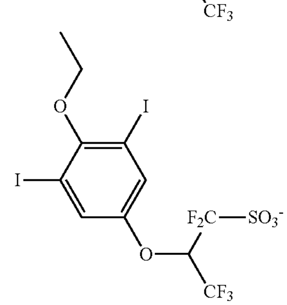
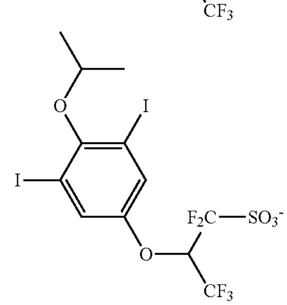

-continued
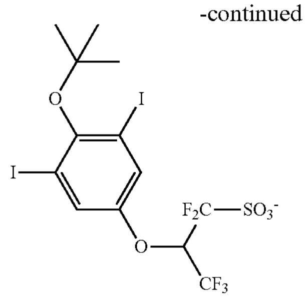
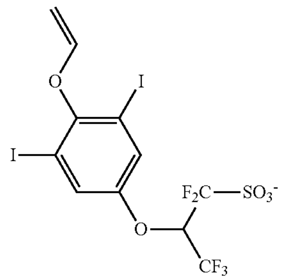
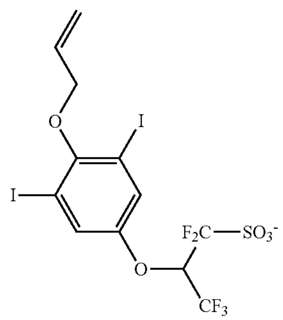
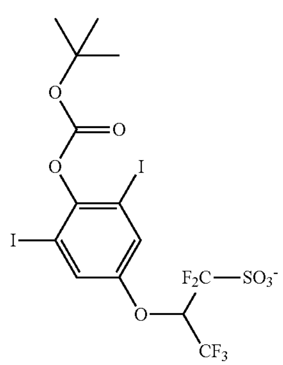
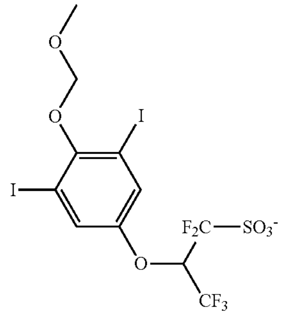
-continued
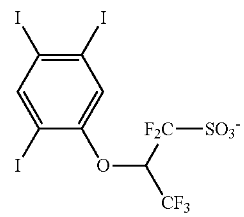
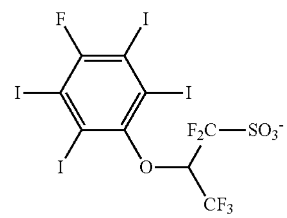
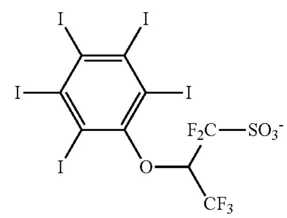
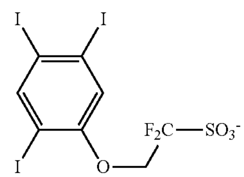
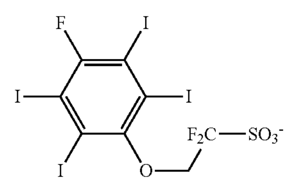
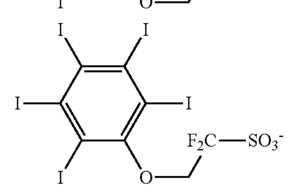
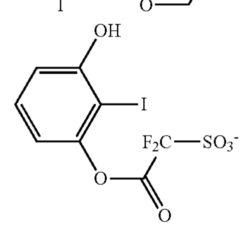
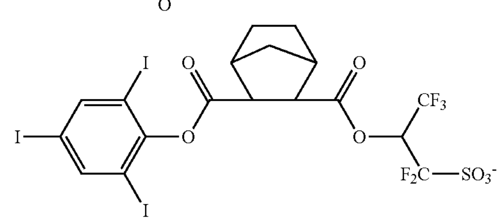

-continued
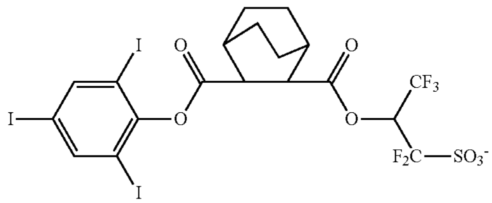
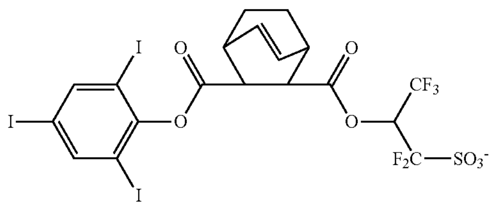
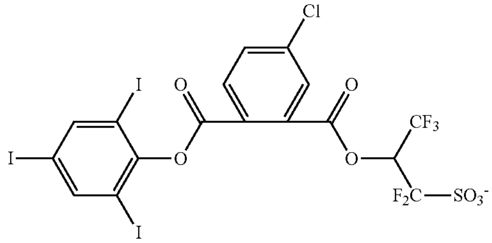
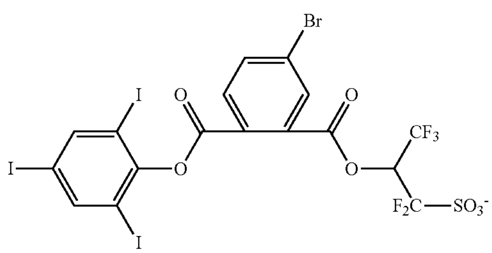
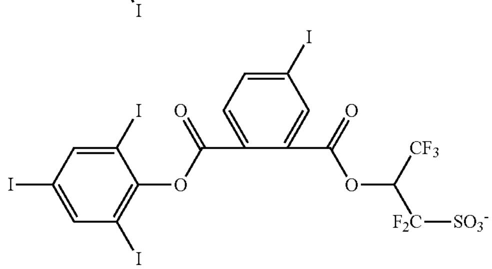
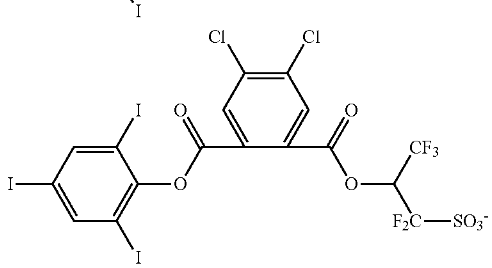
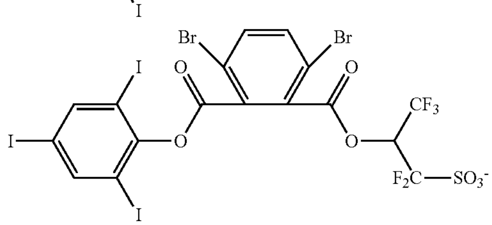
-continued
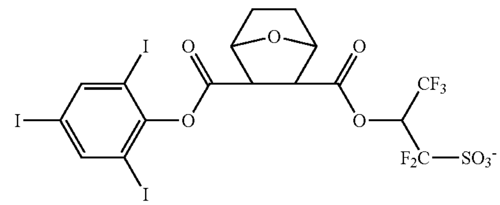
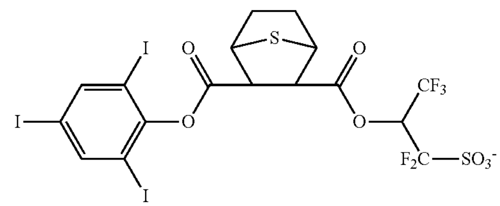
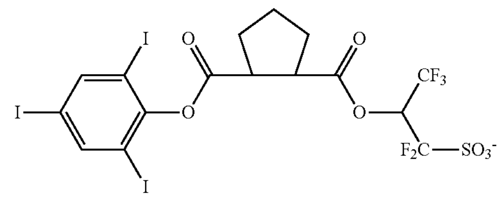
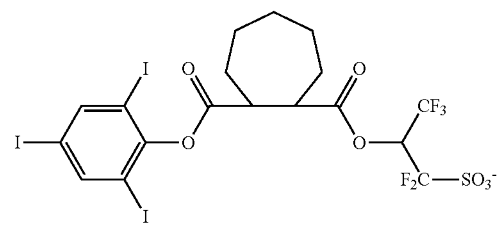
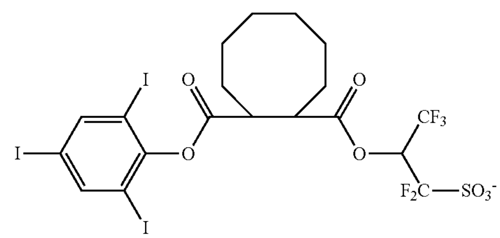
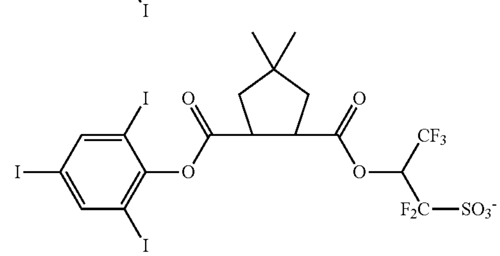
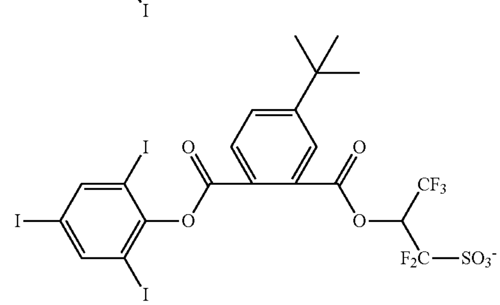

-continued
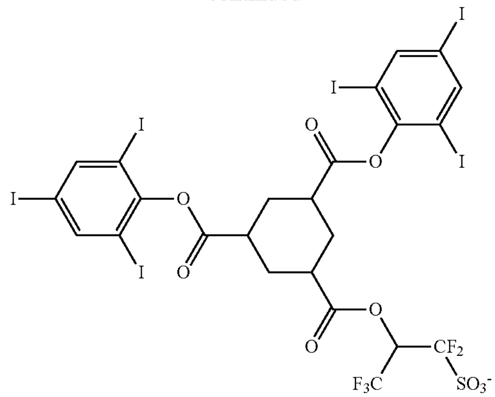
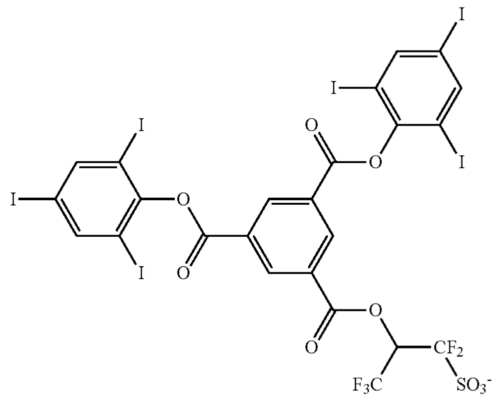
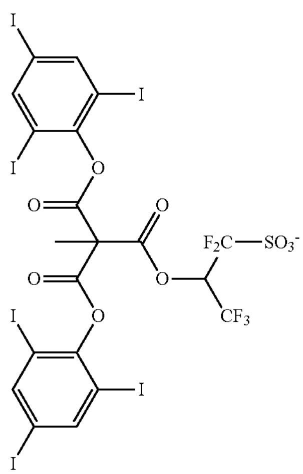
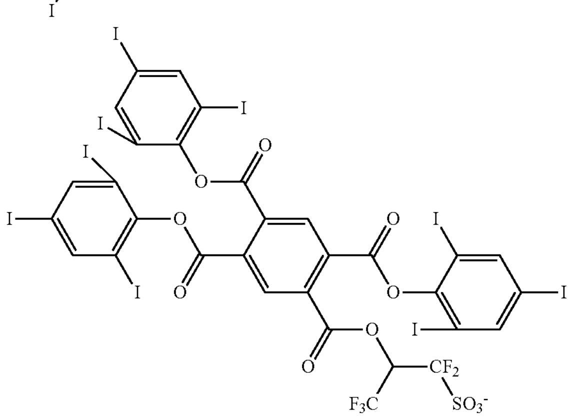
-continued
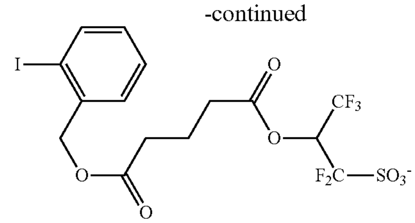
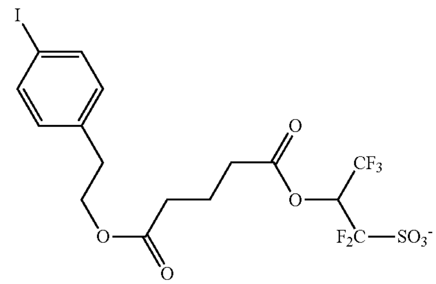
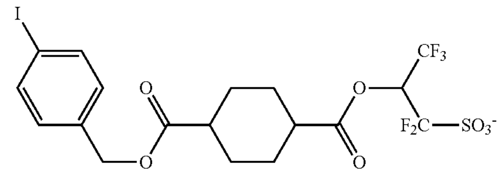
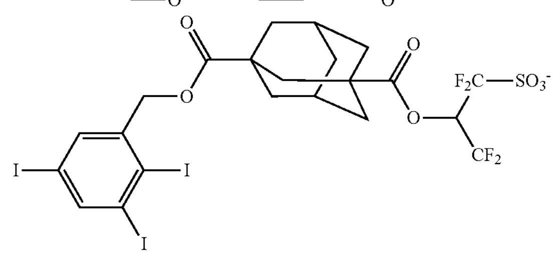
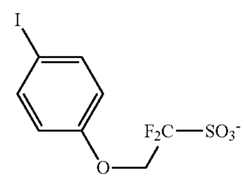
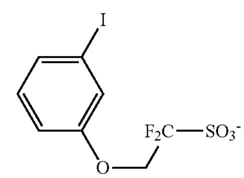
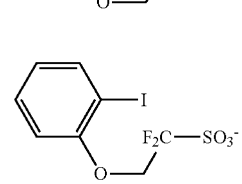
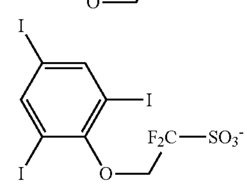
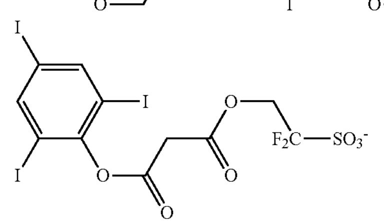
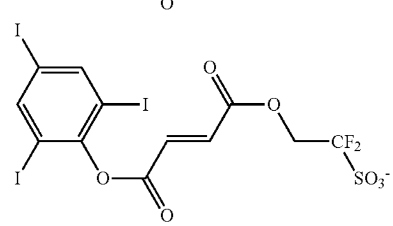

-continued
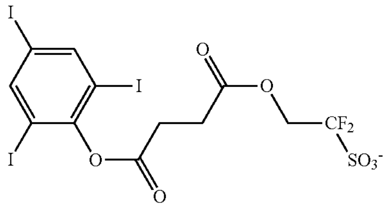
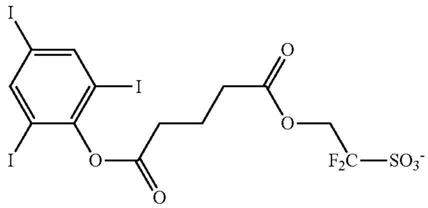
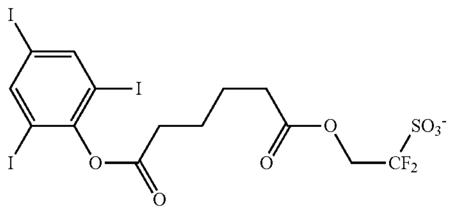
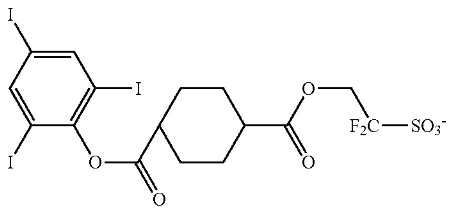
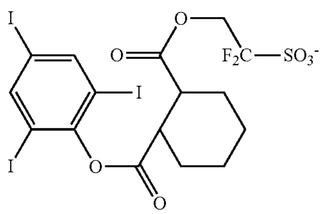
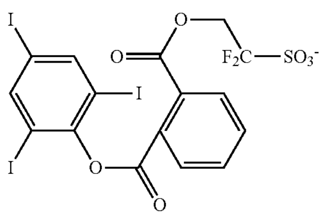
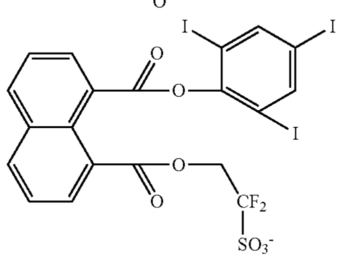
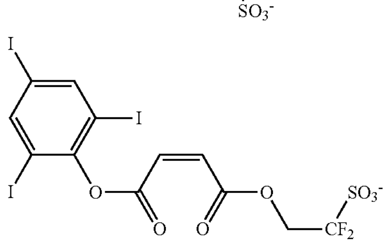
-continued
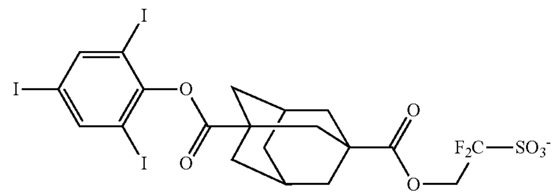
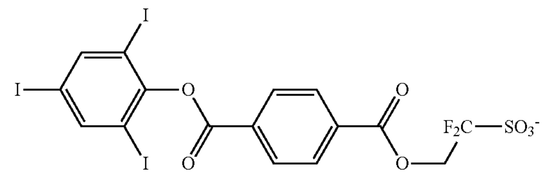
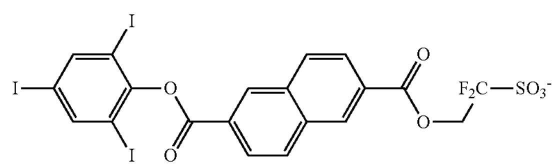
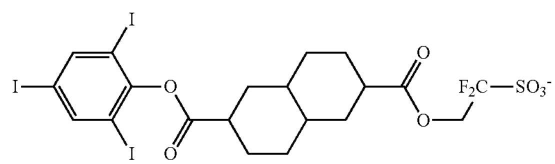
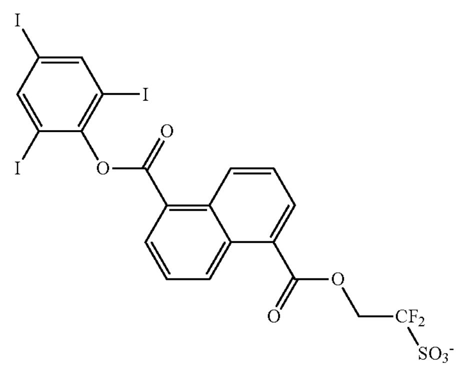
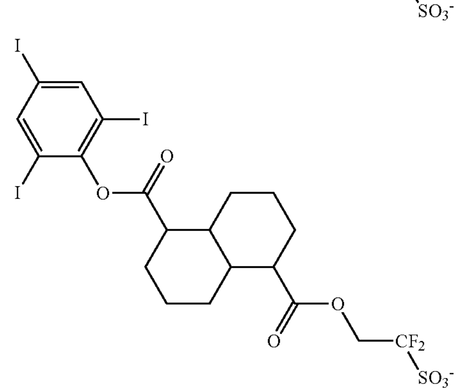

-continued
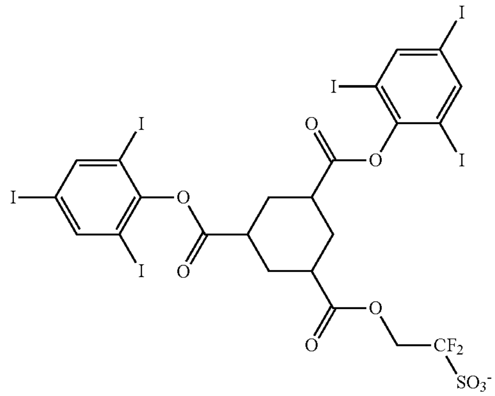
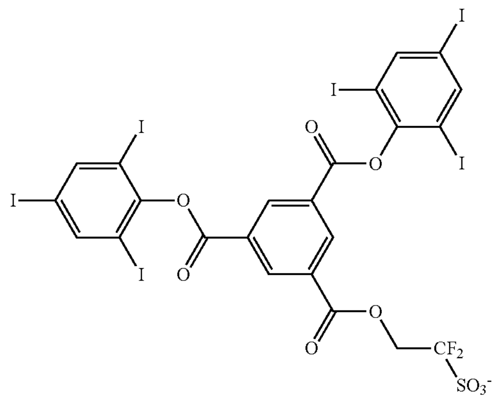
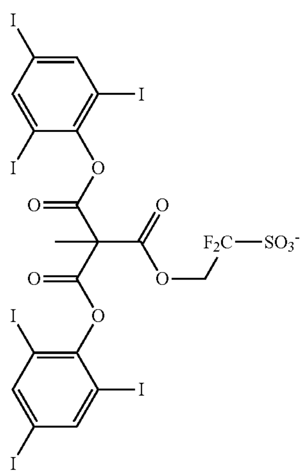
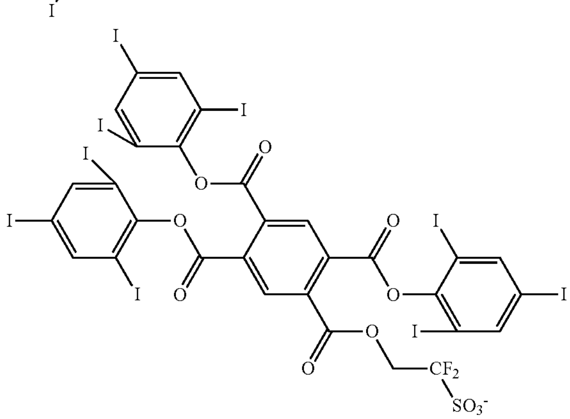
-continued
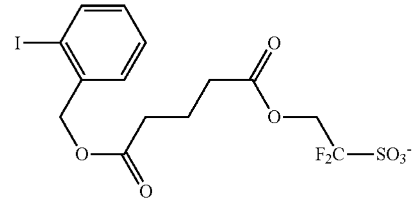
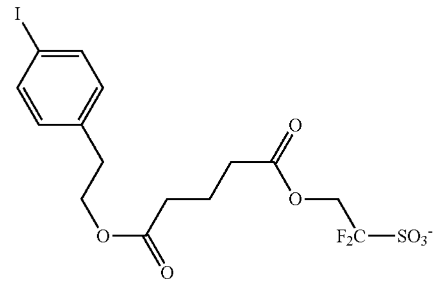
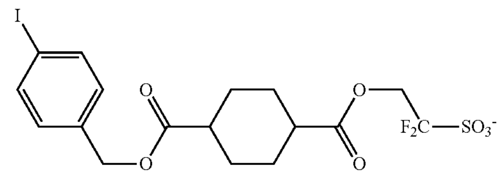
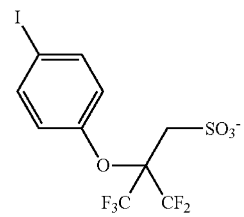
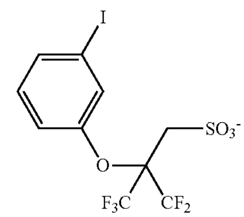
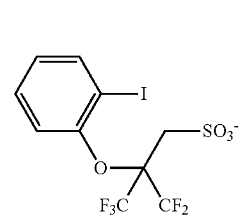
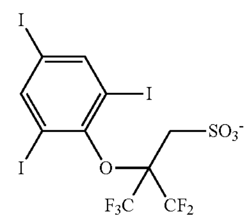
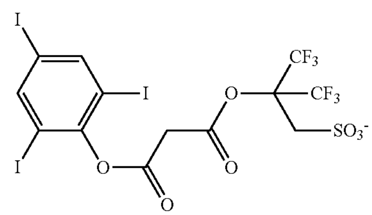
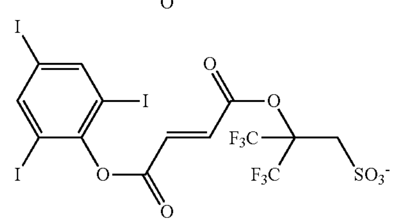
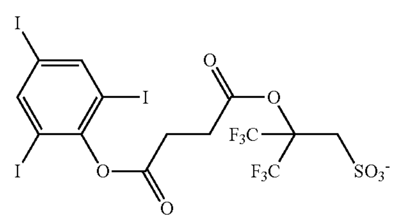

-continued
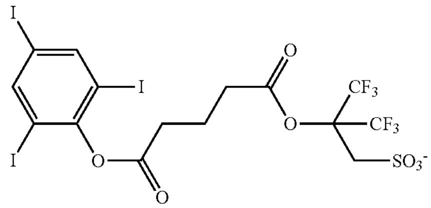
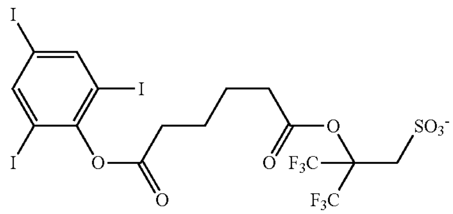
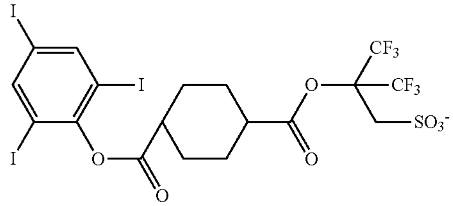
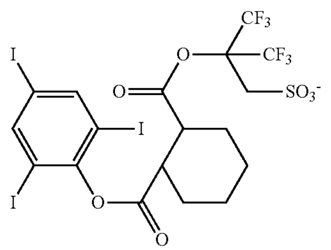
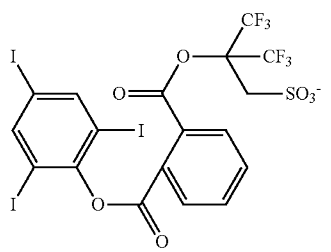
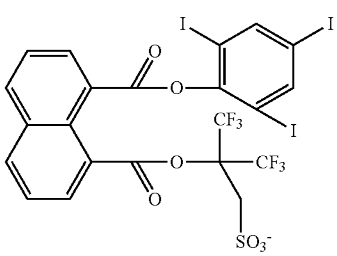
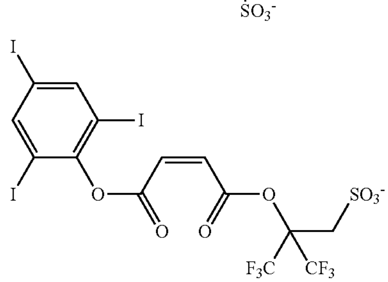
-continued
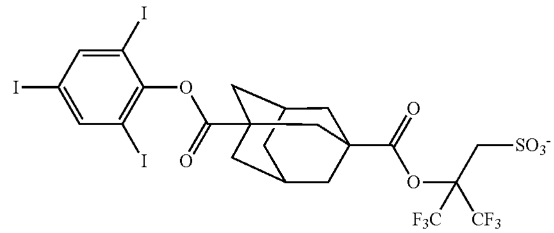
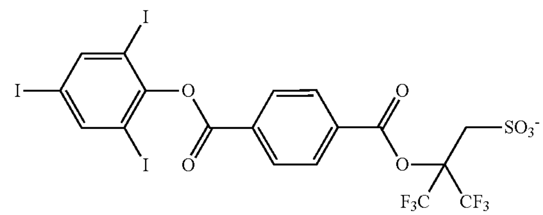
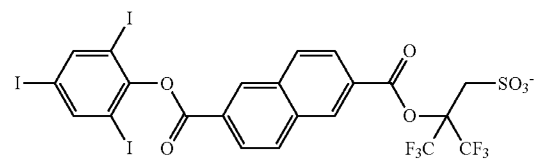
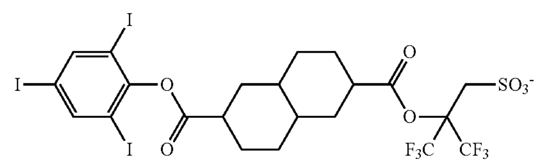
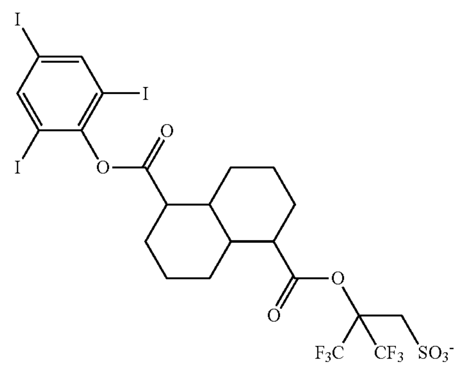
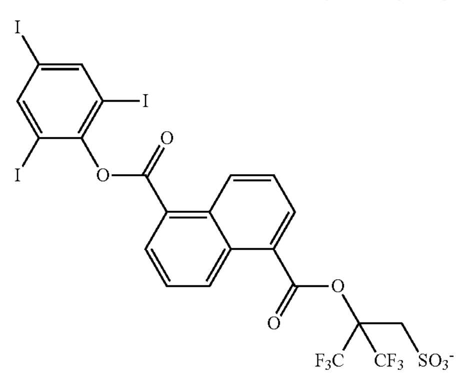

-continued

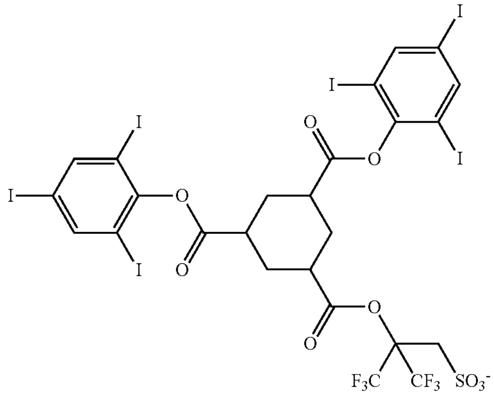

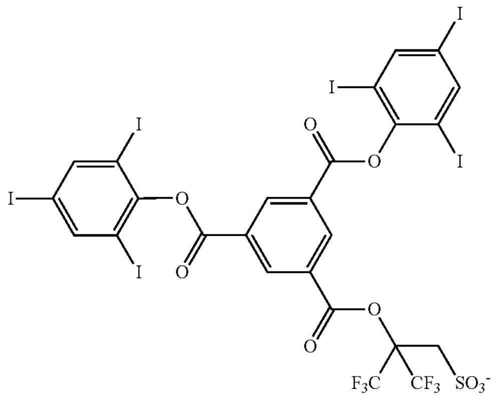

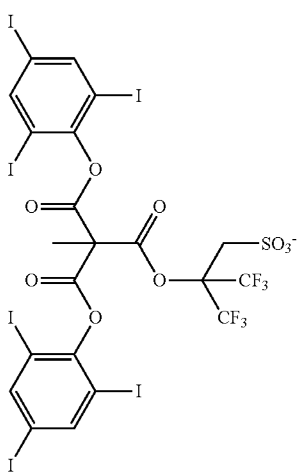

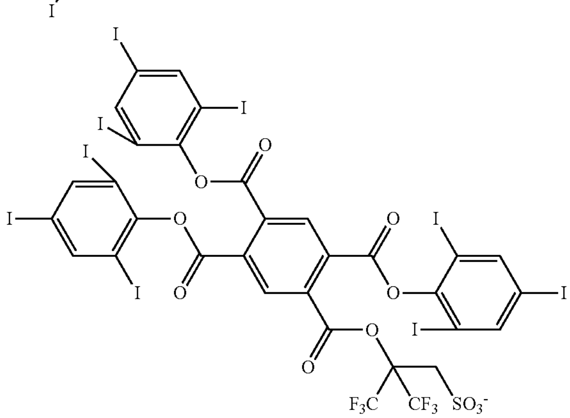

-continued

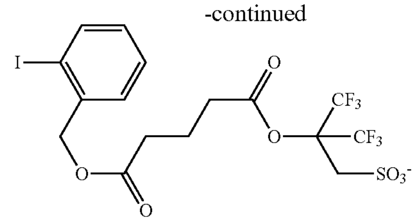

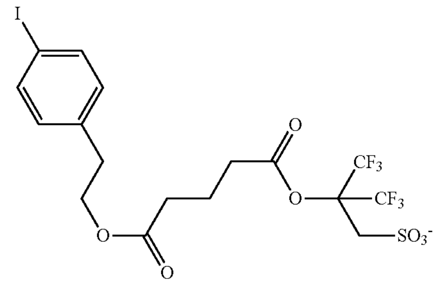

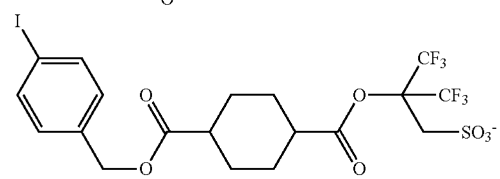

The sulfonium salt having formula (A-1) or the iodonium salt having formula (A-2) may be synthesized, for example, by ion exchange with a sulfonium salt or iodonium salt of weaker acid than the iodized benzene ring-containing fluorosulfonic acid. Typical of the weaker acid than the iodized benzene ring-containing fluorosulfonic acid are hydrochloric acid and carbonic acid. Alternatively, the sulfonium or iodonium salt may be synthesized by ion exchange of a sodium or ammonium salt of an iodized benzene ring-containing fluorosulfonic acid with a sulfonium or iodonium chloride.

In the resist composition, the iodized benzene ring-containing fluorosulfonic acid onium salt is preferably used in an amount of 0.01 to 1,000 parts, more preferably 0.05 to 500 parts by weight per 100 parts by weight of the base polymer, as viewed from sensitivity and acid diffusion suppressing effect. The iodized benzene ring-containing fluorosulfonic acid onium salt may be used alone or in admixture.

Base Polymer

The base polymer in the resist composition contains an iodized polymer, referred to as Polymer A, hereinafter. Polymer A preferably comprises recurring units having the formula (a1) or recurring units having the formula (a2). These units are simply referred to as recurring units (a1) and (a2).

(a1)

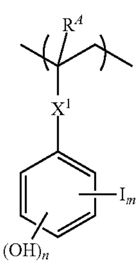

-continued (a2)

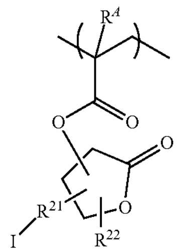

Herein $R^A$ is each independently hydrogen or methyl. $R^{21}$ is a single bond or methylene. $R^{22}$ is hydrogen or a $C_1$-$C_4$ alkyl group, the alkyl group being preferably straight or branched. $X^1$ is a single bond, ether bond, ester bond, amide bond, —C(═O)—O—$R^{23}$—, phenylene, -Ph-C(═O)—O—$R^{24}$—, or -Ph-$R^{25}$—O—C(═O)—$R^{26}$—, wherein Ph is phenylene, $R^{23}$ is a $C_1$-$C_{10}$ alkylene group which may be straight, branched or cyclic, and contain an ether bond or ester bond, $R^{24}$, $R^{25}$ and $R^{26}$ are each independently a single bond or a $C_1$-$C_6$ straight or branched alkylene group.

The subscript m is an integer of 1 to 5, n is an integer of 0 to 4, and 1≤m+n≤5. It is preferred that n be an integer of 1 to 3 and m be an integer of 1 to 3 because the inclusion of hydroxyl group ensures more efficient generation of secondary electrons, leading to a higher sensitivity.

Examples of the monomer from which recurring units (a1) are derived are shown below, but not limited thereto. Herein $R^A$ is as defined above.

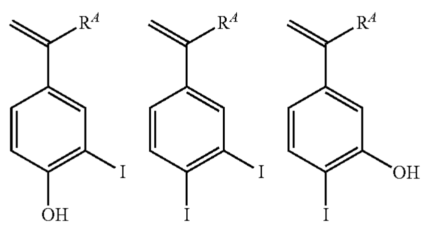

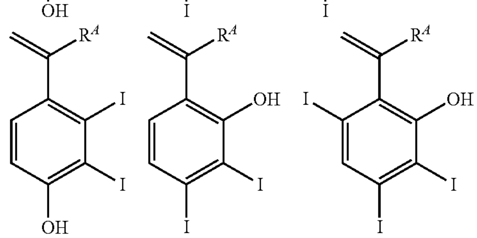

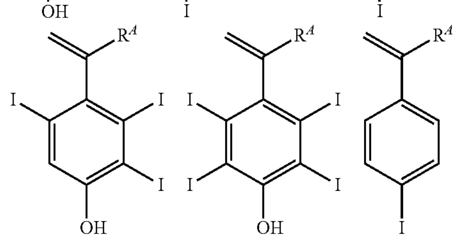

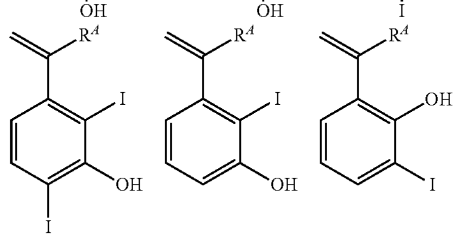

-continued

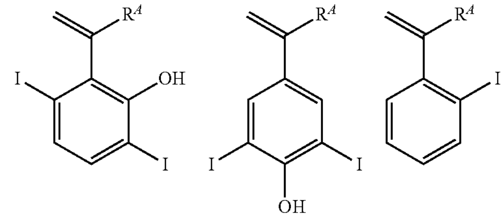

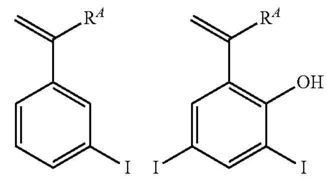

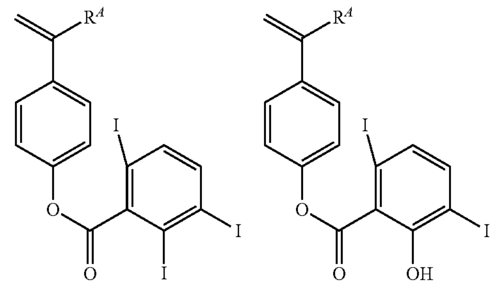

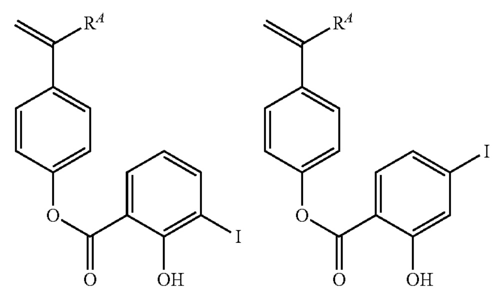

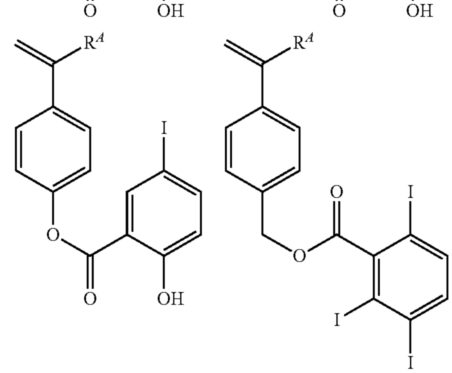

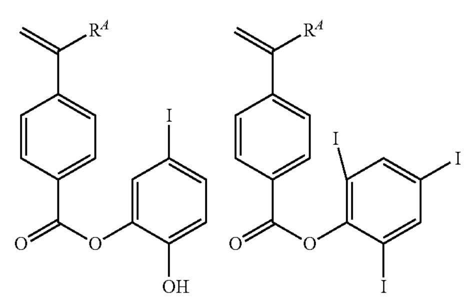

-continued
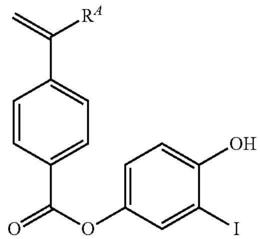
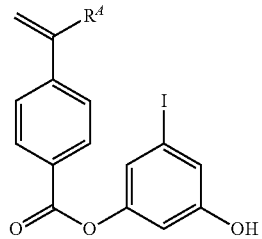
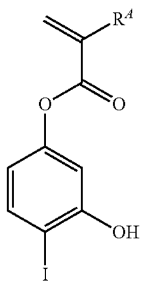
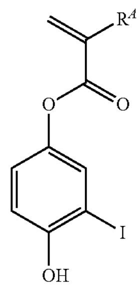
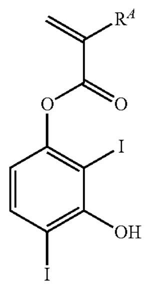
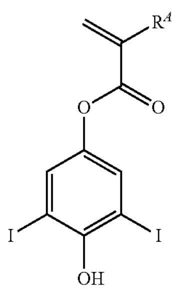
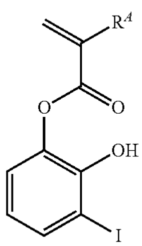
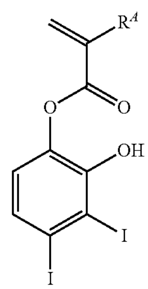
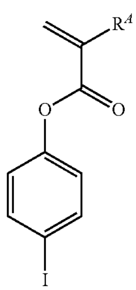
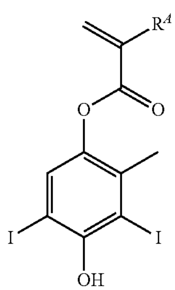
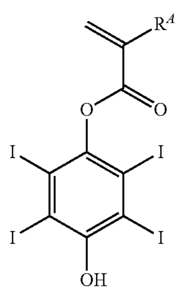
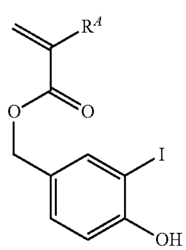
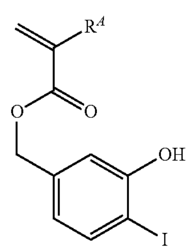
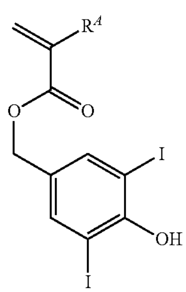
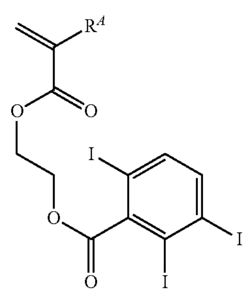
-continued
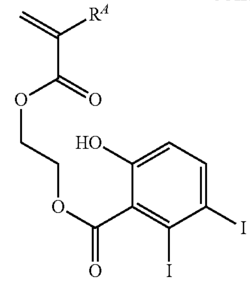
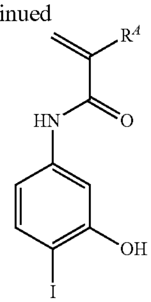
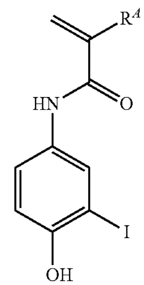
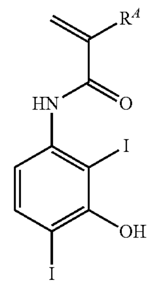
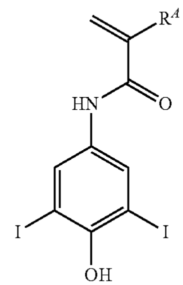
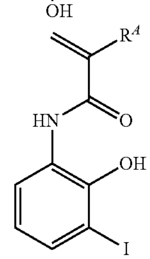
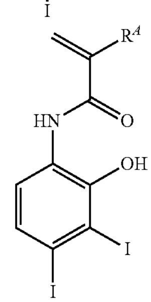
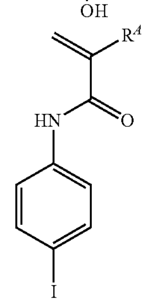
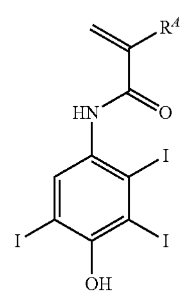
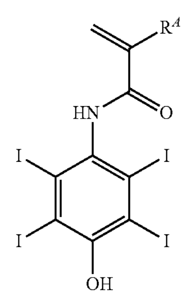
Examples of the monomer from which recurring units (a2) are derived are shown below, but not limited thereto. Herein $R^A$ is as defined above.
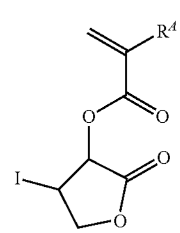
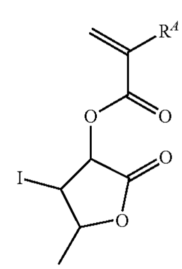

-continued

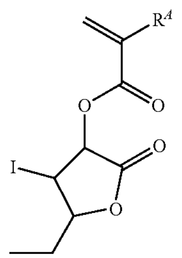

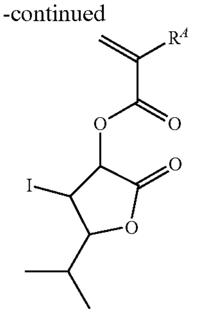

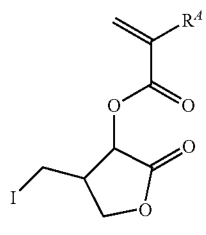

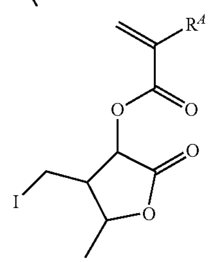

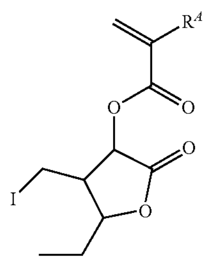

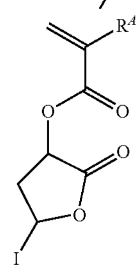

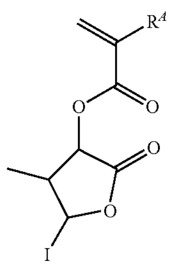

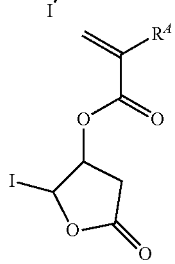

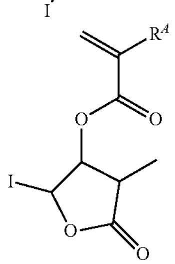

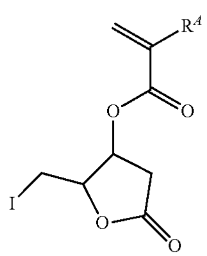

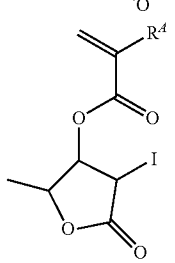

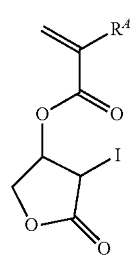

The recurring units (a1) or (a2) may be used alone or in admixture, and the recurring units (a1) and (a2) may be used in combination.

In one embodiment wherein the resist composition is of positive tone, preferably Polymer A further comprises recurring units having an acid labile group. The preferred recurring units having an acid labile group are recurring units having the formula (b1), which are referred to as recurring units (b1), or recurring units having the formula (b2), which are referred to as recurring units (b2), hereinafter. In another embodiment wherein the resist composition is of negative tone, preferably Polymer A is free of recurring units having an acid labile group.

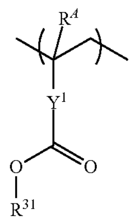

(b1)

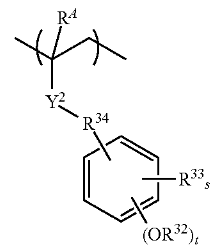

(b2)

Herein $R^A$ is each independently hydrogen or methyl. $Y^1$ is a single bond, phenylene group, naphthylene group, or a $C_1$-$C_{12}$ linking group containing an ester bond or lactone ring. $Y^2$ is a single bond or ester bond. $R^{31}$ and $R^{32}$ are each independently an acid labile group. $R^{33}$ is fluorine, trifluoromethyl, cyano, $C_1$-$C_6$ alkyl, $C_1$-$C_6$ alkoxy, $C_2$-$C_7$ acyl, $C_2$-$C_7$ acyloxy, or $C_2$-$C_7$ alkoxycarbonyl group. $R^{34}$ is a single bond or a $C_1$-$C_6$ alkylene group in which at least one carbon may be substituted by an ether or ester bond, t is 1 or 2, s is an integer of 0 to 4, and $1 \leq t+s \leq 5$. The alkyl, alkoxy, acyl, acyloxy and alkoxycarbonyl groups may be straight, branched or cyclic. The $C_1$-$C_6$ alkylene groups are preferably straight or branched.

Examples of the monomer from which recurring units (b1) are derived are shown below, but not limited thereto. Herein $R^A$ and $R^{31}$ are as defined above.

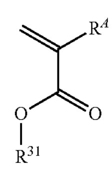

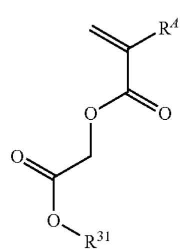

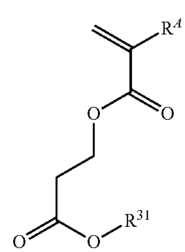

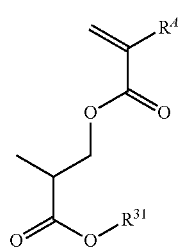

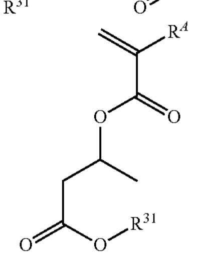

-continued

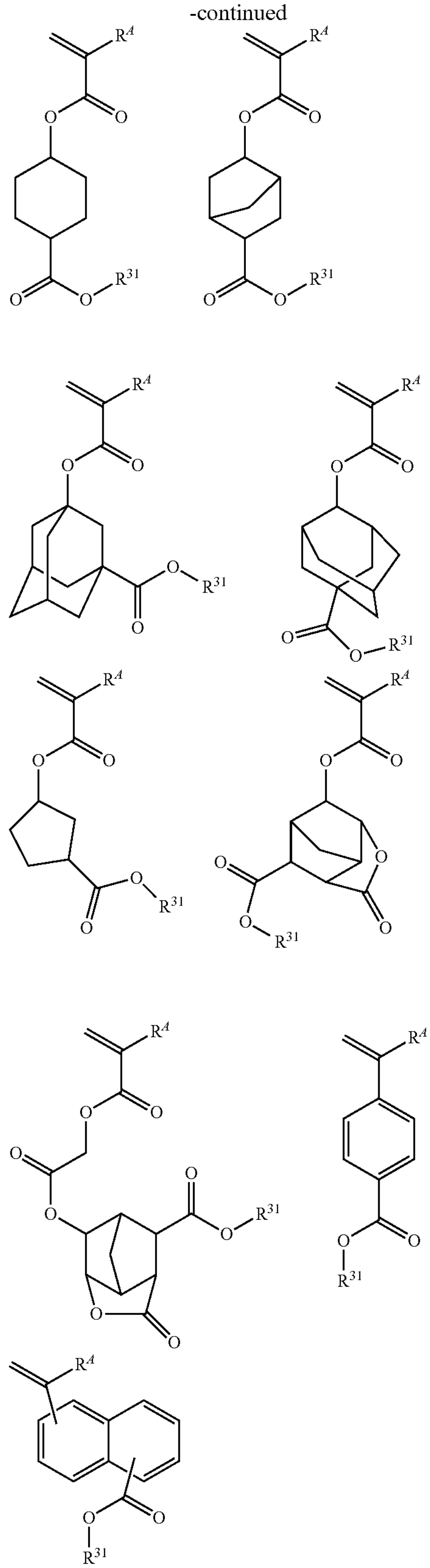

Examples of the monomer from which recurring units (b2) are derived are shown below, but not limited thereto. Herein $R^A$ and $R^{32}$ are as defined above.

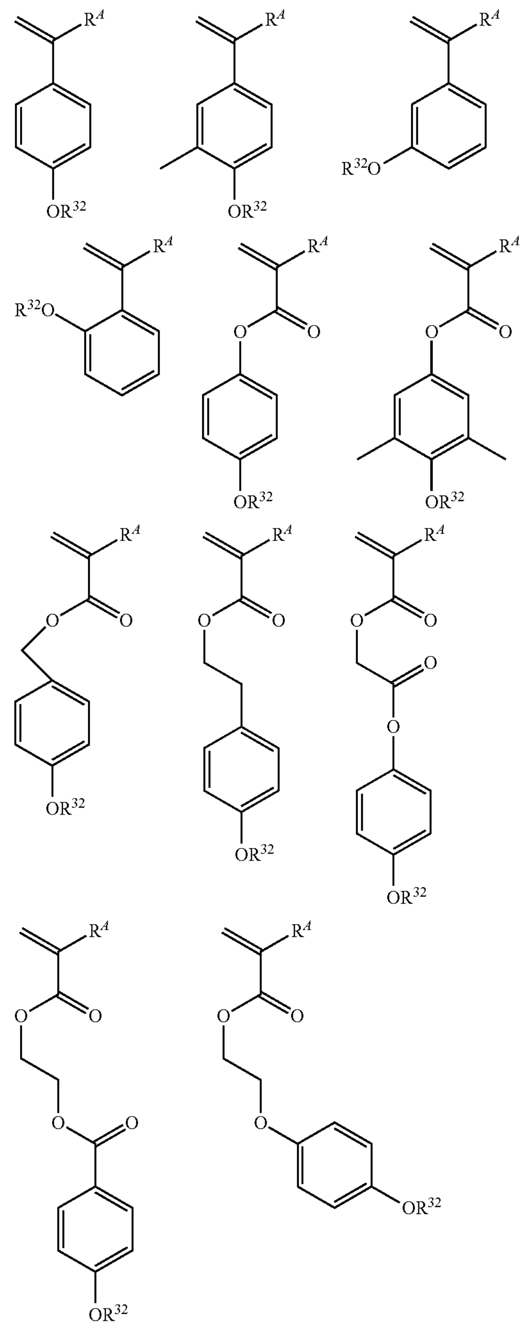

The acid labile groups represented by $R^{31}$ and $R^{32}$ in the recurring units (b1) and (b2) may be selected from a variety of such groups, for example, those groups described in JP-A 2013-080033 (U.S. Pat. No. 8,574,817) and JP-A 2013-083821 (U.S. Pat. No. 8,846,303).

Typical of the acid labile group are groups of the following formulae (AL-1) to (AL-3).

$$—(CH_2)_x—\overset{\displaystyle O}{\overset{\|}{C}}—O—R^{L1} \tag{AL-1}$$

-continued (AL-2)

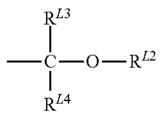

(AL-3)

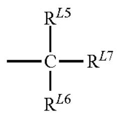

In formulae (AL-1) and (AL-2), $R^{L1}$ and $R^{L2}$ are each independently a monovalent hydrocarbon group which may contain a heteroatom such as oxygen, sulfur, nitrogen or fluorine. The monovalent hydrocarbon groups may be straight, branched or cyclic, with alkyl groups of 1 to 40 carbon atoms, especially 1 to 20 carbon atoms being preferred. In formula (AL-1), x is an integer of 0 to 10, especially 1 to 5.

In formula (AL-2), $R^{L3}$ and $R^{L4}$ are each independently hydrogen or a monovalent hydrocarbon group which may contain a heteroatom such as oxygen, sulfur, nitrogen or fluorine. The monovalent hydrocarbon groups may be straight, branched or cyclic, with $C_1$-$C_{20}$ alkyl groups being preferred. Any two of $R^{L2}$, $R^{L3}$ and $R^{L4}$ may bond together to form a ring with the carbon atom or carbon and oxygen atoms to which they are attached. The ring contains 3 to 20 carbon atoms, preferably 4 to 16 carbon atoms, and is typically alicyclic.

In formula (AL-3), $R^{L5}$ $L_{R6}$ and $R^{L7}$ are each independently a monovalent hydrocarbon group which may contain a heteroatom such as oxygen, sulfur, nitrogen or fluorine. The monovalent hydrocarbon groups may be straight, branched or cyclic, with $C_1$-$C_{20}$ alkyl groups being preferred. Any two of $R^{L5}$ $L^{R6}$ and $L^{L7}$ may bond together to form a ring with the carbon atom to which they are attached. The ring contains 3 to 20 carbon atoms, preferably 4 to 16 carbon atoms and is typically alicyclic.

Polymer A may further comprise recurring units (c) having a phenolic hydroxyl group as an adhesive group. The recurring units (c) may be used alone or in admixture.

Examples of the monomers from which recurring units (c) are derived are given below, but not limited thereto. Herein $R^A$ is as defined above.

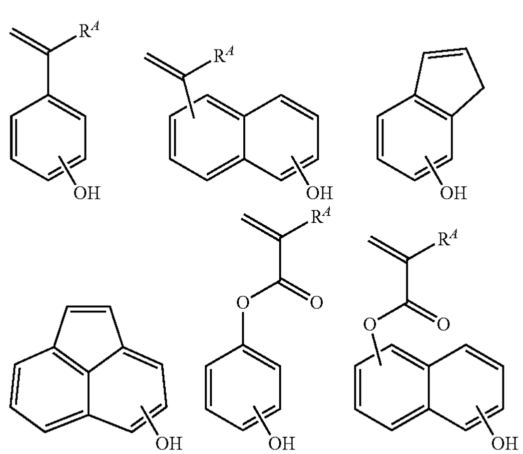

-continued

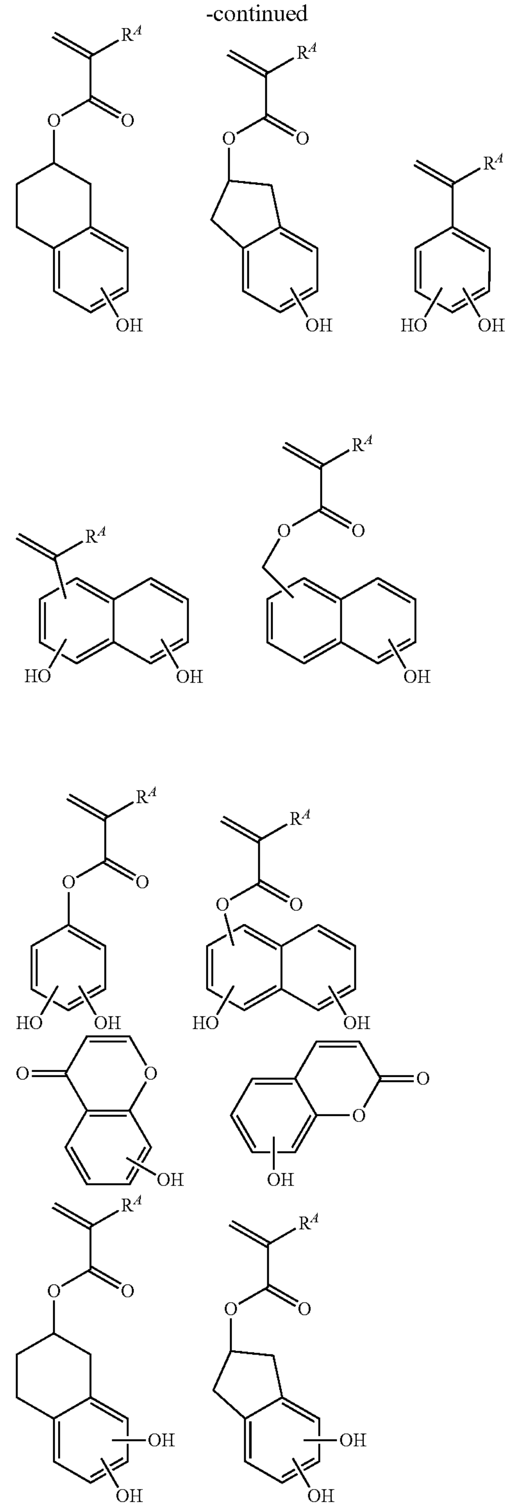

Polymer A may further comprise recurring units (d) having another adhesive group selected from hydroxyl (other than the phenolic hydroxyl), carboxyl, lactone ring, ether bond, ester bond, carbonyl and cyano groups. The recurring units (d) may be used alone or in admixture.

Examples of the monomes from which recurring units (d) are derived are given below, but not limited thereto. Herein $R^A$ is as defined above.

-continued
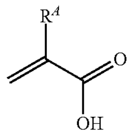
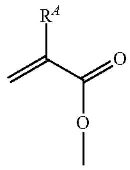
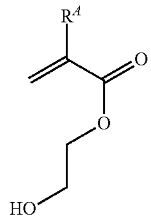
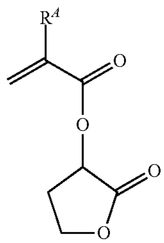
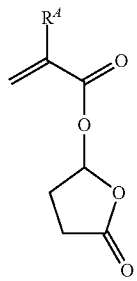
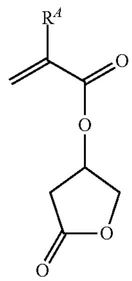
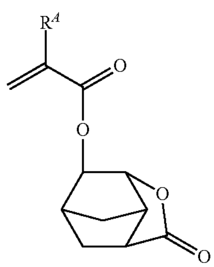
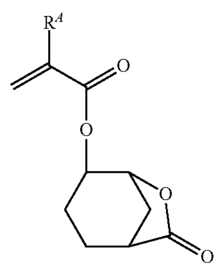
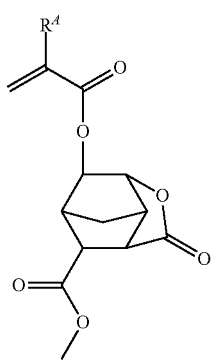
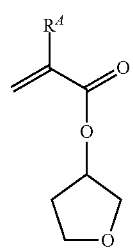
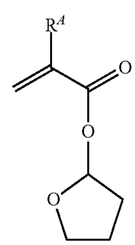
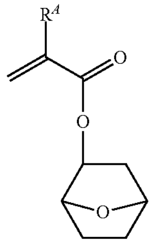
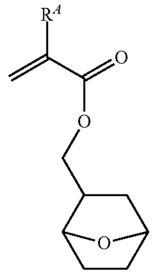
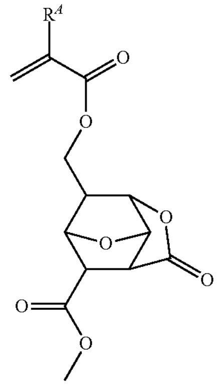
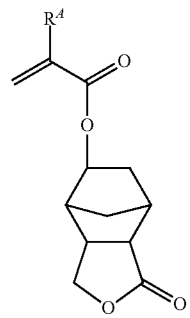
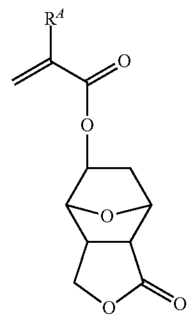
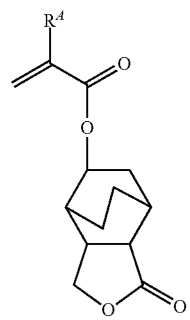
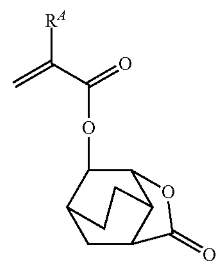
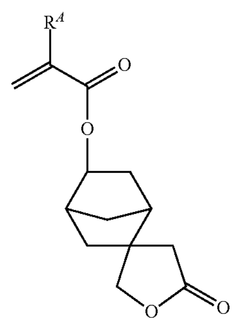
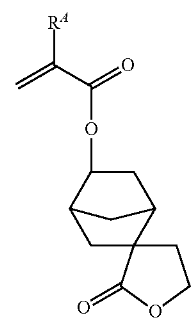
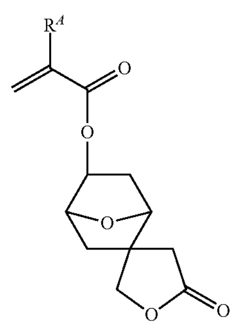
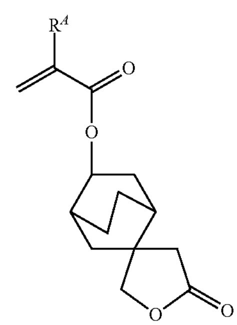
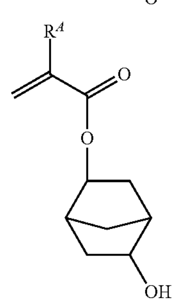
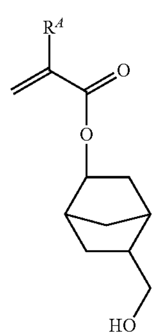
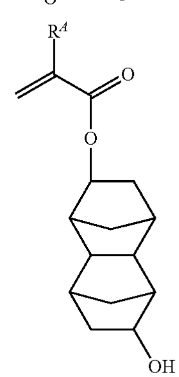

-continued
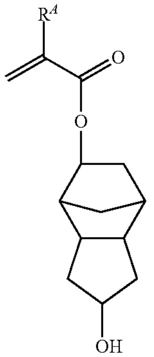
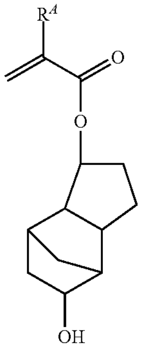
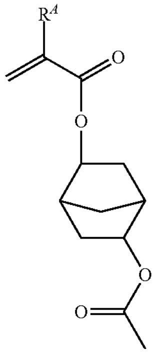
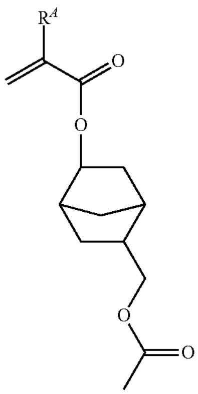
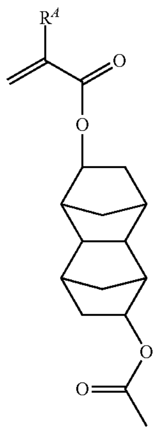
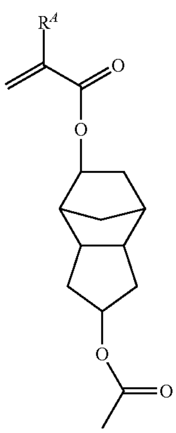
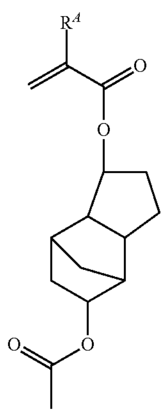
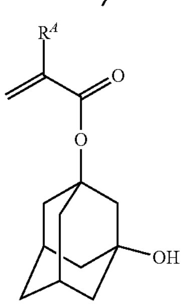
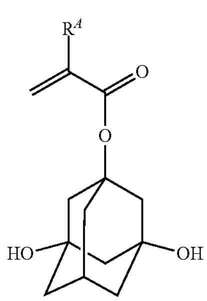
-continued
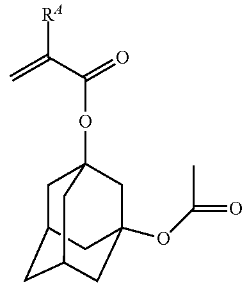
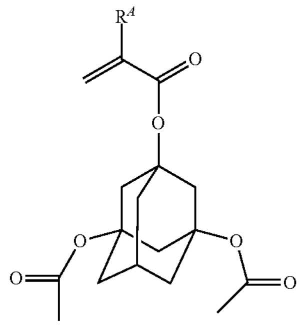
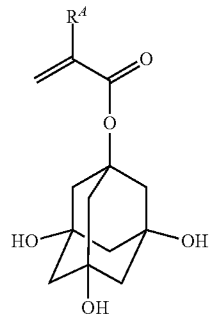
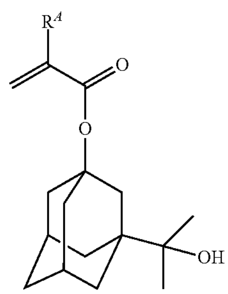
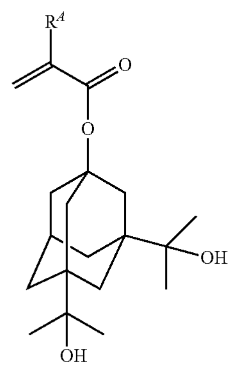
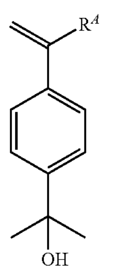
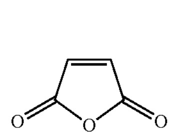
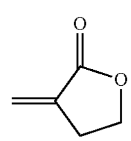
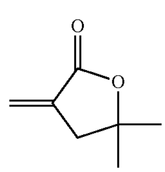
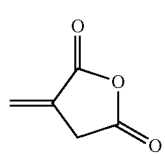
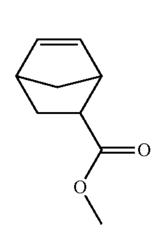
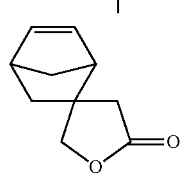
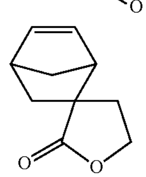
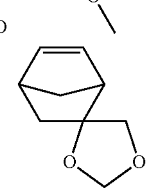

-continued
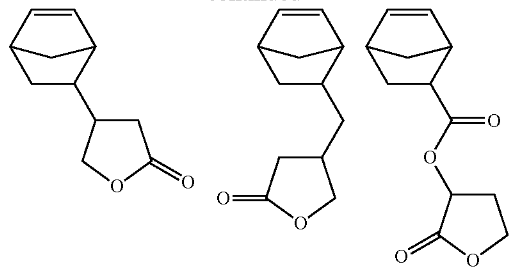
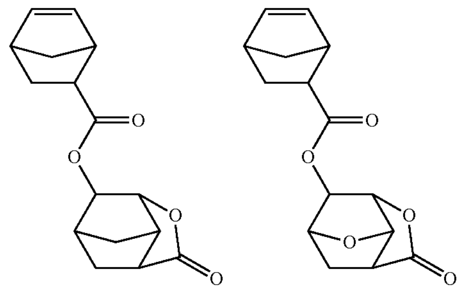
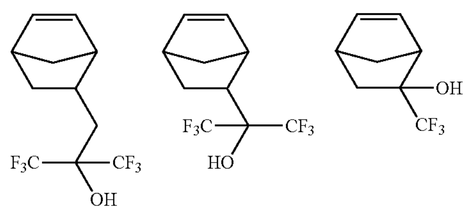
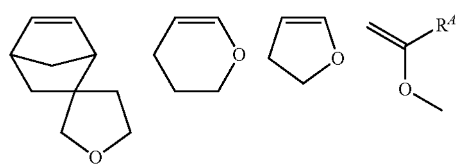
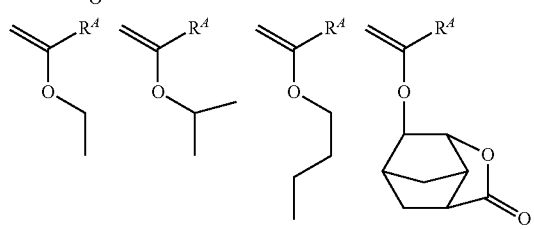
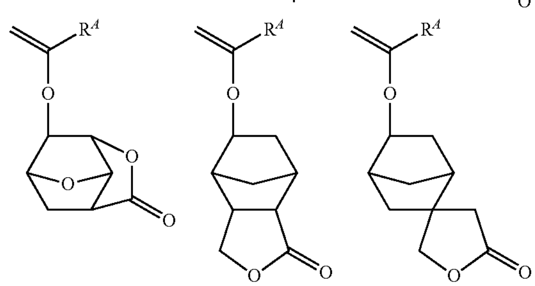
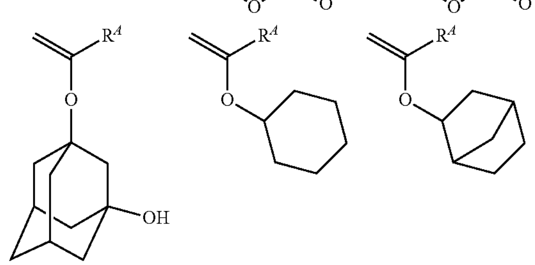
-continued
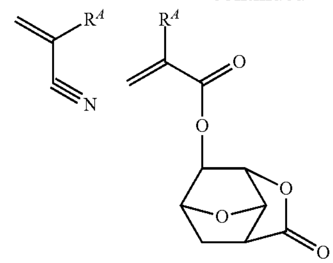
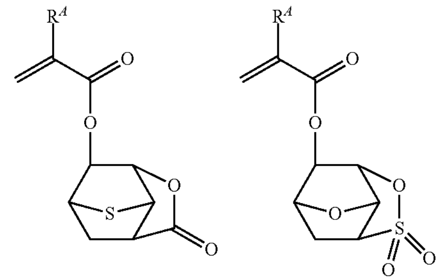
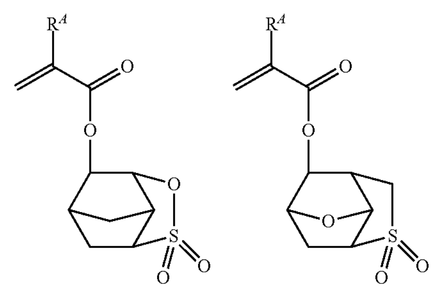
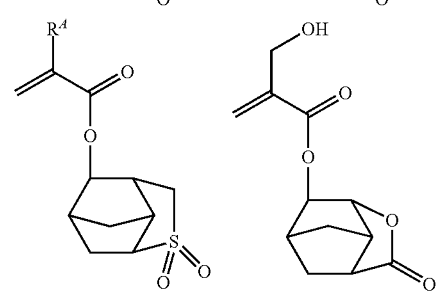
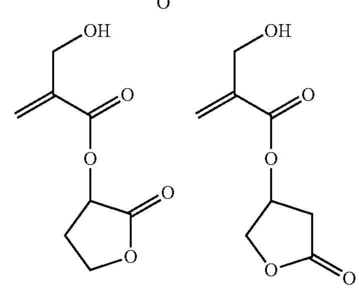
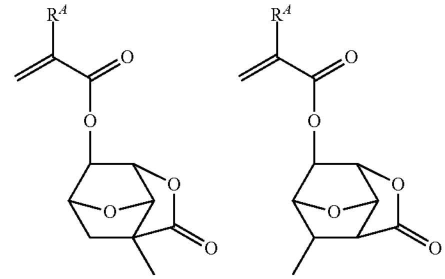

-continued
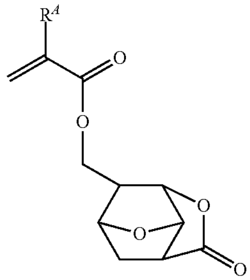
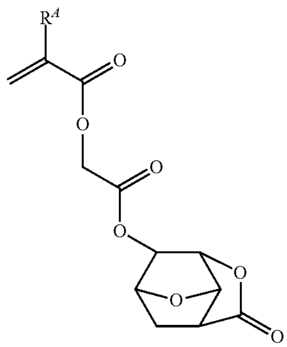
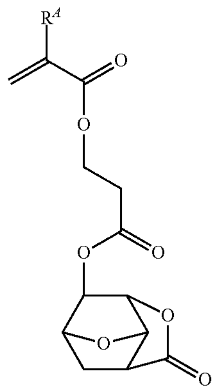
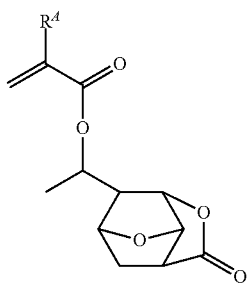
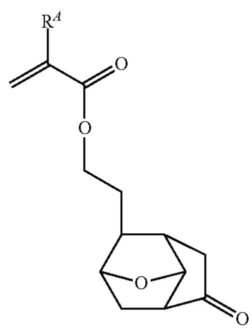
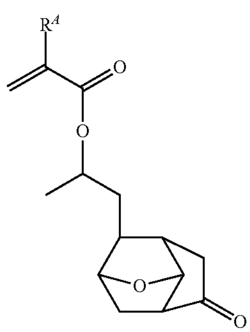
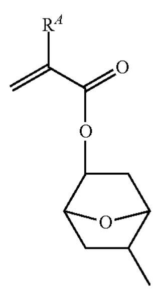
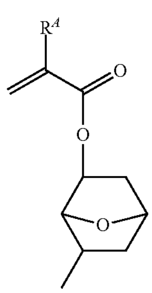
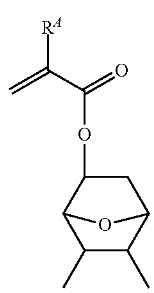
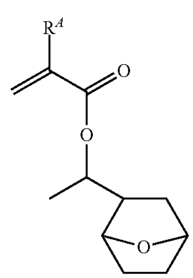
-continued
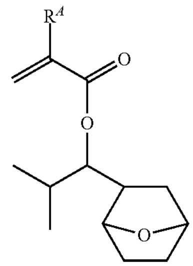
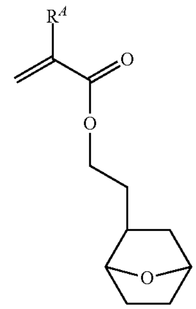
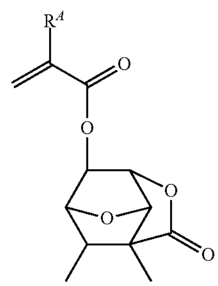
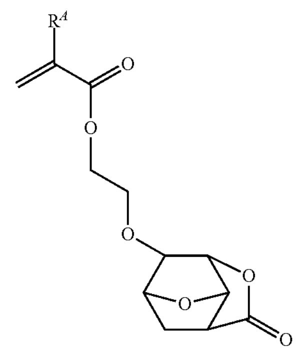
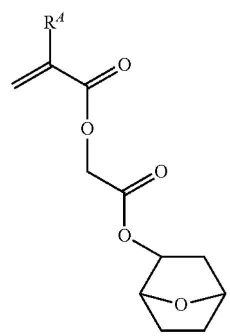
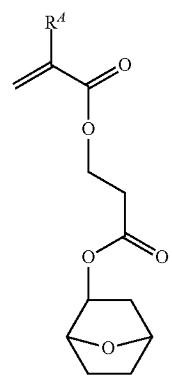
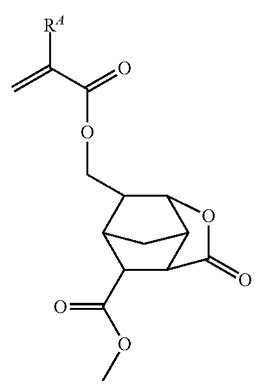

-continued
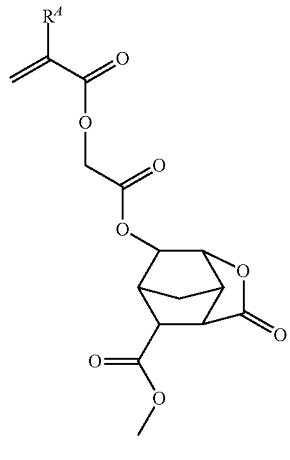
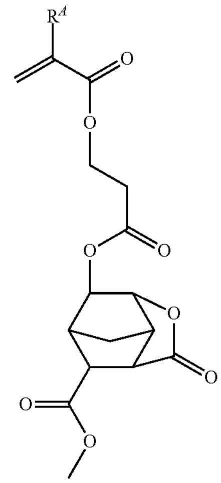
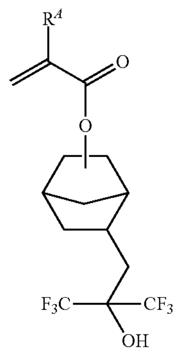
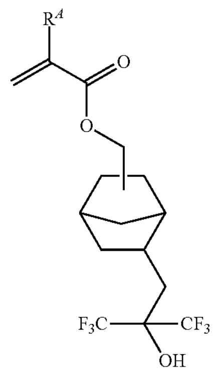
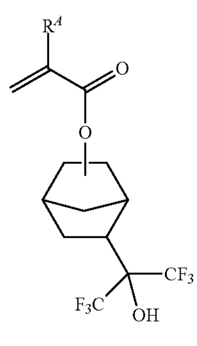
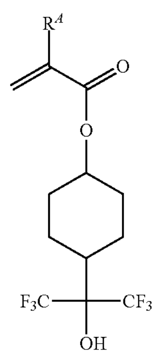
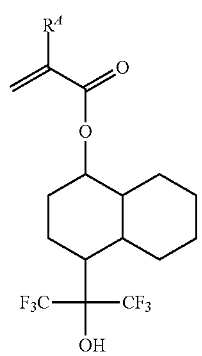
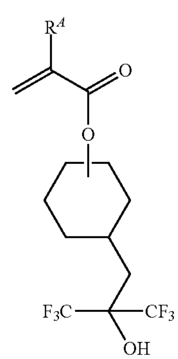
-continued
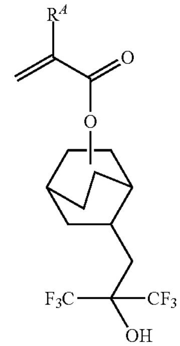
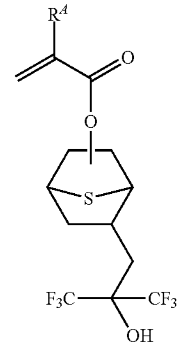
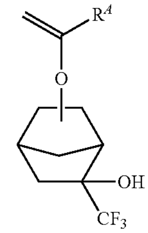
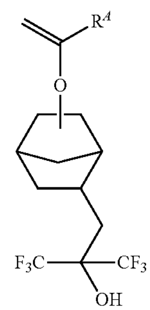
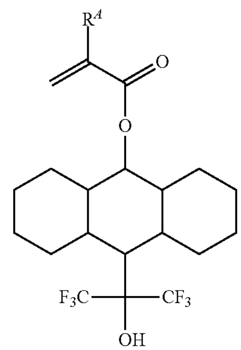
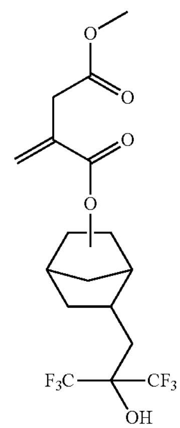
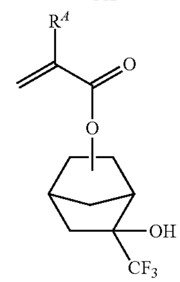
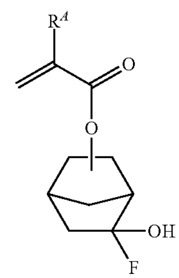
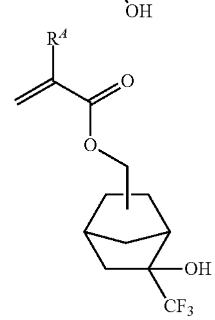
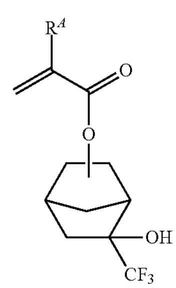
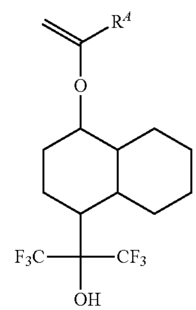
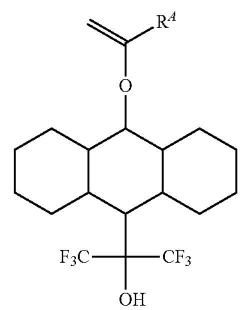

-continued
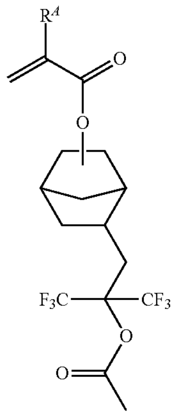
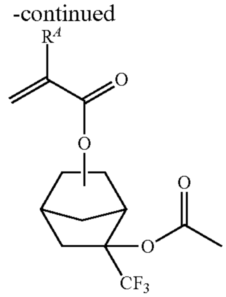
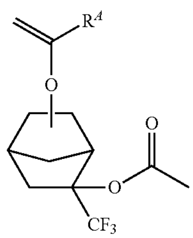
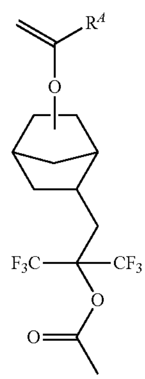
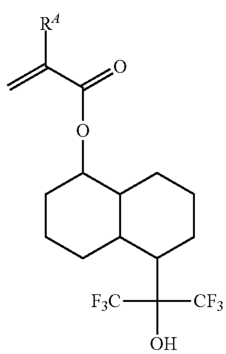
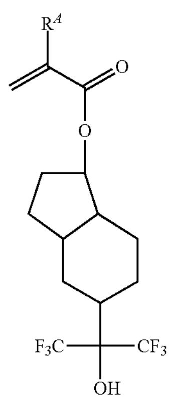
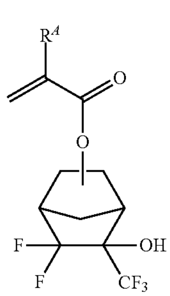
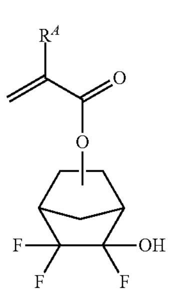
-continued
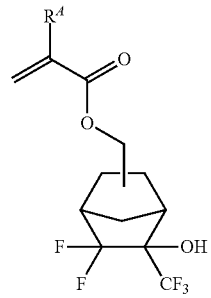
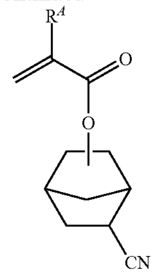
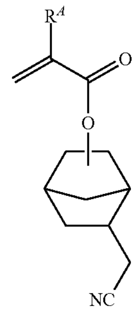
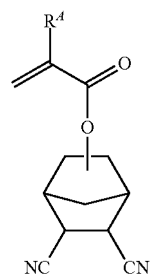
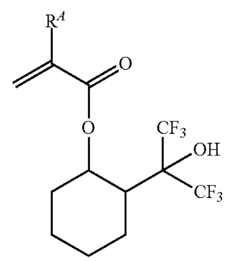
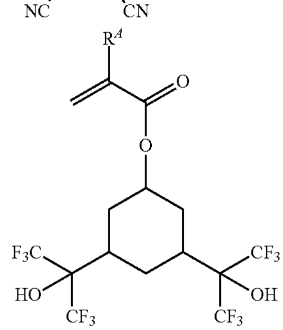
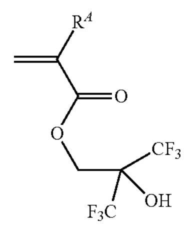
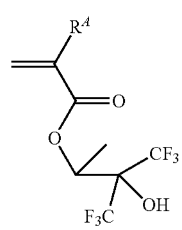
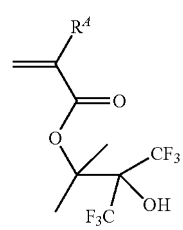
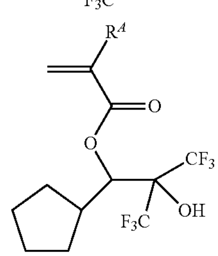
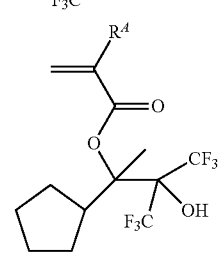
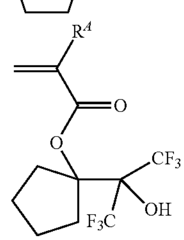
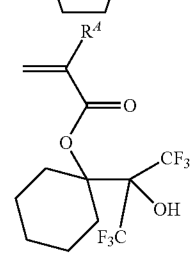

-continued
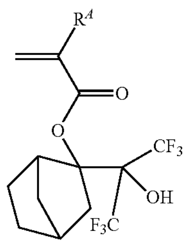
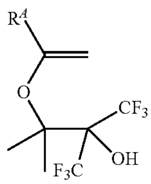
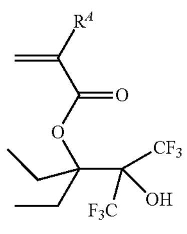
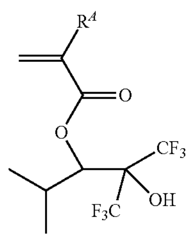
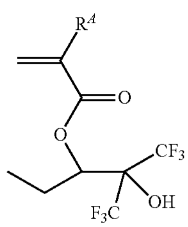
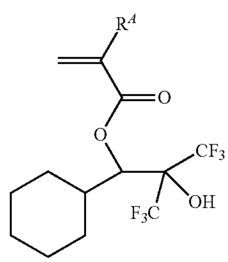
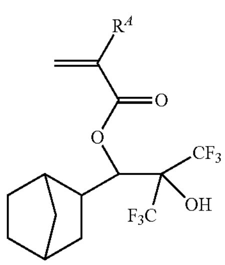
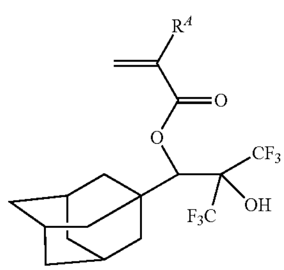
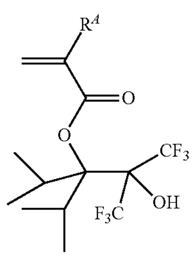
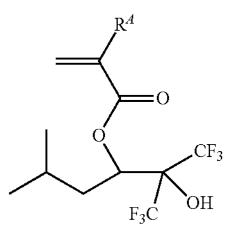
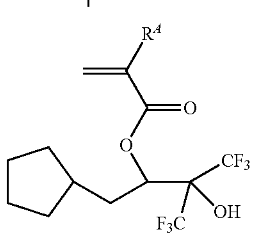
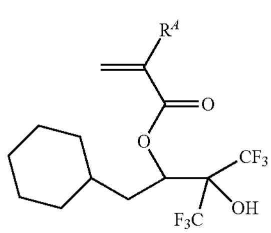
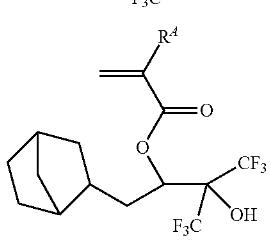
-continued
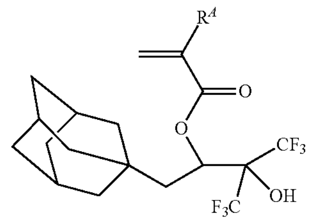
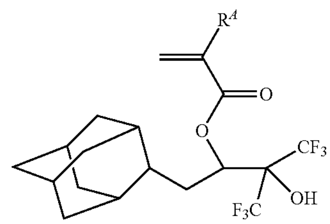
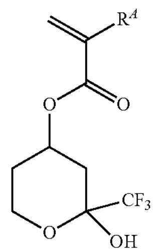
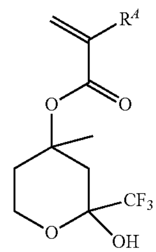
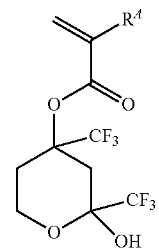
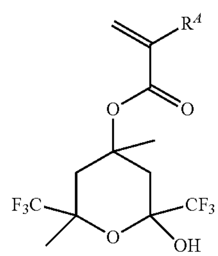
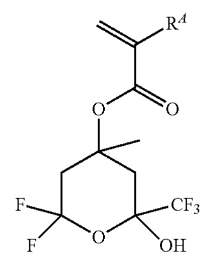
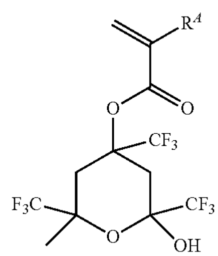
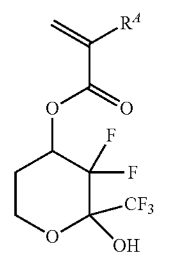
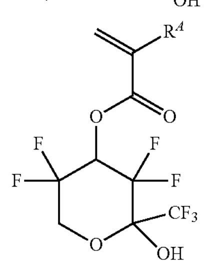
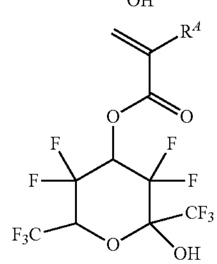
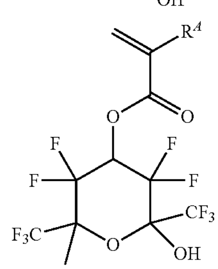
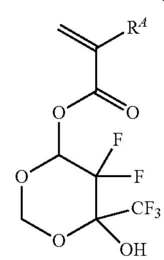

-continued
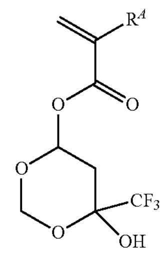
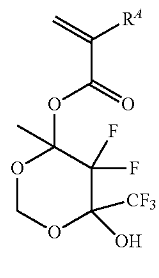
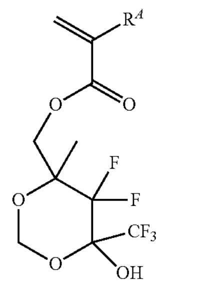
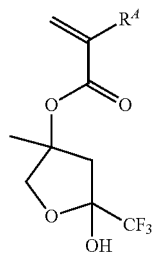
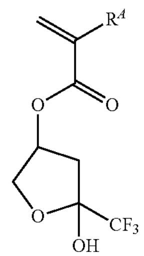
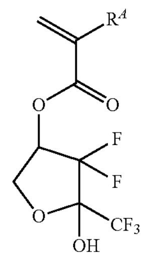
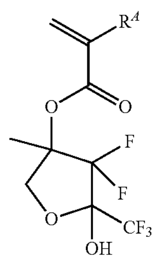
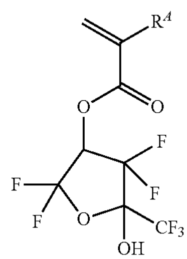
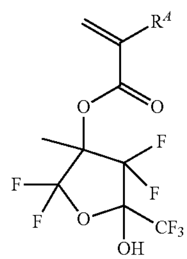
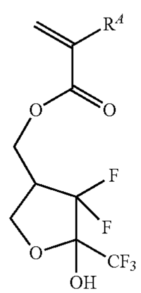
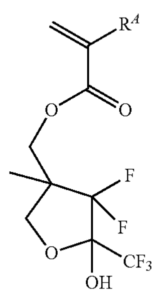
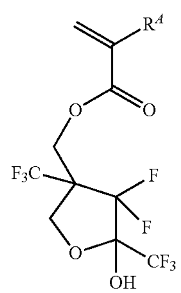
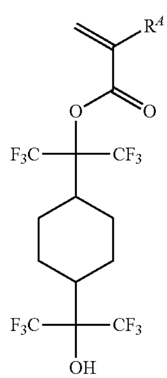
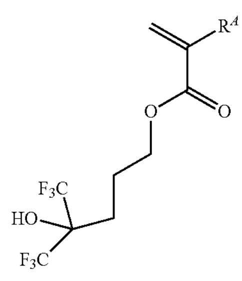
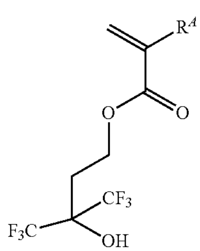
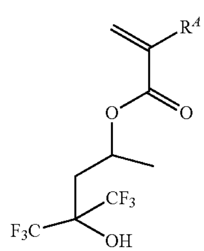
-continued
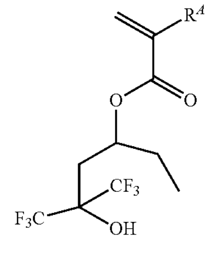
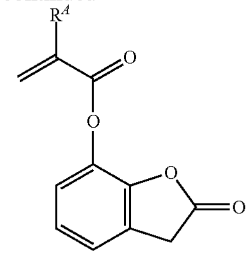
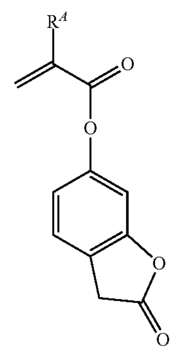
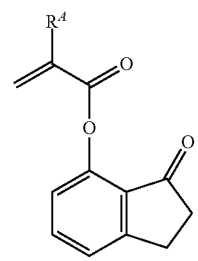
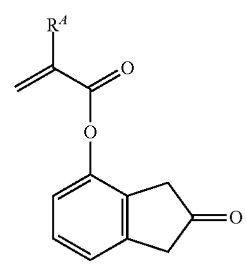
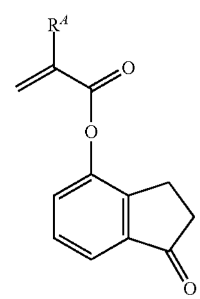
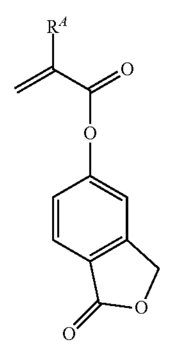
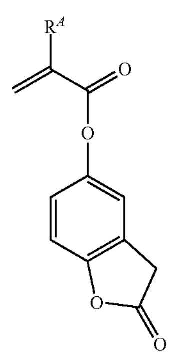
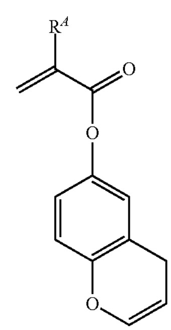
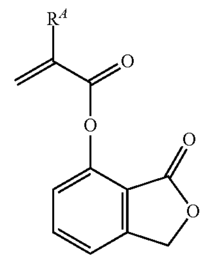
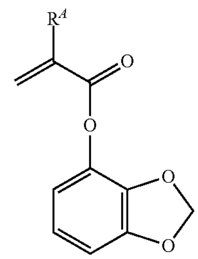

-continued
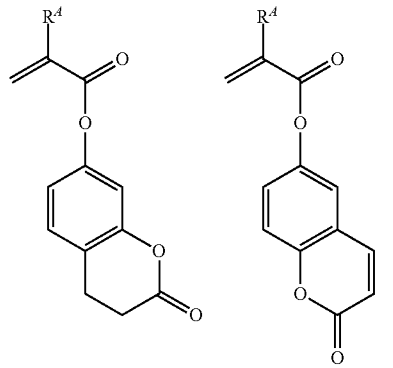
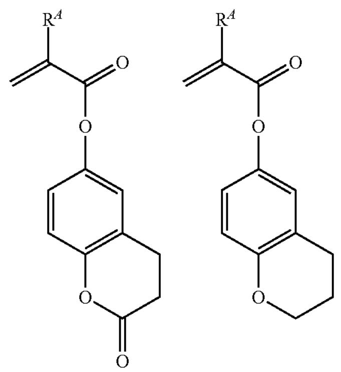
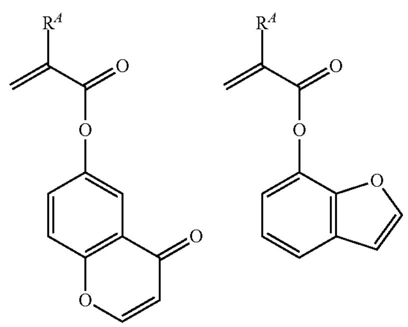
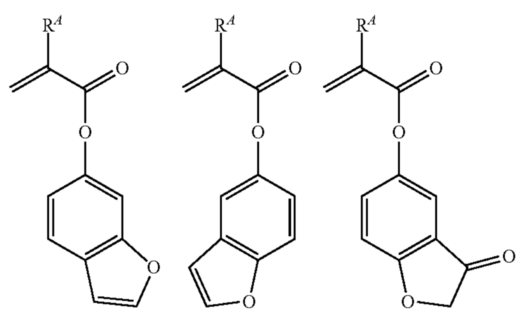
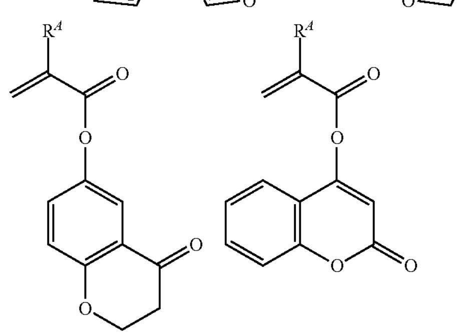
-continued
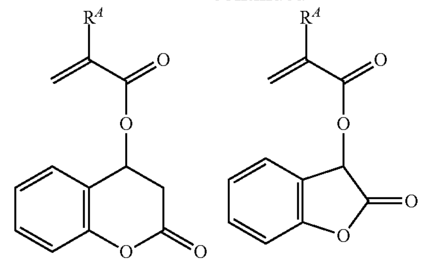
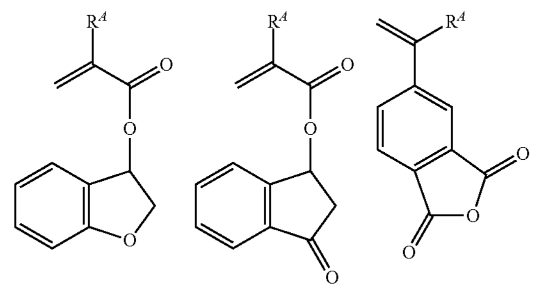
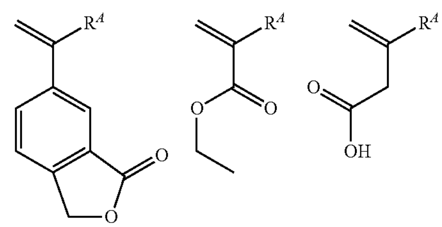
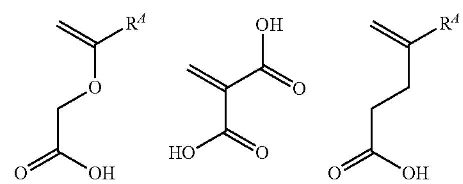
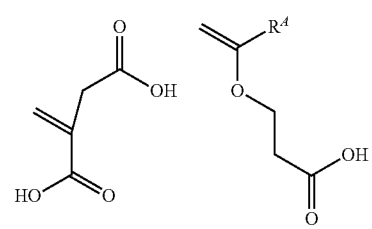
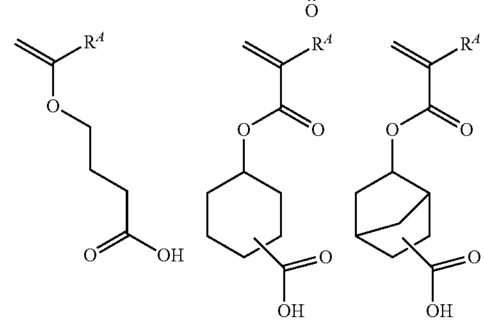

-continued

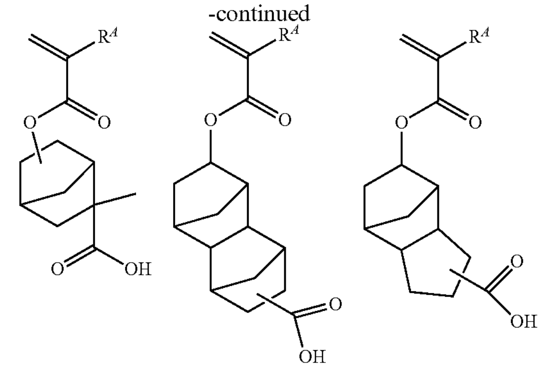

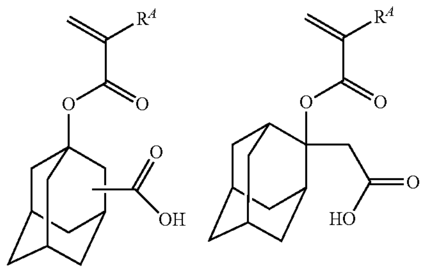

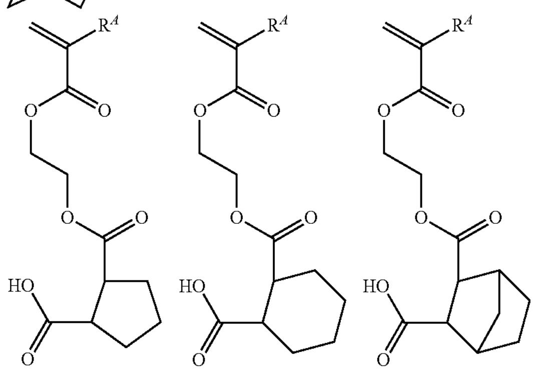

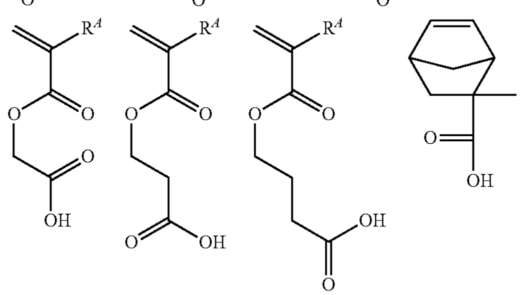

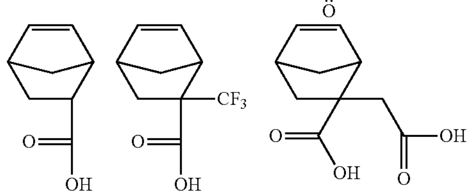

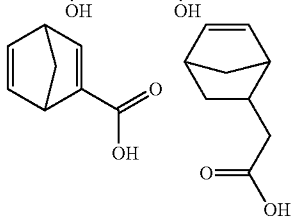

In another preferred embodiment, Polymer A may further comprise recurring units (e) selected from units of indene, benzofuran, benzothiophene, acenaphthylene, chromone, coumarin, and norbomadiene, or derivatives thereof. The recurring units (e) may be used alone or in admixture.

Suitable monomers from which recurring units (e) are derived are exemplified below, but not limited thereto.

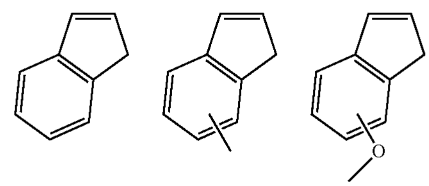

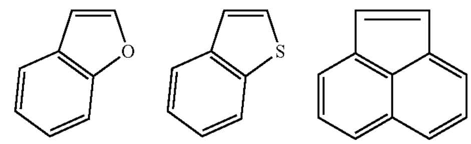

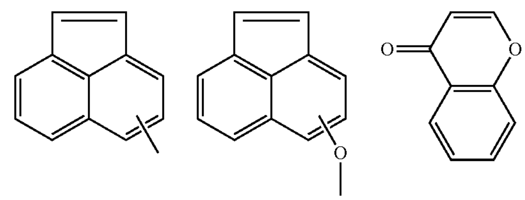

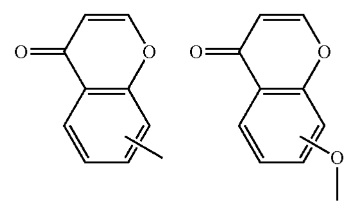

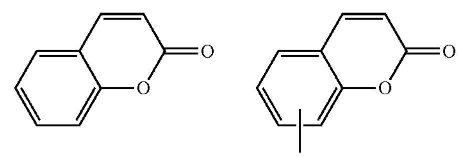

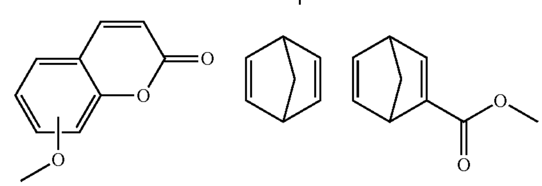

Polymer A may further comprise recurring units (f) which are derived from styrene, vinylnaphthalene, vinylanthracene, vinylpyrene, methyleneindene, vinylpyridine, and vinylcarbazole. The recurring units (f) may be used alone or in admixture.

In a further embodiment, Polymer A may further comprise recurring units (g) derived from an onium salt having polymerizable olefin. JP-A 2005-084365 discloses sulfonium and iodonium salts having polymerizable olefin capable of generating a sulfonic acid. JP-A 2006-178317 discloses a sulfonium salt having sulfonic acid directly attached to the main chain.

The preferred recurring units (g) are recurring units having the following formulae (g1), (g2) and (g3). These units are simply referred to as recurring units (g1), (g2) and (g3), which may be used alone or in combination of two or more types.

(g1)

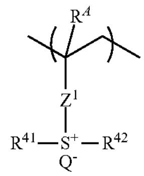

(g2)

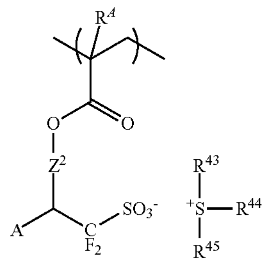

(g3)

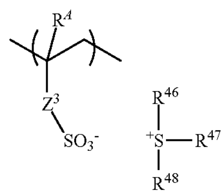

Herein $R^A$ is each independently hydrogen or methyl. $Z^1$ is a single bond, phenylene group, —O—$Z^{12}$—, or —C(═O)—$Z^{11}$—$Z^{12}$—, wherein $Z^{11}$ is —O— or —NH—, and $Z^{12}$ is a $C_1$-$C_6$ alkylene, $C_2$-$C_6$ alkenylene or phenylene group, which may contain a carbonyl, ester bond, ether bond or hydroxyl moiety. $Z^2$ is a single bond, —$Z^{21}$—C(═O)—O—, —$Z^{21}$—O— or —$Z^{21}$—O—C(═O)—, wherein $Z^{21}$ is a $C_1$-$C_{12}$ alkylene group which may contain a carbonyl moiety, ester bond or ether bond. A is hydrogen or trifluoromethyl. $Z^3$ is a single bond, methylene, ethylene, phenylene or fluorinated phenylene group, —O—$Z^{32}$—, or —C(═O)—$Z^{31}$—$Z^{32}$—, wherein $Z^{31}$ is —O— or —NH—, and $Z^{32}$ is a $C_1$-$C_6$ alkylene, phenylene, fluorinated phenylene, trifluoromethyl-substituted phenylene, or $C_2$-$C_6$ alkenylene group, which may contain a carbonyl, ester bond, ether bond or hydroxyl moiety.

$R^{41}$ to $R^{48}$ are each independently a $C_1$-$C_{20}$ monovalent hydrocarbon group which may contain a heteroatom. Any two of $R^{43}$, $R^{44}$ and $R^{45}$ or any two of $R^{46}$, $R^{47}$ and $R^{48}$ may bond together to form a ring with the sulfur atom to which they are attached. The sulfonium cation in formulae (g2) and (g3) is preferably selected from the cations having the foregoing formulae (A-3) and (A-4), and examples thereof are as exemplified above for the sulfonium cation in formula (A-1).

In formula (g1), $Q^-$ is a non-nucleophilic counter ion. Examples of the non-nucleophilic counter ion include halide ions such as chloride and bromide ions; fluoroalkylsulfonate ions such as triflate, 1,1,1-trifluoroethanesulfonate, and nonafluorobutanesulfonate; arylsulfonate ions such as tosylate, benzenesulfonate, 4-fluorobenzenesulfonate, and 1,2,3,4,5-pentafluorobenzenesulfonate; alkylsulfonate ions such as mesylate and butanesulfonate; imide ions such as bis(trifluoromethylsulfonyl)imide, bis(perfluoroethylsulfonyl)imide and bis(perfluorobutylsulfonyl)imide; methide ions such as tris(trifluoromethylsulfonyl)methide and tris(perfluoroethylsulfonyl)methide.

Also included are sulfonates having fluorine substituted at α-position as represented by the formula (K-1) and sulfonates having fluorine substituted at α- and β-positions as represented by the formula (K-2).

$$R^{51}—CF_2—SO_3^- \quad (K\text{-}1)$$

(K-2)

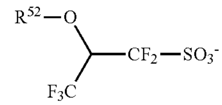

In formula (K-1), $R^{51}$ is hydrogen, or a $C_1$-$C_{20}$ straight, branched or cyclic alkyl group, $C_2$-$C_{20}$ straight, branched or cyclic alkenyl group, or $C_6$-$C_{20}$ aryl group, which may contain an ether bond, ester bond, carbonyl moiety, lactone ring, or fluorine atom.

In formula (K-2), $R^{52}$ is hydrogen, or a $C_1$-$C_{30}$ straight, branched or cyclic alkyl group, $C_2$-$C_{20}$ straight, branched or cyclic acyl group, $C_2$-$C_{20}$ straight, branched or cyclic alkenyl group, $C_6$-$C_{20}$ aryl group or $C_6$-$C_{20}$ aryloxy group, which may contain an ether bond, ester bond, carbonyl moiety or lactone ring.

Examples of the monomer from which recurring unit (g1) is derived are shown below, but not limited thereto. $R^A$ and $Q^-$ are as defined above.

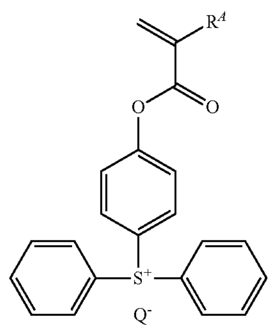

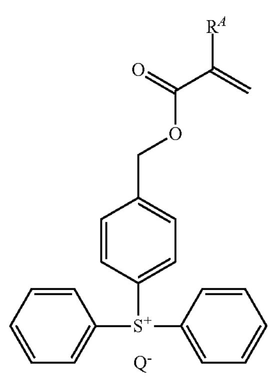

-continued
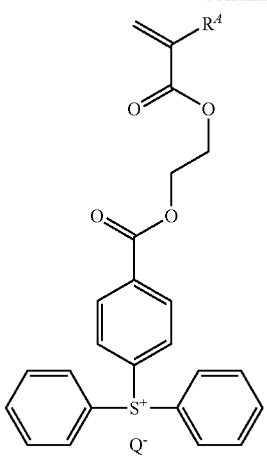
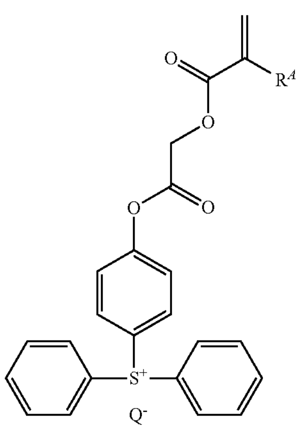
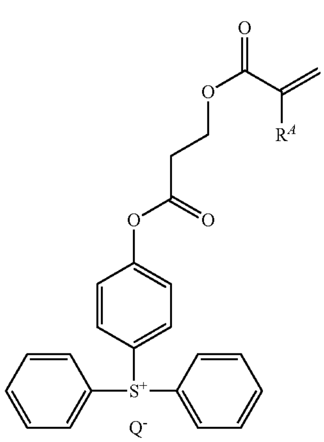
-continued
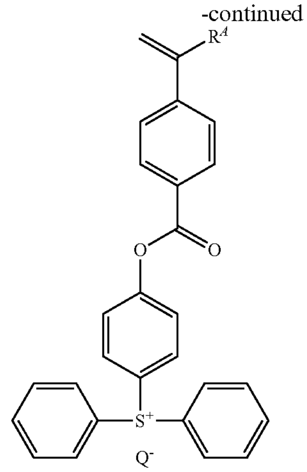
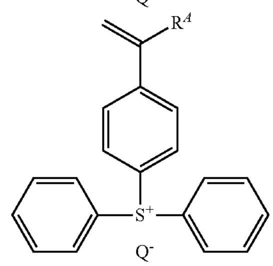
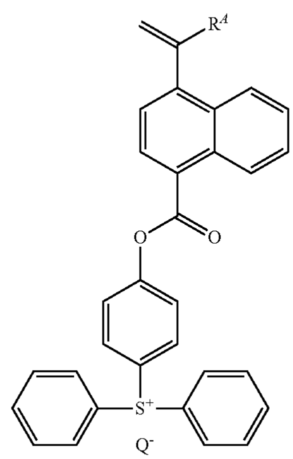
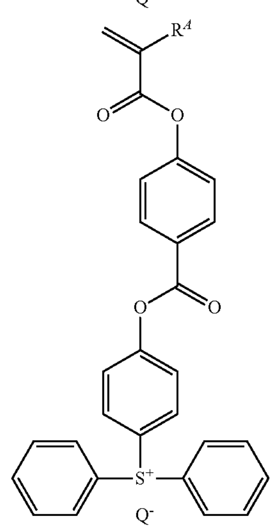

-continued
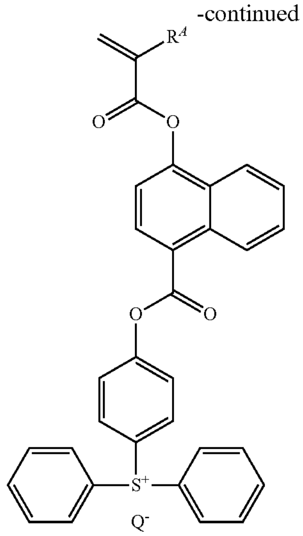
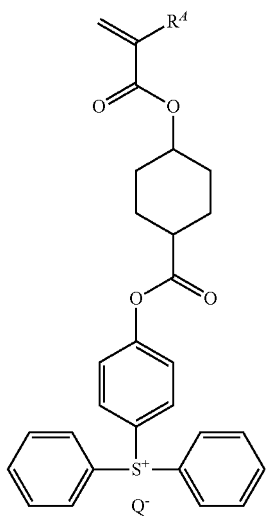
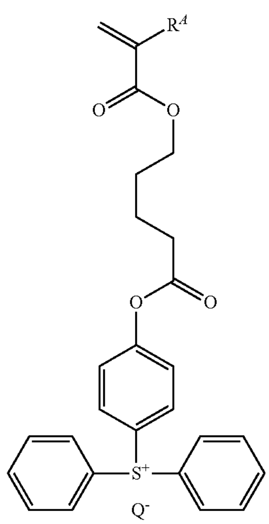
-continued
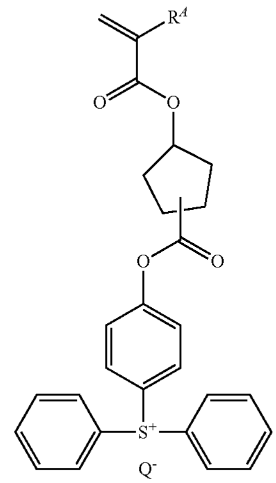
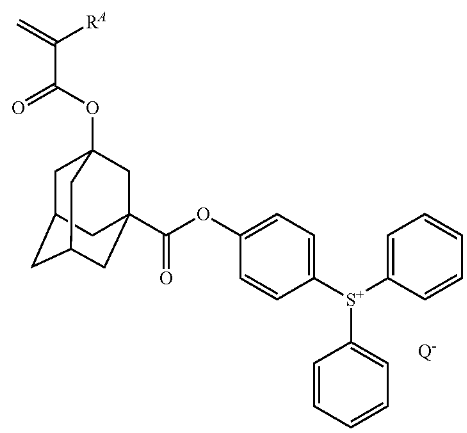
Examples of the monomer from which recurring unit (g2) is derived are shown below, but not limited thereto. $R^A$ is as defined above.
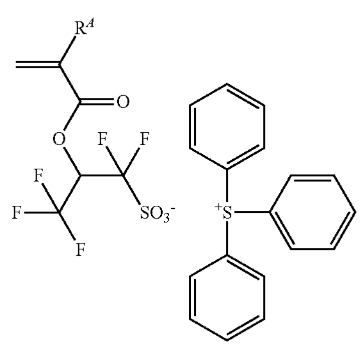

-continued
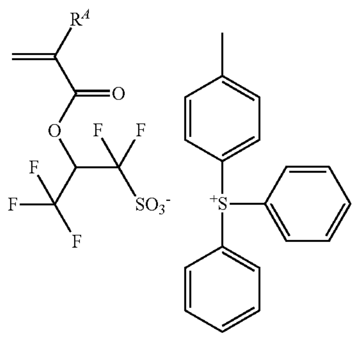
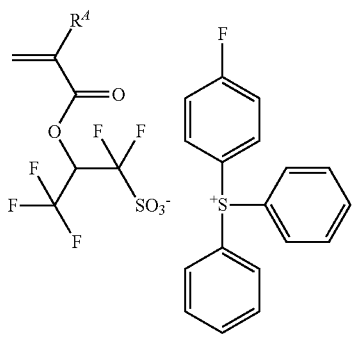
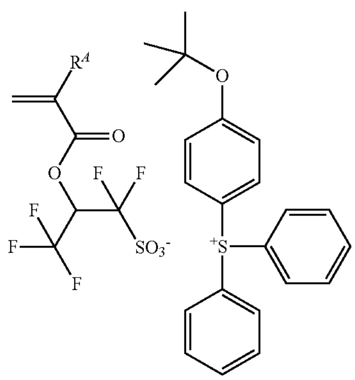
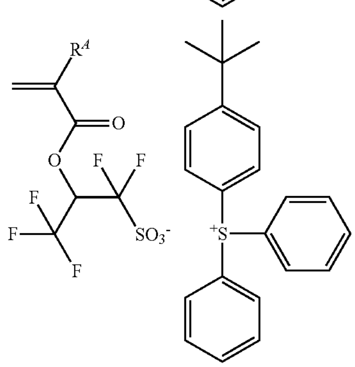
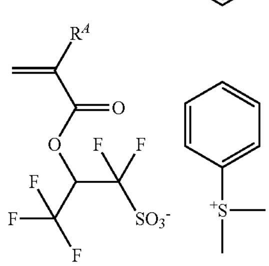
-continued
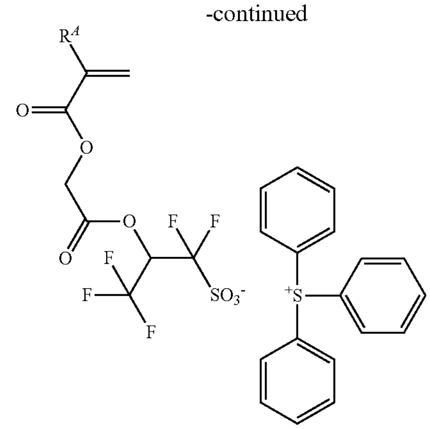
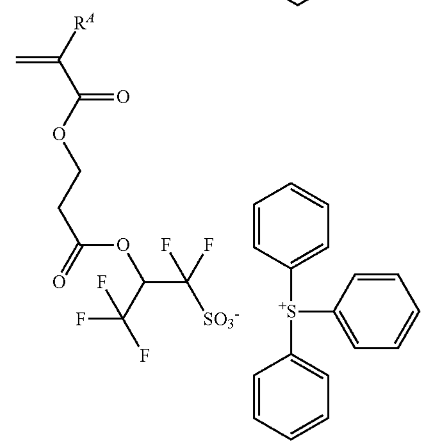
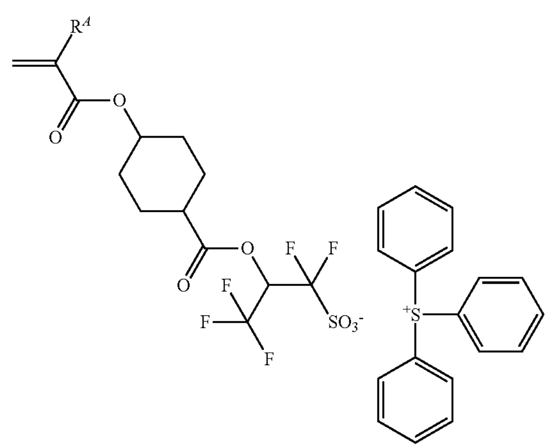
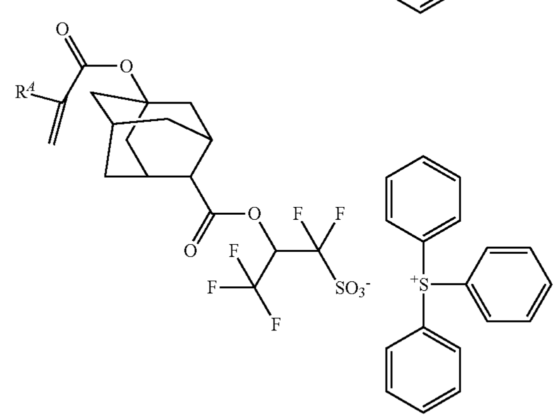

-continued
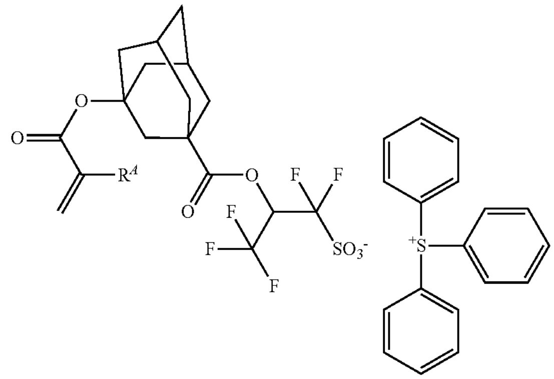
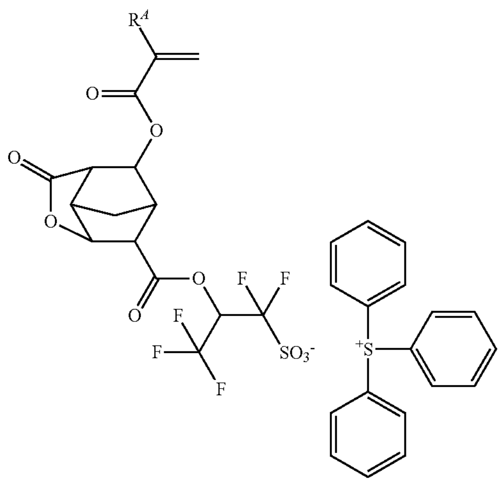
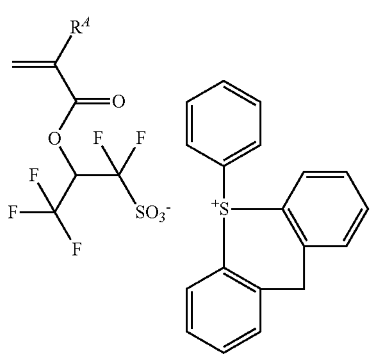
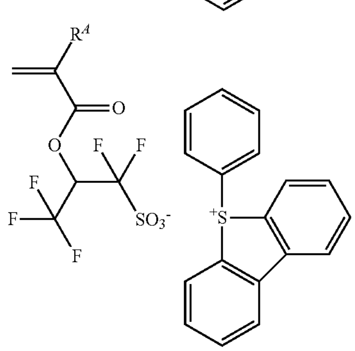
-continued
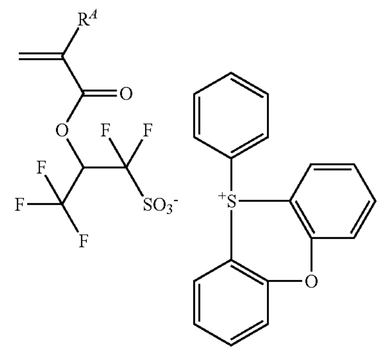
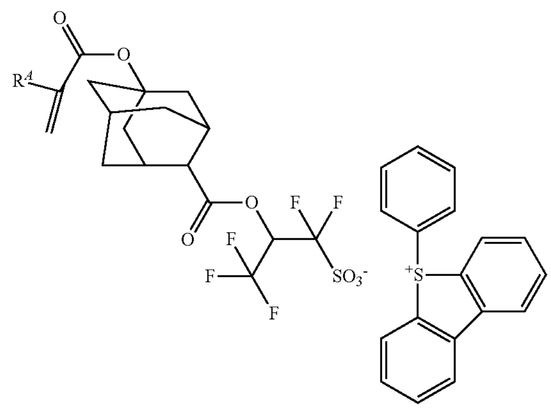
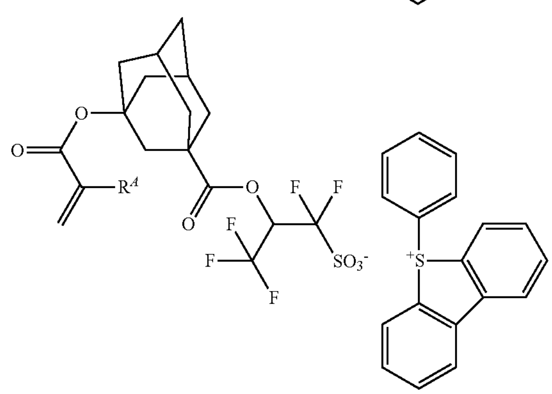
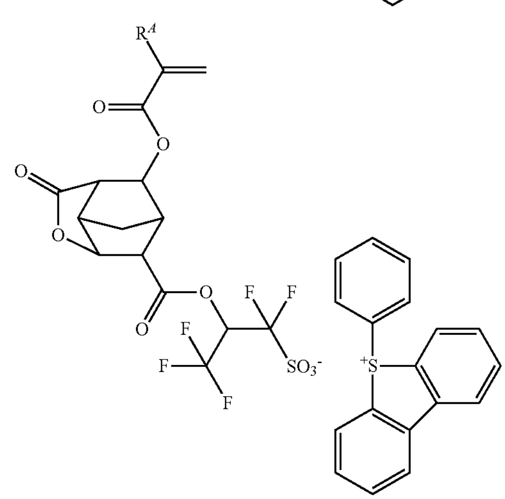

-continued
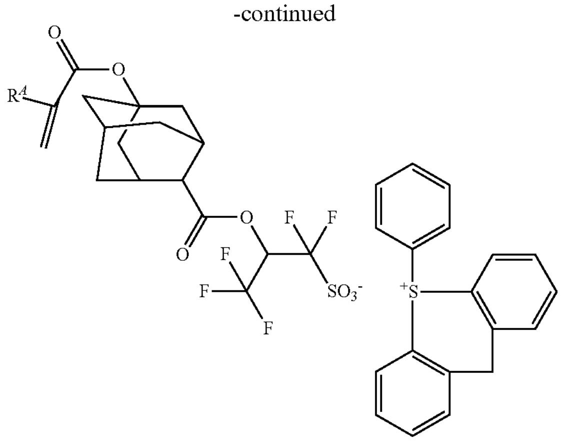
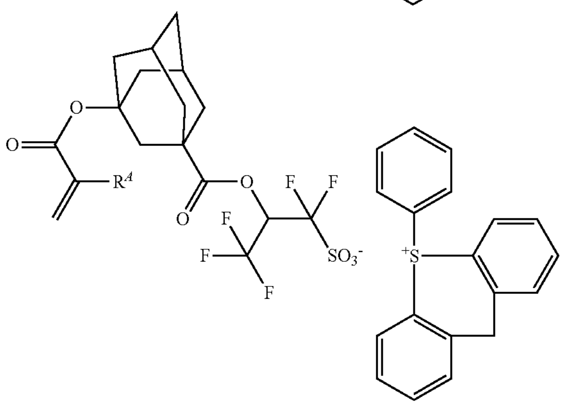
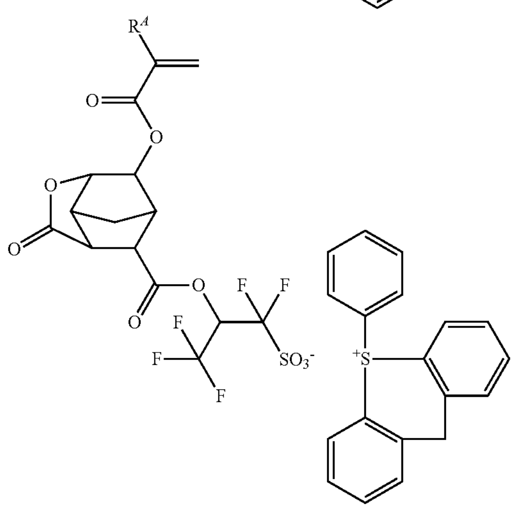
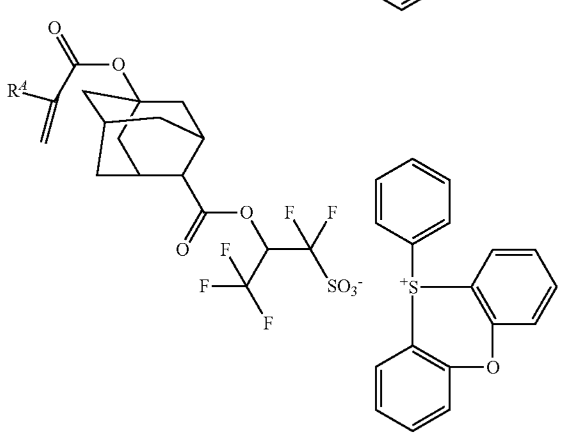
-continued
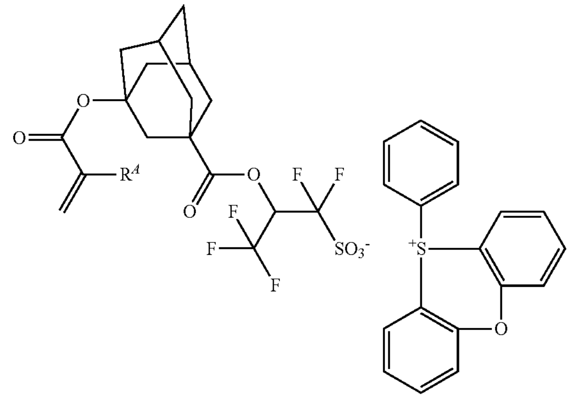
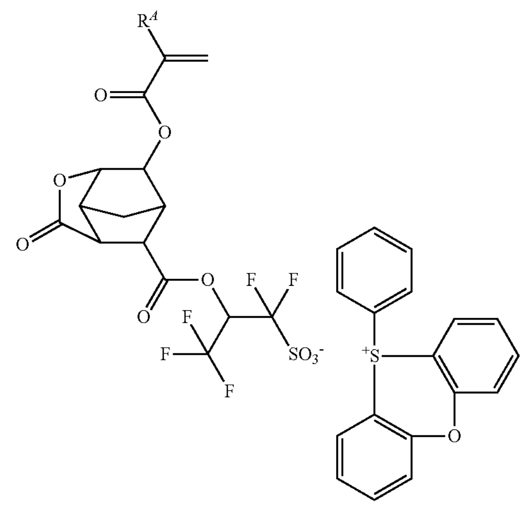
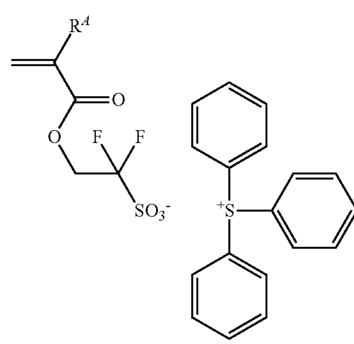
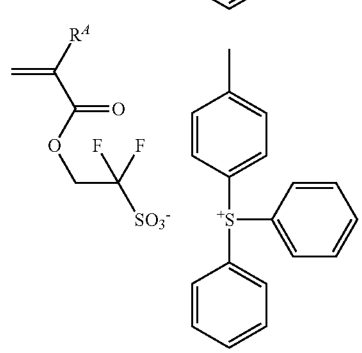

-continued
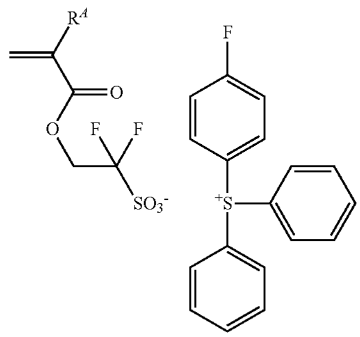
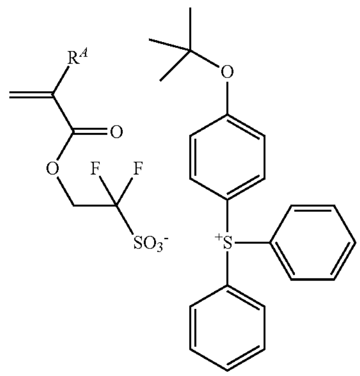
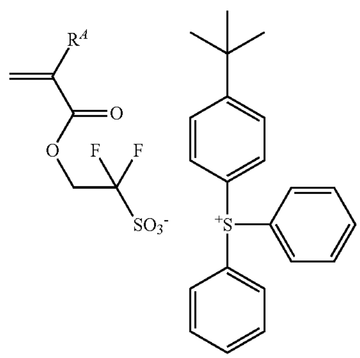
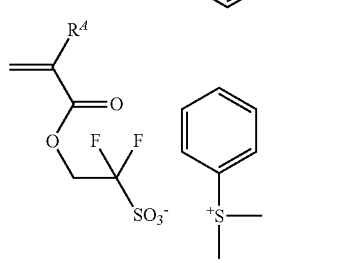
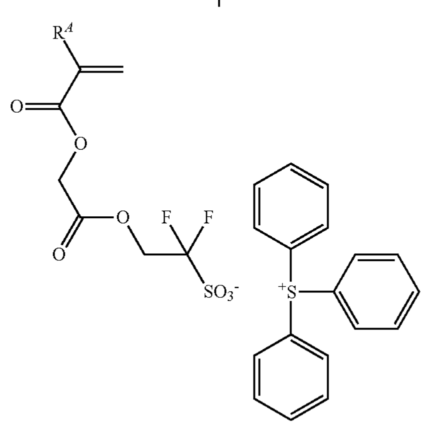
-continued
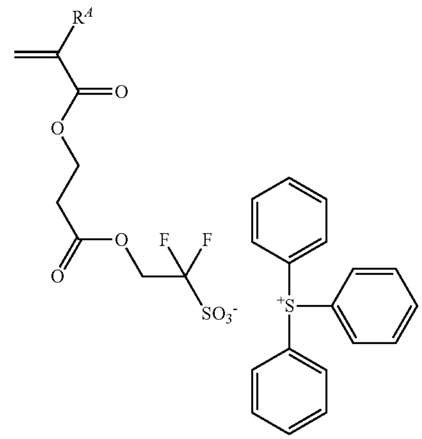
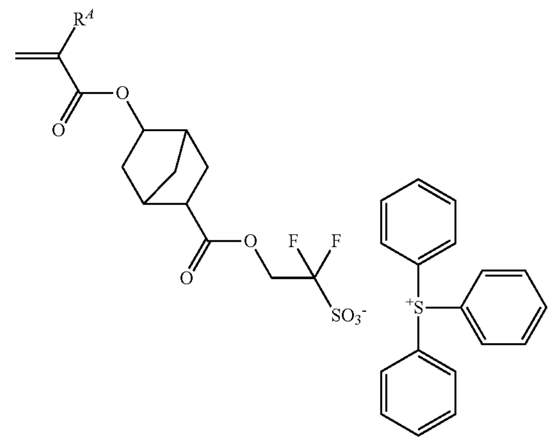
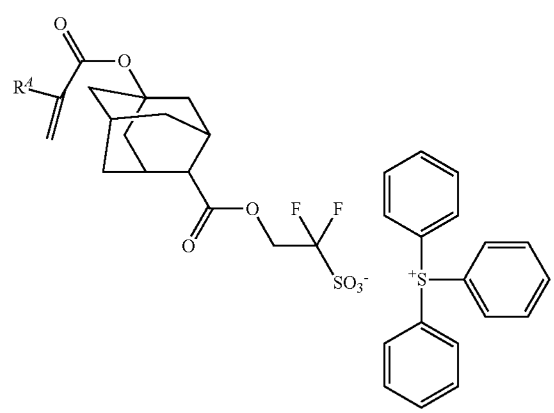
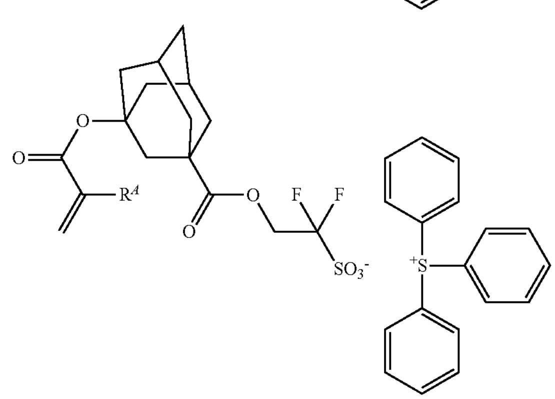

-continued
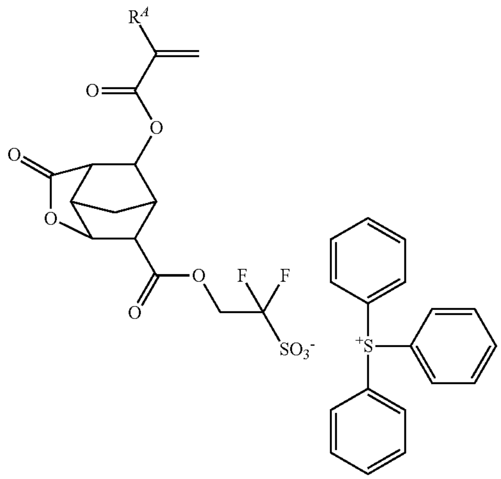
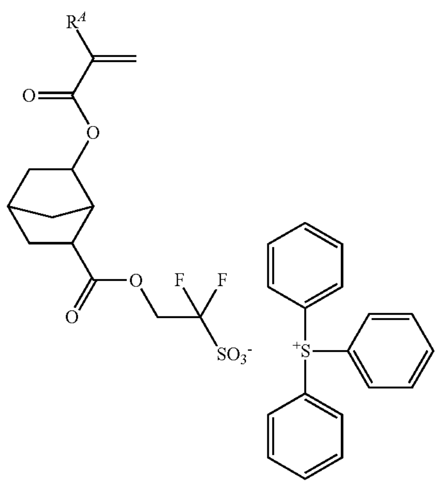
Examples of the monomer from which recurring unit (g3) is derived are shown below, but not limited thereto. $R^A$ is as defined above.
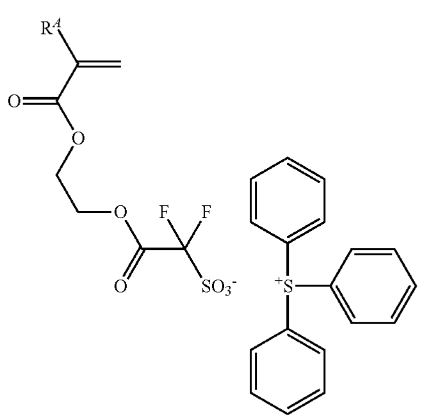
-continued
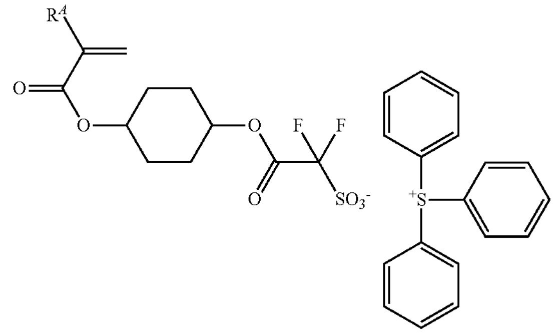
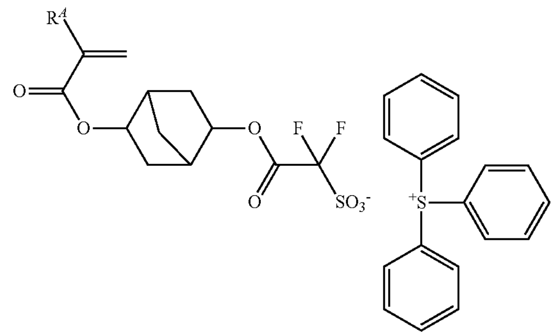
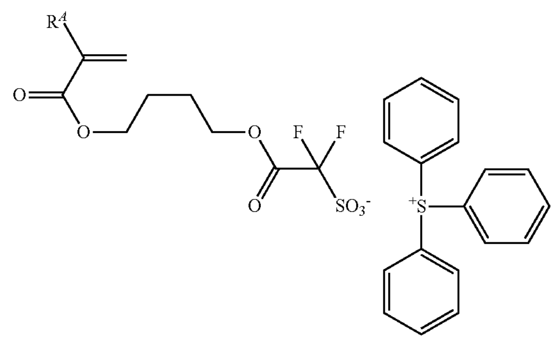
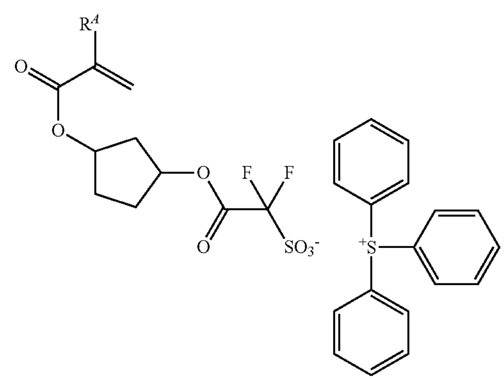
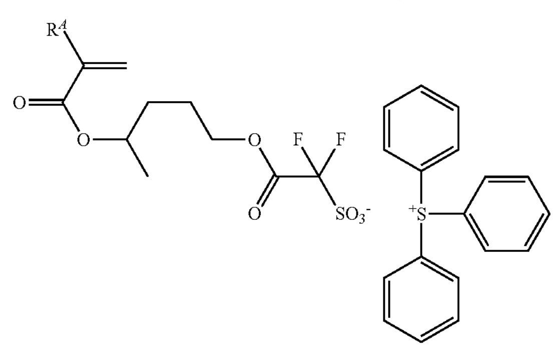

-continued
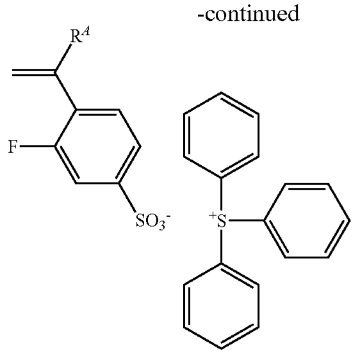
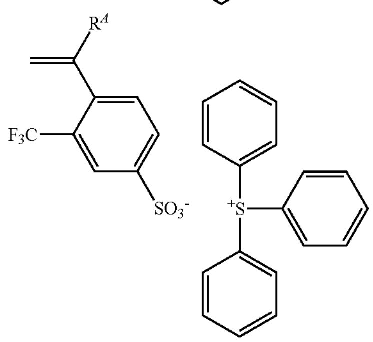
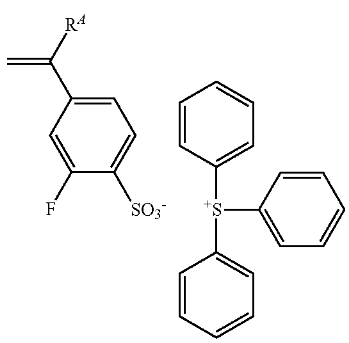
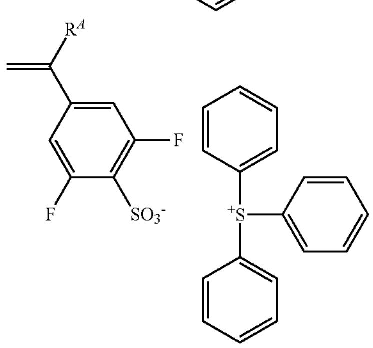
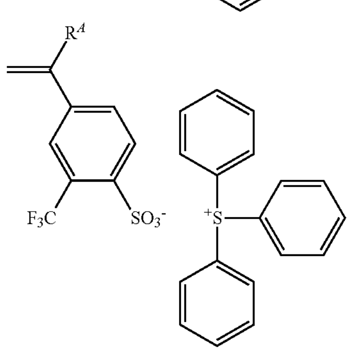
-continued
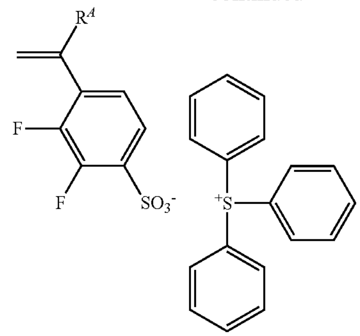
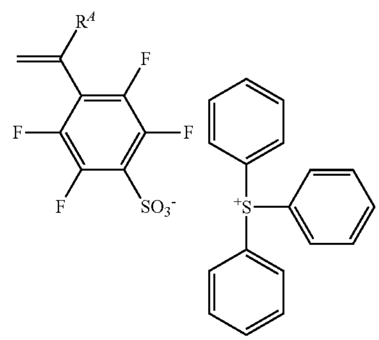
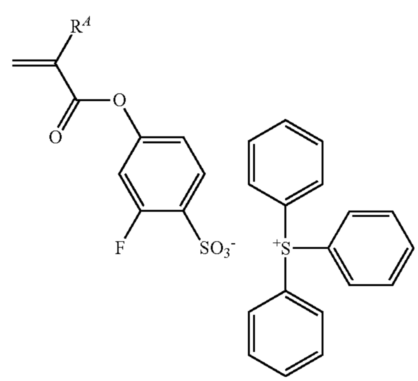
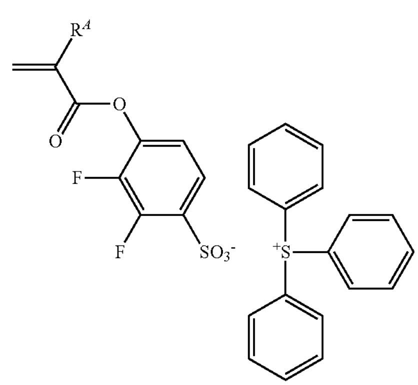

-continued

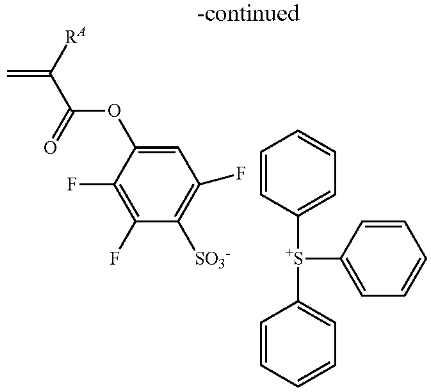

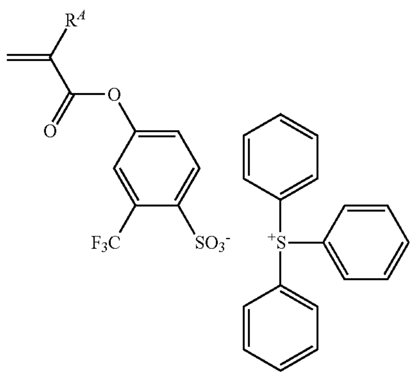

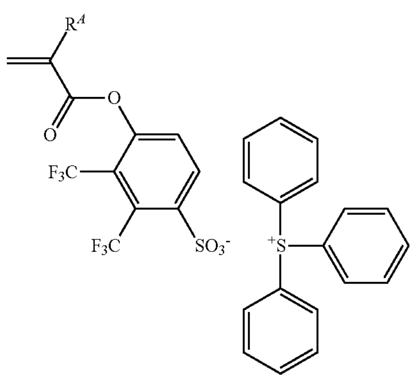

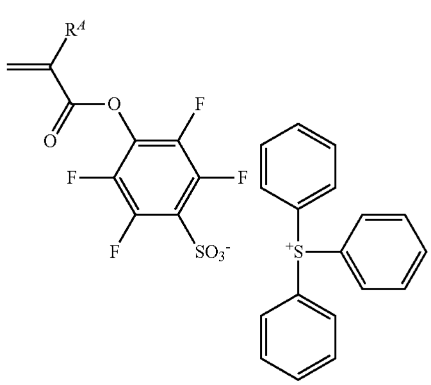

-continued

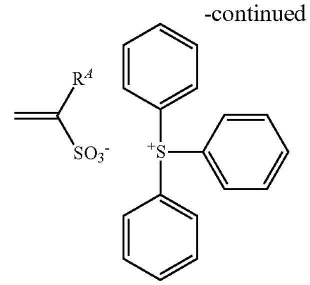

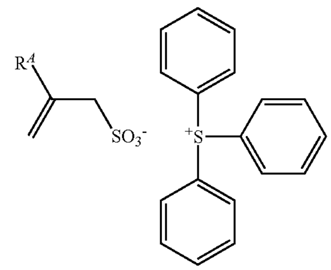

The attachment of an acid generator to the polymer main chain is effective in restraining acid diffusion, thereby preventing a reduction of resolution due to blur by acid diffusion. Also edge roughness is improved since the acid generator is uniformly distributed.

Polymer A for formulating the positive resist composition comprises recurring units (a1) or (a2) containing iodine and additionally recurring units (b1)) or (b2) having an acid labile group, and optionally recurring units (c), (d), (e), (f), and (g). A fraction of units (a1), (a2), (b1), (b2), (c), (d), (e), (f) and (g) is: preferably $0\leq a1<1.0$, $0\leq a2<1.0$, $0<a1+a2<1.0$, $0\leq b1<1.0$, $0\leq b2<1.0$, $0<b1+b2<1.0$, $0\leq c\leq 0.9$, $0\leq d\leq 0.9$, $0\leq e\leq 0.8$, $0\leq f\leq 0.8$, and $0\leq g\leq 0.5$; more preferably $0\leq a1\leq a1\leq 0.9$, $0\leq a2\leq 0.9$, $0.1\leq a1+a2\leq 0.9$, $0\leq b1\leq 0.9$, $0\leq b2\leq 0.9$, $0.1\leq b1+b2\leq 0.9$, $0\leq c\leq 0.8$, $0\leq d\leq 0.8$, $0\leq e\leq 0.7$, $0\leq f\leq 0.7$, and $0\leq g\leq 0.4$; and even more preferably $0\leq a1\leq 0.8$, $0\leq a2\leq 0.8$, $0.1\leq a1+a2\leq 0.8$, $0\leq b1\leq 0.8$, $0\leq b2\leq 0.8$, $0.1\leq b1+b2\leq 0.8$, $0\leq c\leq 0.75$, $0\leq d\leq 0.75$, $0\leq e\leq 0.6$, $0\leq f\leq 0.6$, and $0\leq g\leq 0.3$. Notably, $g=g1+g2+g3$, meaning that unit (g) is at least one of units (g1) to (g3), and $a1+a2+b1+b2+c+d+e+f+g=1.0$.

For Polymer A for formulating the negative resist composition, an acid labile group is not necessarily essential. The polymer comprises iodized recurring units (a1) or (a2) and recurring units (c), and optionally recurring units (d), (e), (f) and/or (g). A fraction of these units is: preferably $0\leq a1<1.0$, $0\leq a2<1.0$, $0<a1+a2<1.0$, $0<c<1.0$, $0\leq d\leq 0.9$, $0\leq e\leq 0.9$, $0\leq f\leq 0.8$, and $0\leq g\leq 0.5$; more preferably $0\leq a1\leq 0.8$, $0\leq a2\leq 0.8$, $0.1\leq a1+a2\leq 0.8$, $0.2\leq c\leq 0.9$, $0\leq d\leq 0.8$, $0\leq e\leq 0.7$, $0\leq f\leq 0.7$, and $0\leq g\leq 0.4$; and even more preferably $0\leq a1\leq 0.7$, $0\leq a2\leq 0.7$, $0.2\leq a1+a2\leq 0.7$, $0.3\leq c\leq 0.8$, $0\leq d\leq 0.75$, $0\leq e\leq 0.6$, $0\leq f\leq 0.6$, and $0\leq g\leq 0.3$. Notably, $g=g1+g2+g3$. meaning that (g) is at least one of units (g1) to (g3), and $a1+a2+c+d+e+f+g=1.0$.

Polymer A may be synthesized by any desired methods, for example, by dissolving one or more monomers selected from the monomers corresponding to the foregoing recurring units in an organic solvent, adding a radical polymerization initiator thereto, and heating for polymerization. Examples of the organic solvent which can be used for polymerization include toluene, benzene, tetrahydrofuran, diethyl ether, and dioxane. Examples of the polymerization initiator used herein include 2,2'-azobisisobutyronitrile (AIBN), 2,2'-azobis(2,4-dimethylvaleronitrile), dimethyl 2,2-azobis(2-methylpropionate), benzoyl peroxide, and lauroyl peroxide. Preferably the reaction temperature is 50 to 80° C., and the reaction time is 2 to 100 hours, preferably 5 to 20 hours.

In the case of a monomer having a hydroxyl group, the hydroxyl group may be replaced by an acetal group susceptible to deprotection with acid, typically ethoxyethoxy, prior to polymerization, and the polymerization be followed by deprotection with weak acid and water. Alternatively, the hydroxyl group may be replaced by an acetyl, formyl, pivaloyl or similar group prior to polymerization, and the polymerization be followed by alkaline hydrolysis.

When hydroxystyrene or hydroxyvinylnaphthalene is copolymerized, an alternative method is possible. Specifically, acetoxystyrene or acetoxyvinylnaphthalene is used instead of hydroxystyrene or hydroxyvinylnaphthalene, and after polymerization, the acetoxy group is deprotected by alkaline hydrolysis, for thereby converting the polymer product to hydroxystyrene or hydroxyvinylnaphthalene. For alkaline hydrolysis, a base such as aqueous ammonia or triethylamine may be used. Preferably the reaction temperature is −20° C. to 100° C., more preferably 0° C. to 60° C., and the reaction time is 0.2 to 100 hours, more preferably 0.5 to 20 hours.

Polymer A should preferably have a weight average molecular weight (Mw) in the range of 1,000 to 500,000, and more preferably 2,000 to 30,000, as measured by GPC versus polystyrene standards using tetrahydrofuran (THF) solvent. A polymer with a Mw in the range is heat resistant and alkaline soluble.

If a polymer has a wide molecular weight distribution or dispersity (Mw/Mn), which indicates the presence of lower and higher molecular weight polymer fractions, there is a possibility that foreign matter is left on the pattern or the pattern profile is degraded. The influences of molecular weight and dispersity become stronger as the pattern rule becomes finer. Therefore, Polymer A should preferably have a narrow dispersity (Mw/Mn) of 1.0 to 2.0, especially 1.0 to 1.5, in order to provide a resist composition suitable for micropatterning to a small feature size.

The base polymer may be a blend of two or more Polymers A which differ in compositional ratio, Mw or Mw/Mn. Also the base polymer may or may not contain a polymer different from Polymer A, although it is preferred that the base polymer be free of a different polymer.

Other Components

With the iodized benzene ring-containing fluorosulfonic acid onium salt and the base polymer, both defined above, other components such as an organic solvent, an acid generator (other than the iodized benzene ring-containing fluorosulfonic acid onium salt), surfactant, dissolution inhibitor, and crosslinker may be blended in any desired combination to formulate a positive or negative resist composition. This positive or negative resist composition has a very high sensitivity in that the dissolution rate in developer of the base polymer in exposed areas is accelerated by catalytic reaction. In addition, the resist film has a high dissolution contrast, resolution, exposure latitude, and process adaptability, and provides a good pattern profile after exposure, and minimal proximity bias because of restrained acid diffusion. By virtue of these advantages, the composition is fully useful in commercial application and suited as a pattern-forming material for the fabrication of VLSIs. Particularly when an acid generator is incorporated to formulate a chemically amplified positive resist composition capable of utilizing acid catalyzed reaction, the composition has a higher sensitivity and is further improved in the properties described above.

Examples of the organic solvent used herein are described in JP-A 2008-111103, paragraphs [0144]-[0145] (U.S. Pat. No. 7,537,880). Exemplary solvents include ketones such as cyclohexanone, cyclopentanone and methyl-2-n-pentyl ketone; alcohols such as 3-methoxybutanol, 3-methyl-3-methoxybutanol, 1-methoxy-2-propanol, and 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, and diethylene glycol dimethyl ether; esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, and propylene glycol mono-t-butyl ether acetate; and lactones such as γ-butyrolactone, which may be used alone or in admixture.

The organic solvent is preferably added in an amount of 100 to 10,000 parts, and more preferably 200 to 8,000 parts by weight per 100 parts by weight of the base polymer.

The resist composition may further contain an acid generator other than the iodized benzene ring-containing fluorosulfonic acid onium salt, referred to as other acid generator, as long as the benefits of the invention are not compromised. The other acid generator is typically a compound (PAG) capable of generating an acid upon exposure to actinic ray or radiation. Although the PAG used herein may be any compound capable of generating an acid upon exposure to high-energy radiation, those compounds capable of generating sulfonic acid, imide acid (imidic acid) or methide acid are preferred. Suitable PAGs include sulfonium salts, iodonium salts, sulfonyldiazomethane, N-sulfonyloxyimide, and oxime-O-sulfonate acid generators. Exemplary PAGs are described in JP-A 2008-111103, paragraphs [0122]-[0142] (U.S. Pat. No. 7,537,880). The other acid generator may be used alone or in admixture. The other acid generator is preferably used in an amount of 0 to 200 parts, more preferably 0.1 to 100 parts by weight per 100 parts by weight of the base polymer.

Exemplary surfactants are described in JP-A 2008-111103, paragraphs [0165]-[0166]. Inclusion of a surfactant may improve or control the coating characteristics of the resist composition. The surfactant may be used alone or in admixture. The surfactant is preferably added in an amount of 0.0001 to 10 parts by weight per 100 parts by weight of the base polymer.

In the case of positive resist compositions, inclusion of a dissolution inhibitor may lead to an increased difference in dissolution rate between exposed and unexposed areas and a further improvement in resolution. In the case of negative resist compositions, a negative pattern may be formed by adding a crosslinker to reduce the dissolution rate of exposed area.

The dissolution inhibitor which can be used herein is a compound having at least two phenolic hydroxyl groups on the molecule, in which an average of from 0 to 100 mol % of all the hydrogen atoms on the phenolic hydroxyl groups are replaced by acid labile groups or a compound having at least one carboxyl group on the molecule, in which an average of 50 to 100 mol % of all the hydrogen atoms on the carboxyl groups are replaced by acid labile groups, both the compounds having a molecular weight of 100 to 1,000, and preferably 150 to 800. Typical are bisphenol A, trisphenol, phenolphthalein, cresol novolac, naphthalenecarboxylic acid, adamantanecarboxylic acid, and cholic acid derivatives in which the hydrogen atom on the hydroxyl or carboxyl group is replaced by an acid labile group, as described in U.S. Pat. No. 7,771,914 (JP-A 2008-122932, paragraphs [0155]-[0178]).

In the positive resist composition, the dissolution inhibitor is preferably added in an amount of 0 to 50 parts, more preferably 5 to 40 parts by weight per 100 parts by weight of the base polymer.

Suitable crosslinkers which can be used herein include epoxy compounds, melamine compounds, guanamine compounds, glycoluril compounds and urea compounds having substituted thereon at least one group selected from among methylol, alkoxymethyl and acyloxymethyl groups, isocyanate compounds, azide compounds, and compounds having a double bond such as an alkenyl ether group. These compounds may be used as an additive or introduced into a polymer side chain as a pendant. Hydroxy-containing compounds may also be used as the crosslinker. The crosslinker may be used alone or in admixture.

Of the foregoing crosslinkers, examples of suitable epoxy compounds include tris(2,3-epoxypropyl) isocyanurate, trimethylolmethane triglycidyl ether, trimethylolpropane triglycidyl ether, and triethylolethane triglycidyl ether. Examples of the melamine compound include hexamethylol melamine, hexamethoxymethyl melamine, hexamethylol melamine compounds having 1 to 6 methylol groups methoxymethylated and mixtures thereof, hexamethoxyethyl melamine, hexaacyloxymethyl melamine, hexamethylol melamine compounds having 1 to 6 methylol groups acyloxymethylated and mixtures thereof. Examples of the guanamine compound include tetramethylol guanamine, tetramethoxymethyl guanamine, tetramethylol guanamine compounds having 1 to 4 methylol groups methoxymethylated and mixtures thereof, tetramethoxyethyl guanamine, tetraacyloxyguanamine, tetramethylol guanamine compounds having 1 to 4 methylol groups acyloxymethylated and mixtures thereof. Examples of the glycoluril compound include tetramethylol glycoluril, tetramethoxyglycoluril, tetramethoxymethyl glycoluril, tetramethylol glycoluril compounds having 1 to 4 methylol groups methoxymethylated and mixtures thereof, tetramethylol glycoluril compounds having 1 to 4 methylol groups acyloxymethylated and mixtures thereof. Examples of the urea compound include tetramethylol urea, tetramethoxymethyl urea, tetramethylol urea compounds having 1 to 4 methylol groups methoxymethylated and mixtures thereof, and tetramethoxyethyl urea.

Suitable isocyanate compounds include tolylene diisocyanate, diphenylmethane diisocyanate, hexamethylene diisocyanate and cyclohexane diisocyanate. Suitable azide compounds include 1,1'-biphenyl-4,4'-bisazide, 4,4'-methylidenebisazide, and 4,4'-oxybisazide. Examples of the alkenyl ether group-containing compound include ethylene glycol divinyl ether, triethylene glycol divinyl ether, 1,2-propanediol divinyl ether, 1,4-butanediol divinyl ether, tetramethylene glycol divinyl ether, neopentyl glycol divinyl ether, trimethylol propane trivinyl ether, hexanediol divinyl ether, 1,4-cyclohexanediol divinyl ether, pentaerythritol trivinyl ether, pentaerythritol tetravinyl ether, sorbitol tetravinyl ether, sorbitol pentavinyl ether, and trimethylol propane trivinyl ether.

In the negative resist composition, the crosslinker is preferably added in an amount of 0.1 to 50 parts, more preferably 1 to 40 parts by weight per 100 parts by weight of the base polymer.

In the resist composition of the invention, a quencher may be blended. The quencher is typically selected from conventional basic compounds. Conventional basic compounds include primary, secondary, and tertiary aliphatic amines, mixed amines, aromatic amines, heterocyclic amines, nitrogen-containing compounds with carboxyl group, nitrogen-containing compounds with sulfonyl group, nitrogen-containing compounds with hydroxyl group, nitrogen-containing compounds with hydroxyphenyl group, alcoholic nitrogen-containing compounds, amide derivatives, imide derivatives, and carbamate derivatives. Also included are primary, secondary, and tertiary amine compounds, specifically amine compounds having a hydroxyl, ether, ester, lactone ring, cyano, or sulfonic acid ester group as described in JP-A 2008-111103, paragraphs [0146]-[0164], and compounds having a carbamate group as described in JP 3790649. Addition of a basic compound may be effective for further suppressing the diffusion rate of acid in the resist film or correcting the pattern profile.

Onium salts such as sulfonium salts, iodonium salts and ammonium salts of sulfonic acids which are not fluorinated at α-position as described in U.S. Pat. No. 8,795,942 (JP-A 2008-158339) and similar onium salts of carboxylic acid may also be used as the quencher. While an α-fluorinated sulfonic acid, imide acid, and methide acid are necessary to deprotect the acid labile group of carboxylic acid ester, an α-non-fluorinated sulfonic acid or carboxylic acid is released by salt exchange with an α-non-fluorinated onium salt. An α-non-fluorinated sulfonic acid and a carboxylic acid function as a quencher because they do not induce deprotection reaction.

Also a carboxylic acid onium salt having the formula (1) is useful as the quencher.

$$R^{101}—CO_2^- M_A^+ \qquad (1)$$

In formula (1), $R^{101}$ is a $C_1$-$C_{40}$ monovalent hydrocarbon group which may contain a heteroatom. The monovalent hydrocarbon group may be straight, branched or cyclic. Examples include $C_1$-$C_{40}$ alkyl groups, $C_2$-$C_{40}$ alkenyl groups, $C_2$-$C_{40}$ alkynyl groups, $C_6$-$C_{40}$ aryl groups, and $C_7$-$C_{40}$ aralkyl groups. Also included are substituted forms of the foregoing in which at least one (one or more or even all) hydrogen is substituted by hydroxyl, carboxyl, halogen, cyano, amide, nitro, mercapto, sultone, sulfone moiety or sulfonium salt-containing moiety, or in which at least one carbon is substituted by an ether bond, ester bond, carbonyl moiety, carbonate moiety or sulfonic acid ester bond.

In formula (1), $M_A^+$ is an onium cation. Suitable onium cations include sulfonium, iodonium and ammonium cations. Preferred are sulfonium cations having formula (A-3) or (A-4) and iodonium cations having formula (A-5), defined above.

Preferably the anion moiety in the carboxylic acid onium salt has the formula (2).

(2)

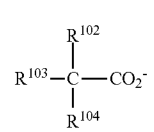

In formula (2), $R^{102}$ and $R^{103}$ are each independently hydrogen, fluorine or trifluoromethyl. $R^{104}$ is hydrogen, hydroxyl, or a $C_1$-$C_{35}$ monovalent hydrocarbon group which may contain a heteroatom. The monovalent hydrocarbon group may be straight, branched or cyclic. Examples include $C_1$-$C_{35}$ alkyl groups, $C_2$-$C_{35}$ alkenyl groups, $C_2$-$C_{35}$ alkynyl groups, $C_6$-$C_{35}$ aryl groups, and $C_7$-$C_{35}$ aralkyl groups. Also included are substituted forms of the foregoing in which at least one (one or more or even all) hydrogen is substituted by hydroxyl, carboxyl, halogen, cyano, amide, nitro, mercapto, sultone, sulfone moiety or sulfonium salt-containing moiety, or in which at least one carbon is substituted by an ether bond, ester bond, carbonyl moiety, carbonate moiety or sulfonic acid ester bond.

Also useful are quenchers of polymer type as described in U.S. Pat. No. 7,598,016 (JP-A 2008-239918). The polymeric quencher segregates at the resist surface after coating and thus enhances the rectangularity of resist pattern. When a protective film is applied as is often the case in the immersion lithography, the polymeric quencher is also effective for preventing a film thickness loss of resist pattern or rounding of pattern top.

The quencher is preferably added in an amount of 0 to 5 parts, more preferably 0 to 4 parts by weight per 100 parts by weight of the base polymer.

To the resist composition, a polymeric additive (or water repellency improver) may also be added for improving the water repellency on surface of a resist film as spin coated. The water repellency improver may be used in the topcoatless immersion lithography. Suitable water repellency improvers include polymers having a fluoroalkyl group and polymers having a specific structure with a 1,1,1,3,3,3-hexafluoro-2-propanol residue and are described in JP-A 2007-297590 and JP-A 2008-111103, for example. The water repellency improver to be added to the resist composition should be soluble in the organic solvent as the developer. The water repellency improver of specific structure with a 1,1,1,3,3,3-hexafluoro-2-propanol residue is well soluble in the developer. A polymer having an amino group or amine salt copolymerized as recurring units may serve as the water repellent additive and is effective for preventing evaporation of acid during PEB, thus preventing any hole pattern opening failure after development. An appropriate amount of the water repellency improver is 0 to 20 parts, preferably 0.5 to 10 parts by weight per 100 parts by weight of the base polymer.

Also, an acetylene alcohol may be blended in the resist composition. Suitable acetylene alcohols are described in JP-A 2008-122932, paragraphs [0179]-[0182]. An appropriate amount of the acetylene alcohol blended is 0 to 5 parts by weight per 100 parts by weight of the base polymer.

Process

The resist composition is used in the fabrication of various integrated circuits. Pattern formation using the resist composition may be performed by well-known lithography processes. The process generally involves coating, prebaking, exposure, post-exposure baking (PEB), and development. If necessary, any additional steps may be added.

For example, the positive resist composition is first applied onto a substrate on which an integrated circuit is to be formed (e.g., Si, $SiO_2$, SiN, SiON, TiN, WSi, BPSG, SOG, or organic antireflective coating) or a substrate on which a mask circuit is to be formed (e.g., Cr, CrO, CrON, $MoSi_2$, or $SiO_2$) by a suitable coating technique such as spin coating, roll coating, flow coating, dipping, spraying or doctor coating. The coating is prebaked on a hotplate at a temperature of 60 to 150° C. for 10 seconds to 30 minutes, preferably at 80 to 120° C. for 30 seconds to 20 minutes. The resulting resist film is generally 0.01 to 2.0 μm thick.

The resist film is then exposed to a desired pattern of high-energy radiation such as UV, deep-UV, EB, EUV, x-ray, soft x-ray, excimer laser light, γ-ray or synchrotron radiation, directly or through a mask. The exposure dose is preferably about 1 to 200 mJ/cm$^2$, more preferably about 10 to 100 mJ/cm$^2$, or about 0.1 to 100 μC/cm$^2$, more preferably about 0.5 to 50 μC/cm$^2$. The resist film is further baked (PEB) on a hotplate at 60 to 150° C. for 10 seconds to 30 minutes, preferably at 80 to 120° C. for 30 seconds to 20 minutes.

Thereafter the resist film is developed with a developer in the form of an aqueous base solution for 3 seconds to 3 minutes, preferably 5 seconds to 2 minutes by conventional techniques such as dip, puddle and spray techniques. A typical developer is a 0.1 to 10 wt %, preferably 2 to 5 wt % aqueous solution of tetramethylammonium hydroxide (TMAH), tetraethylammonium hydroxide (TEAH), tetrapropylammonium hydroxide (TPAH), or tetrabutylammonium hydroxide (TBAH). The resist film in the exposed area is dissolved in the developer whereas the resist film in the unexposed area is not dissolved. In this way, the desired positive pattern is formed on the substrate. Inversely in the case of negative resist, the exposed area of resist film is insolubilized and the unexposed area is dissolved in the developer. It is appreciated that the resist composition of the invention is best suited for micro-patterning using such high-energy radiation as KrF and ArF excimer laser, EB, EUV, x-ray, soft x-ray, γ-ray and synchrotron radiation.

In an alternative embodiment, a negative pattern may be formed via organic solvent development using a positive resist composition comprising a base polymer having an acid labile group. The developer used herein is preferably selected from among 2-octanone, 2-nonanone, 2-heptanone, 3-heptanone, 4-heptanone, 2-hexanone, 3-hexanone, diisobutyl ketone, methylcyclohexanone, acetophenone, methylacetophenone, propyl acetate, butyl acetate, isobutyl acetate, pentyl acetate, butenyl acetate, isopentyl acetate, propyl formate, butyl formate, isobutyl formate, pentyl formate, isopentyl formate, methyl valerate, methyl pentenoate, methyl crotonate, ethyl crotonate, methyl propionate, ethyl propionate, ethyl 3-thoxypropionate, methyl lactate, ethyl lactate, propyl lactate, butyl lactate, isobutyl lactate, pentyl lactate, isopentyl lactate, methyl 2-hydroxyisobutyrate, ethyl 2-hydroxyisobutyrate, methyl benzoate, ethyl benzoate, phenyl acetate, benzyl acetate, methyl phenylacetate, benzyl formate, phenylethyl formate, methyl 3-phenylpropionate, benzyl propionate, ethyl phenylacetate, and 2-phenylethyl acetate, and mixtures thereof At the end of development, the resist film is rinsed. As the rinsing liquid, a solvent which is miscible with the developer and does not dissolve the resist film is preferred. Suitable solvents include alcohols of 3 to 10 carbon atoms, ether compounds of 8 to 12 carbon atoms, alkanes, alkenes, and alkynes of 6 to 12 carbon atoms, and aromatic solvents. Specifically, suitable alcohols of 3 to 10 carbon atoms include n-propyl alcohol, isopropyl alcohol, 1-butyl alcohol, 2-butyl alcohol, isobutyl alcohol, t-butyl alcohol, 1-pentanol, 2-pentanol, 3-pentanol, t-pentyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-ethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, and 1-octanol. Suitable ether compounds of 8 to 12 carbon atoms include di-n-butyl ether, diisobutyl ether, di-s-butyl ether, di-n-pentyl ether, diisopentyl ether, di-s-pentyl ether, di-t-pentyl ether, and di-n-hexyl ether. Suitable alkanes of 6 to 12 carbon atoms include hexane, heptane, octane, nonane, decane, undecane, dodecane, methylcyclopentane, dimethylcyclopentane, cyclohexane, methylcyclohexane, dimethylcyclohexane, cycloheptane, cyclooctane, and cyclononane. Suitable alkenes of 6 to 12 carbon atoms include hexene, heptene, octene, cyclohexene, methylcyclohexene, dimethylcyclohexene, cycloheptene, and cyclooctene. Suitable alkynes of 6 to 12 carbon atoms include hexyne, heptyne, and octyne. Suitable aromatic solvents include toluene, xylene, ethylbenzene, isopropylbenzene, t-butylbenzene and mesitylene. The solvents may be used alone or in admixture.

Rinsing is effective for minimizing the risks of resist pattern collapse and defect formation. However, rinsing is not essential. If rinsing is omitted, the amount of solvent used may be reduced.

A hole or trench pattern after development may be shrunk by the thermal flow, RELACS® or DSA process. A hole pattern is shrunk by coating a shrink agent thereto, and baking such that the shrink agent may undergo crosslinking at the resist surface as a result of the acid catalyst diffusing from the resist layer during bake, and the shrink agent may attach to the sidewall of the hole pattern. The bake is preferably at a temperature of 70 to 180° C., more preferably 80 to 170° C., for a time of 10 to 300 seconds. The extra shrink agent is stripped and the hole pattern is shrunk.

EXAMPLE

Examples of the invention are given below by way of illustration and not by way of limitation. The abbreviation "pbw" is parts by weight.

Acid generators, designated PAG 1 to PAG 21, used in resist compositions are identified below. PAG 1 to PAG 21 were synthesized by ion exchange between an ammonium salt of an iodized benzene ring-containing fluorosulfonic acid providing the anion shown below and a sulfonium or iodonium chloride providing the cation shown below.

PAG 1

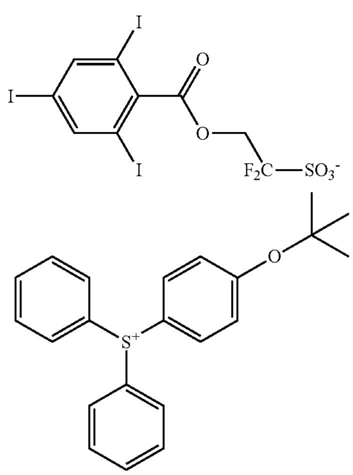

PAG 2

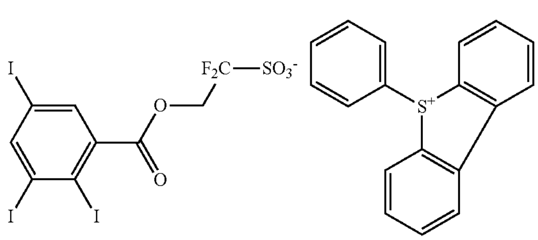

-continued

PAG 3

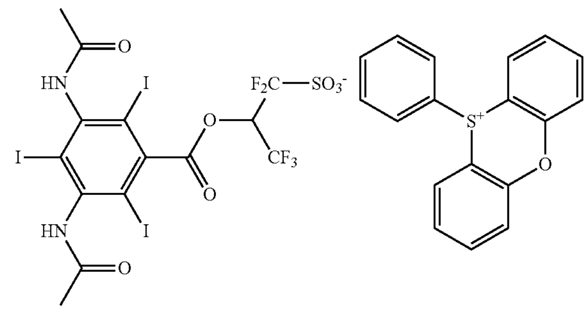

PAG 4

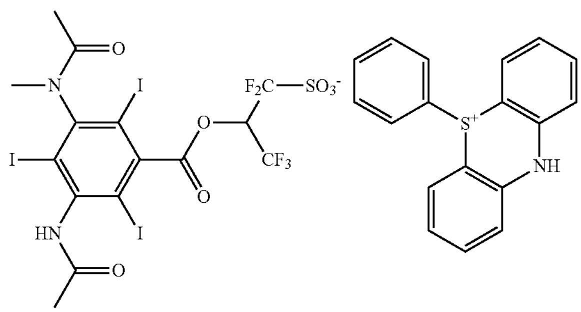

PAG 5

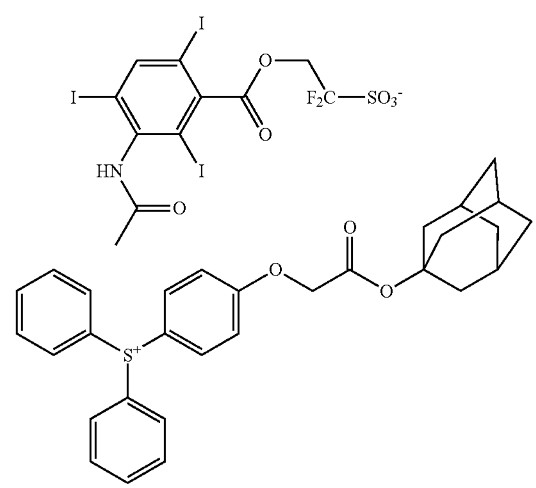

PAG 6

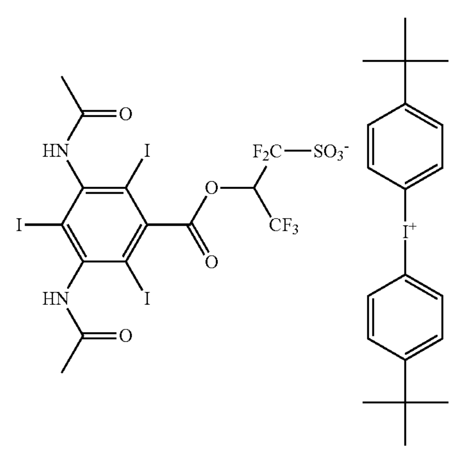

-continued
PAG 7
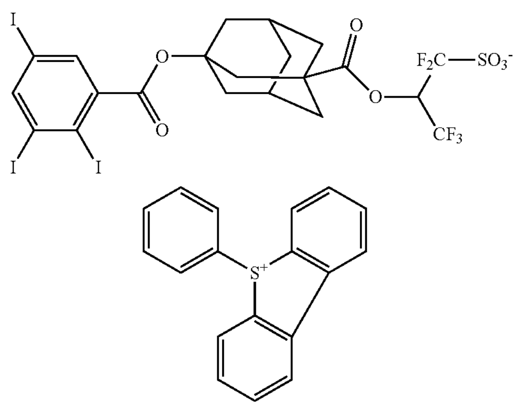
PAG 8
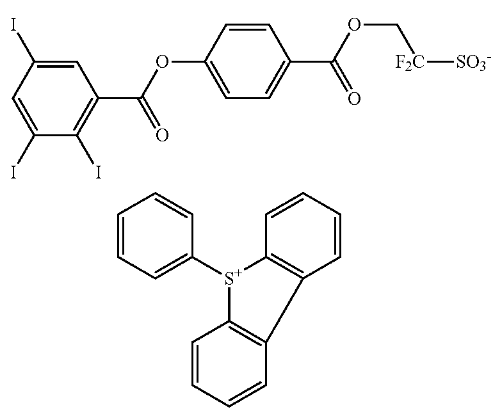
PAG 9
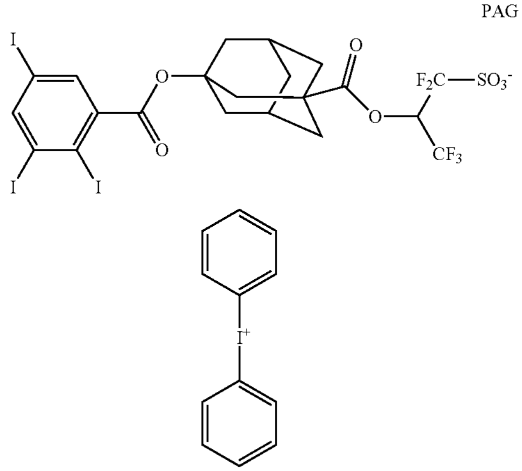
-continued
PAG 10
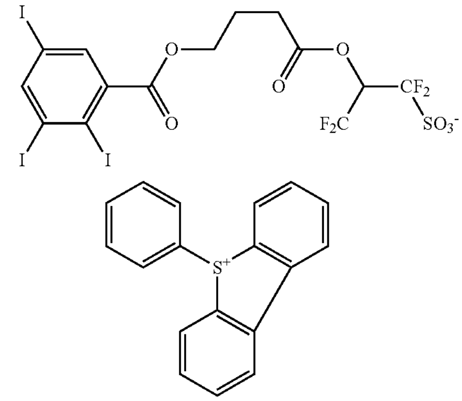
PAG 11
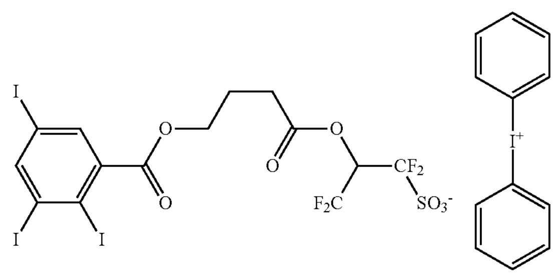
PAG 12
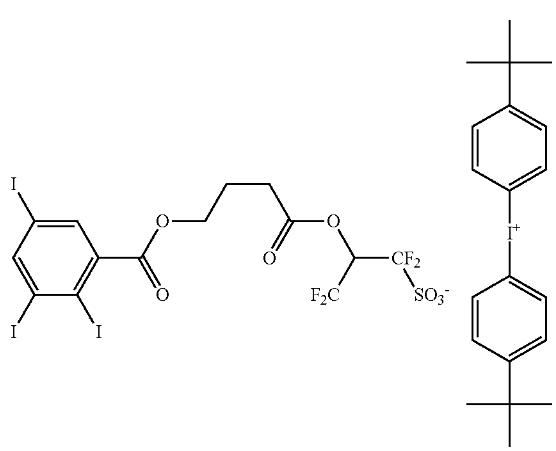

-continued
PAG 13
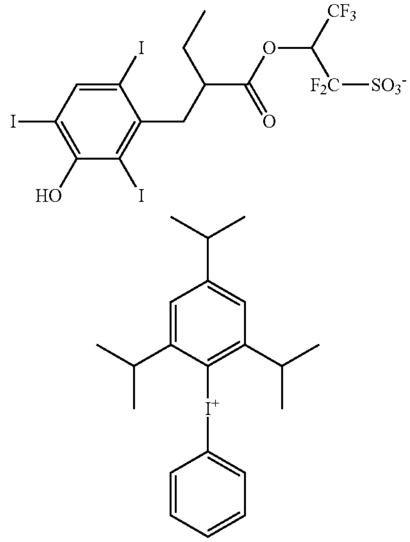
PAG 14
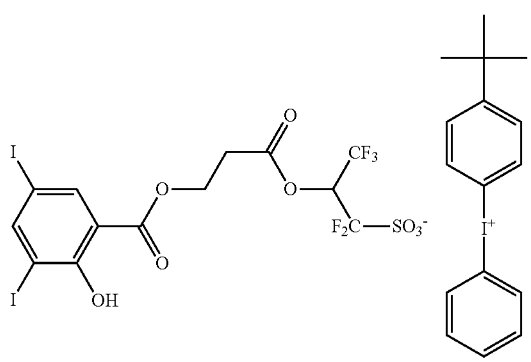
PAG 15
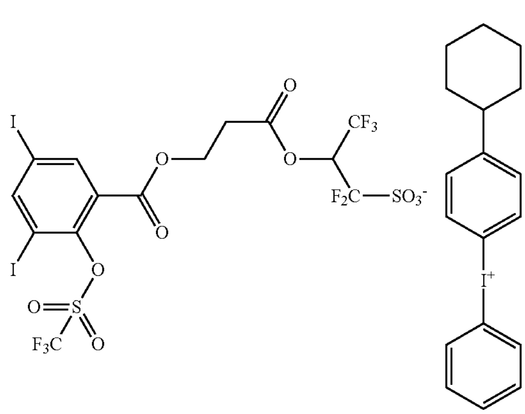
-continued
PAG 16
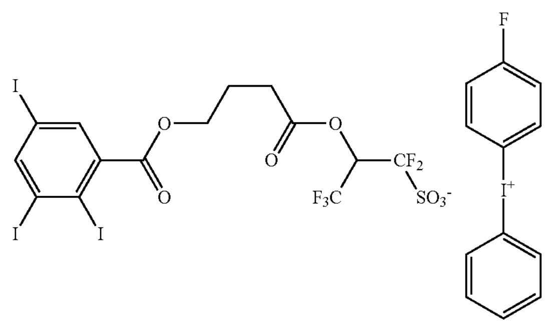
PAG 17
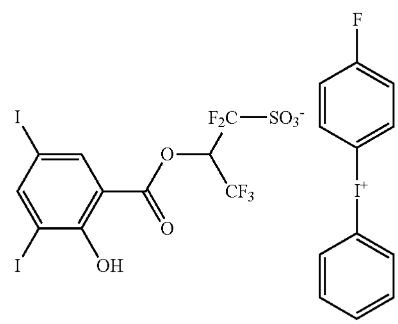
PAG 18
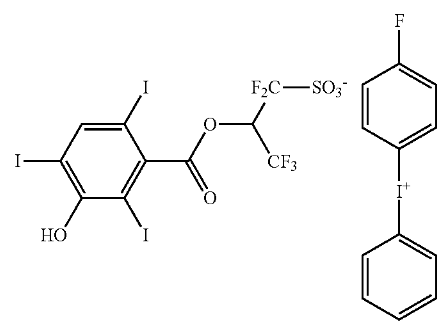
PAG 19
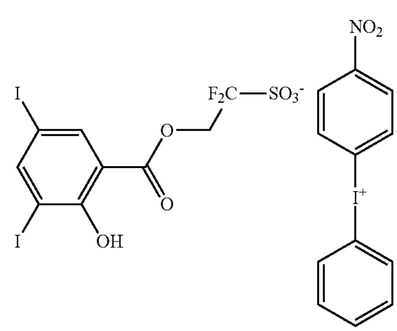

-continued

PAG 20

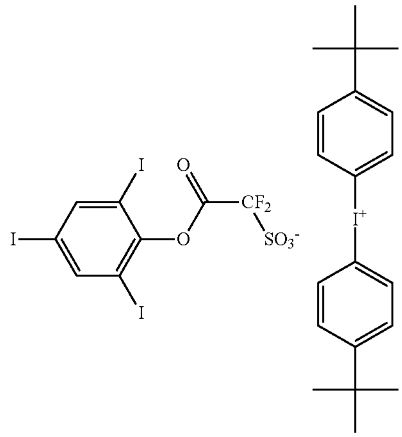

PAG 21

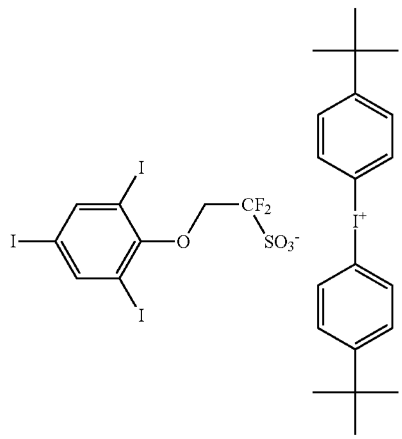

Synthesis Example

Synthesis of Base Polymers (Polymers 1 to 9, Comparative Polymers 1, 2)

Base polymers were prepared by combining suitable monomers, effecting copolymerization reaction thereof in tetrahydrofuran (THF) solvent, pouring the reaction solution into methanol for crystallization, repeatedly washing with hexane, isolation, and drying. The resulting polymers, designated Polymers 1 to 9 and Comparative Polymers 1 and 2, were analyzed for composition by $^{1}$H-NMR spectroscopy, and for Mw and Mw/Mn by GPC versus polystyrene standards using THF solvent.

Polymer 1

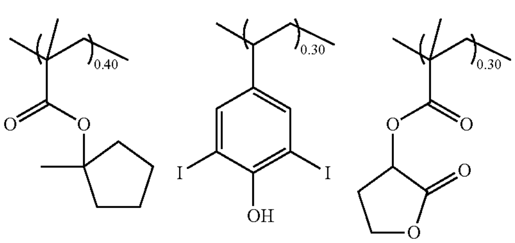

Mw = 7,700
Mw/Mn = 1.73

-continued

Polymer 2

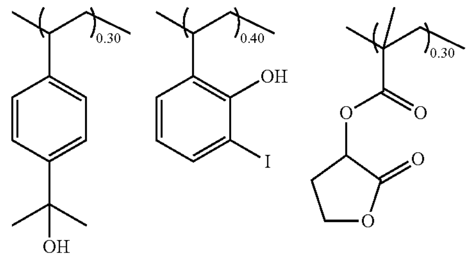

Mw = 8,100
Mw/Mn = 1.65

Polymer 3

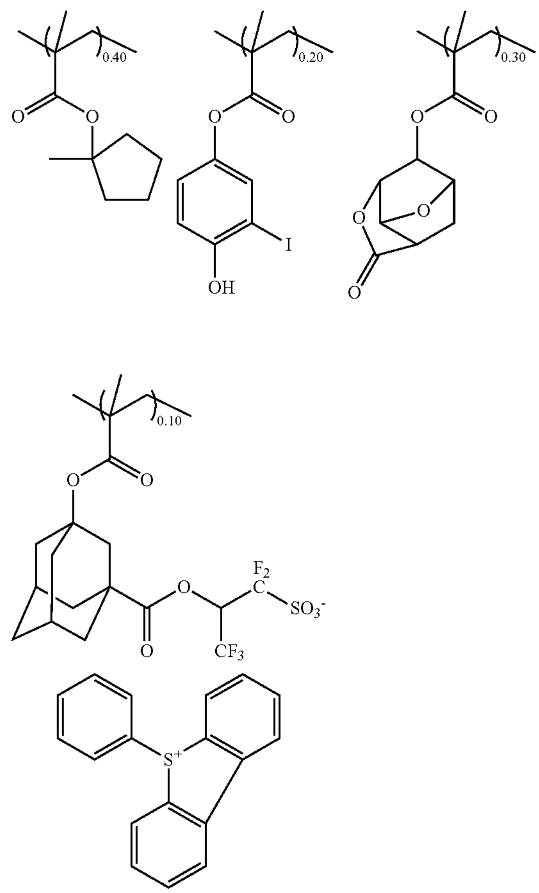

Mw = 7,600
Mw/Mn = 1.73

Polymer 4

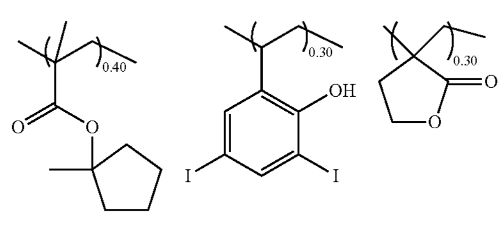

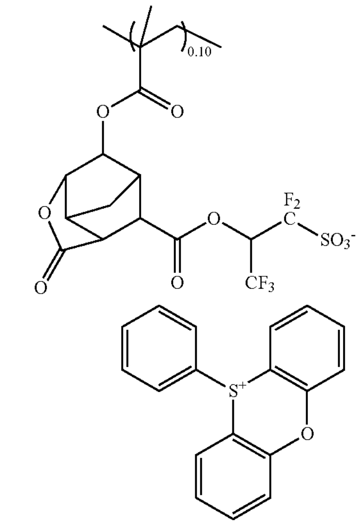
Mw = 7,600
Mw/Mn = 1.73
Polymer 5
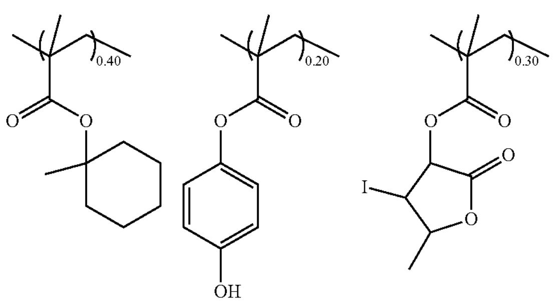
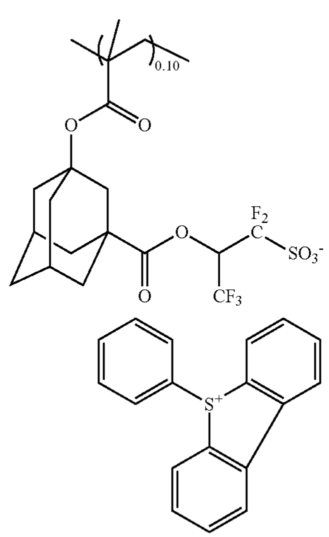
Mw = 8,900
Mw/Mn = 1.88
Polymer 6
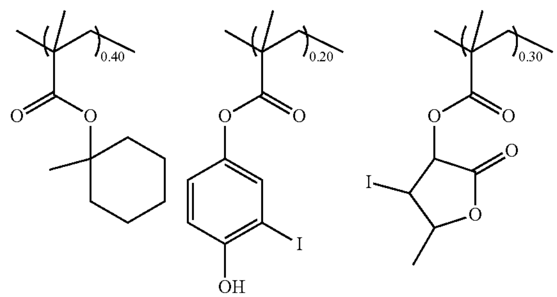
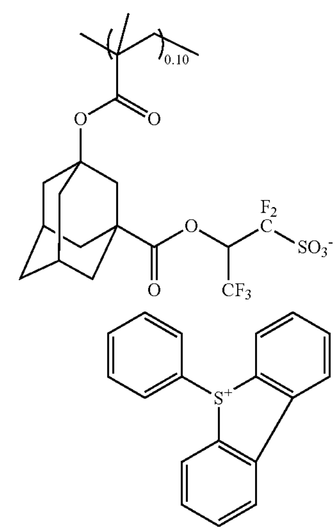
Mw = 9,200
Mw/Mn = 1.92
Polymer 7
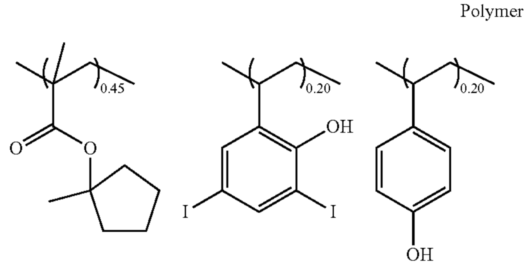

-continued
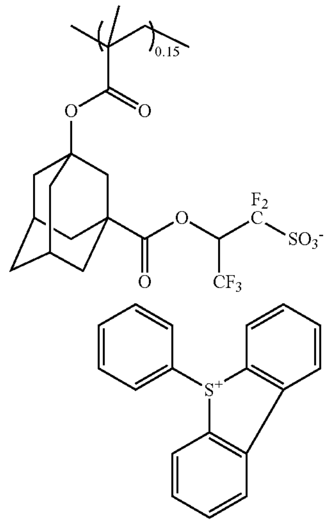
Mw = 9,600
Mw/Mn = 1.93
Polymer 8
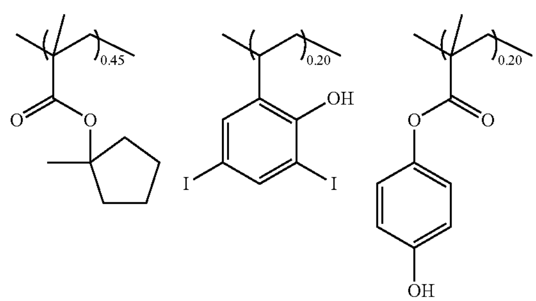
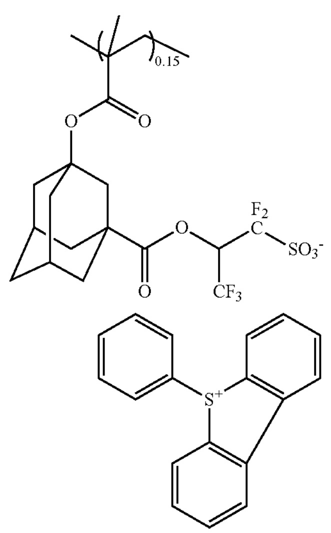
Mw = 9,900
Mw/Mn = 1.97
-continued
Polymer 9
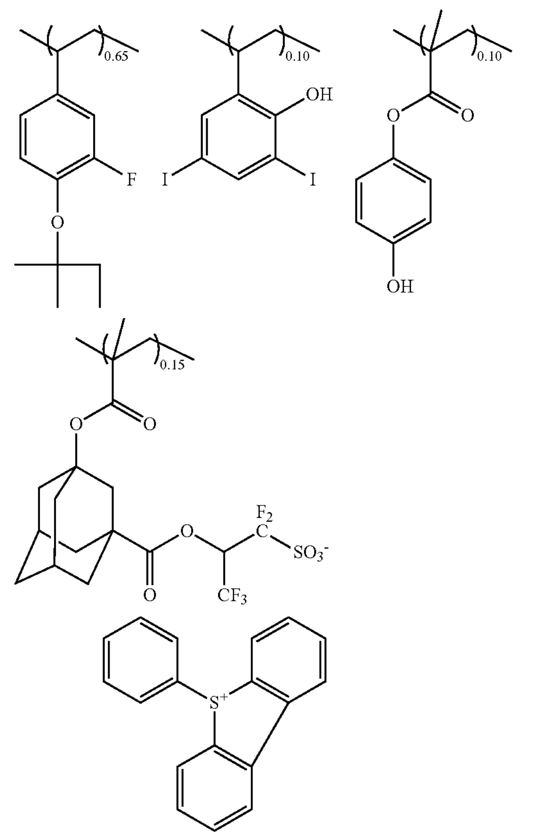
Mw = 10,100
Mw/Mn = 1.69
Comparative Polymer 1
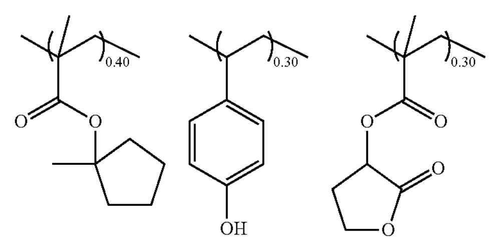
Mw = 7,200
Mw/Mn = 1.71
Comparative Polymer 2
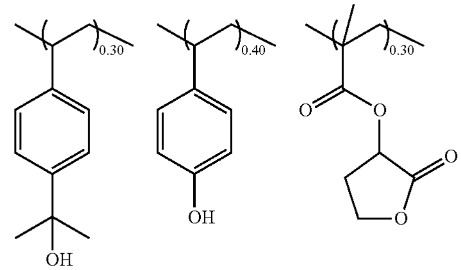
Mw = 8,600
Mw/Mn = 1.79

EXAMPLES AND COMPARATIVE EXAMPLES

Resist compositions were prepared by dissolving the polymer and selected components in a solvent in accordance with the recipe shown in Tables 1 and 2, and filtering through a filter having a pore size of 0.2 μm. The solvent contained 100 ppm of surfactant FC-4430 (3M). The components in Tables 1 and 2 are as identified below.

Organic Solvents:
- PGMEA (propylene glycol monomethyl ether acetate)
- GBL (γ-butyrolactone)
- CyH (cyclohexanone)
- PGME (propylene glycol monomethyl ether)
- DAA (diacetone alcohol)

Comparative Acid Generators: C-PAG 1 and C-PAG 2 of the Following Structural Formulae

C-PAG 1

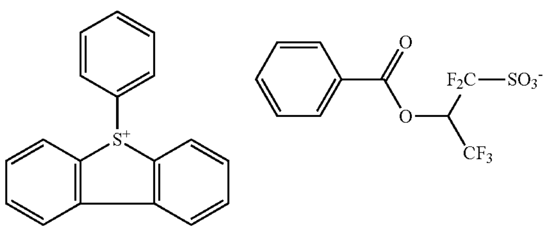

C-PAG 2

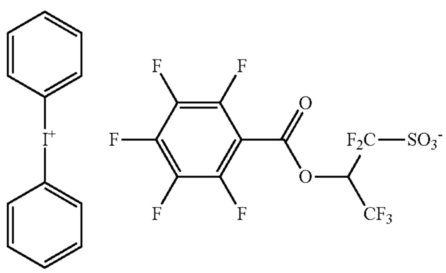

Quenchers 1 and 2 of the Following Structural Formulae

Quencher 1

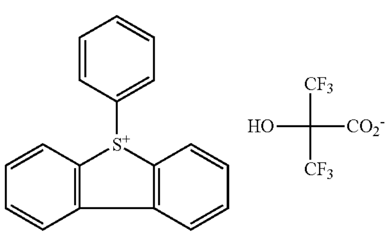

-continued

Quencher 2

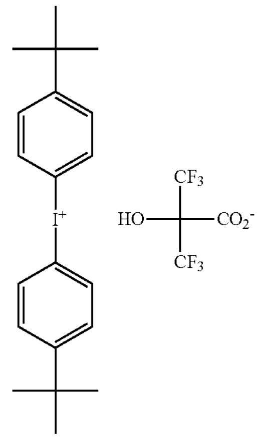

EUV Lithography Test

Examples 1 to 29 and Comparative Examples 1 to 4

Each of the resist compositions in Tables 1 and 2 was spin coated on a silicon substrate having a 20-nm coating of silicon-containing spin-on hard mask SHB-A940 (Shin-Etsu Chemical Co., Ltd., Si content 43 wt %) and prebaked on a hotplate at 105° C. for 60 seconds to form a resist film of 60 nm thick. Using an EUV scanner NXE3300 (ASML, NA 0.33, σ0.9/0.6, quadrupole illumination), the resist film was exposed to EUV through a mask bearing a hole pattern at a pitch 46 nm (on-wafer size) and +20% bias. The resist film was baked (PEB) on a hotplate at the temperature shown in Tables 1 and 2 for 60 seconds and developed in a 2.38 wt % TMAH aqueous solution for 30 seconds to form a pattern. In Examples 1 to 28 and Comparative Examples 1 to 3, a positive resist pattern, i.e., hole pattern having a size of 23 nm was formed. In Example 29 and Comparative Example 4, a negative resist pattern, i.e., dot pattern having a size of 23 nm was formed.

The resist pattern was observed under CD-SEM (CG-5000, Hitachi High-Technologies Corp.). The exposure dose that provides a hole or dot pattern having a size of 23 nm is reported as sensitivity. The size of 50 holes or dots was measured, from which a size variation (3σ) was computed and reported as CDU.

The resist composition is shown in Tables 1 and 2 together with the sensitivity and CDU of EUV lithography.

TABLE 1

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Example | 1 | Polymer 1 (100) | PAG 1 (20.0) | Quencher 1 (3.00) | PGMEA (400) CyH (2,000) PGME (100) | 100 | 14 | 3.7 |
| | 2 | Polymer 1 (100) | PAG 2 (20.0) | Quencher 2 (3.00) | PGMEA (2,200) GBL (400) | 100 | 16 | 3.0 |
| | 3 | Polymer 1 (100) | PAG 3 (20.0) | Quencher 2 (3.00) | PGMEA (2,000) DAA (500) | 100 | 18 | 2.8 |
| | 4 | Polymer 1 (100) | PAG 4 (20.0) | Quencher 2 (3.00) | PGMEA (2,000) DAA (500) | 100 | 19 | 2.7 |

TABLE 1-continued

| | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|
| 5 | Polymer 1 (100) | PAG 5 (25.0) | Quencher 2 (3.00) | PGMEA (2,000) DAA (500) | 100 | 16 | 2.8 |
| 6 | Polymer 1 (100) | PAG 6 (22.0) | Quencher 2 (3.00) | PGMEA (2,000) DAA (500) | 100 | 18 | 2.4 |
| 7 | Polymer 1 (100) | PAG 7 (25.0) | Quencher 2 (3.00) | PGMEA (2,000) DAA (500) | 100 | 16 | 2.3 |
| 8 | Polymer 1 (100) | PAG 8 (20.0) | Quencher 2 (3.00) | PGMEA (2,000) DAA (500) | 100 | 19 | 2.5 |
| 9 | Polymer 1 (100) | PAG 9 (26.0) | Quencher 2 (3.00) | PGMEA (2,000) DAA (500) | 100 | 17 | 2.4 |
| 10 | Polymer 1 (100) | PAG 10 (26.0) | Quencher 2 (3.00) | PGMEA (2,000) DAA (500) | 100 | 17 | 2.4 |
| 11 | Polymer 1 (100) | PAG 11 (25.0) | Quencher 2 (3.00) | PGMEA (2,000) DAA (500) | 100 | 15 | 2.1 |
| 12 | Polymer 1 (100) | PAG 12 (24.0) | Quencher 2 (3.00) | PGMEA (2,000) DAA (500) | 100 | 16 | 2.0 |
| 13 | Polymer 1 (100) | PAG 13 (26.0) | Quencher 2 (3.00) | PGMEA (2,000) DAA (500) | 100 | 15 | 2.3 |
| 14 | Polymer 1 (100) | PAG 14 (26.0) | Quencher 2 (3.00) | PGMEA (2,000) DAA (500) | 100 | 14 | 2.6 |
| 15 | Polymer 1 (100) | PAG 15 (25.0) | Quencher 2 (3.00) | PGMEA (2,000) DAA (500) | 100 | 15 | 2.7 |
| 16 | Polymer 1 (100) | PAG 16 (25.0) | Quencher 2 (3.00) | PGMEA (2,000) DAA (500) | 100 | 18 | 2.7 |
| 17 | Polymer 1 (100) | PAG 17 (25.0) | Quencher 2 (3.00) | PGMEA (2,000) DAA (500) | 100 | 14 | 2.6 |
| 18 | Polymer 1 (100) | PAG 18 (25.0) | Quencher 2 (3.00) | PGMEA (2,000) DAA (500) | 100 | 13 | 2.7 |
| 19 | Polymer 1 (100) | PAG 19 (250.0) | Quencher 2 (3.00) | PGMEA (2,000) DAA (500) | 100 | 17 | 2.7 |
| 20 | Polymer 1 (100) | PAG 20 (25.0) | Quencher 2 (3.00) | PGMEA (2,000) DAA (500) | 100 | 14 | 2.6 |
| 21 | Polymer 1 (100) | PAG 21 (25.0) | Quencher 2 (3.00) | PGMEA (2,000) DAA (500) | 100 | 13 | 2.8 |

TABLE 2

| | | Polymer (pbw) | Acid generator (pbw) | Quencher (pbw) | Organic solvent (pbw) | PEB temp. (° C.) | Sensitivity (mJ/cm$^2$) | CDU (nm) |
|---|---|---|---|---|---|---|---|---|
| Example | 22 | Polymer 3 (100) | PAG 1 (10.0) | Quencher 1 (3.00) | PGMEA (400) CyH (2,000) PGME (100) | 100 | 12 | 2.0 |
| | 23 | Polymer 4 (100) | PAG 2 (10.0) | Quencher 2 (3.00) | PGMEA (400) CyH (2,000) PGME (100) | 100 | 15 | 2.4 |
| | 24 | Polymer 5 (100) | PAG 3 (10.0) | Quencher 2 (3.00) | PGMEA (2,000) DAA (500) | 105 | 16 | 2.1 |
| | 25 | Polymer 6 (100) | PAG 2 (10.0) | Quencher 2 (3.00) | PGMEA (400) CyH (2,000) PGME (100) | 105 | 12 | 2.4 |
| | 26 | Polymer 7 (100) | PAG 2 (10.0) | Quencher 2 (3.00) | PGMEA (400) CyH (2,000) PGME (100) | 100 | 14 | 2.6 |
| | 27 | Polymer 8 (100) | PAG 3 (20.0) | Quencher 2 (3.00) | PGMEA (2,000) DAA (500) | 100 | 13 | 2.8 |
| | 28 | Polymer 9 (100) | PAG 3 (20.0) | Quencher 2 (3.00) | PGMEA (2,000) DAA (500) | 100 | 19 | 2.6 |
| | 29 | Polymer 2 (100) | PAG 3 (20.0) | Quencher 2 (3.00) | PGMEA (2,000) DAA (500) | 100 | 17 | 3.8 |
| Comparative Example | 1 | Polymer 1 (100) | C-PAG 1 (20.0) | Quencher 2 (3.00) | PGMEA (400) CyH (2,000) PGME (100) | 100 | 25 | 4.0 |
| | 2 | Comparative Polymer 1 (100) | PAG 1 (20.0) | Quencher 2 (3.00) | PGMEA (400) CyH (2,000) PGME (100) | 100 | 25 | 3.0 |
| | 3 | Comparative Polymer 1 (100) | C-PAG 1 (20.0) | Quencher 2 (3.00) | PGMEA (400) CyH (2,000) PGME (100) | 100 | 30 | 4.0 |
| | 4 | Comparative Polymer 2 (100) | C-PAG 2 (20.0) | Quencher 2 (3.00) | PGMEA (400) CyH (2,000) PGME (100) | 100 | 30 | 5.0 |

It is demonstrated in Tables 1 and 2 that resist compositions comprising an iodized polymer and an iodized benzene ring-containing fluorosulfonic acid onium salt within the scope of the invention offer a high sensitivity and improved CDU.

Japanese Patent Application Nos. 2017-183795 and 2018-054115 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A resist composition comprising a base polymer containing an iodized polymer, and an acid generator containing a sulfonium salt and/or iodonium salt of iodized benzene ring-containing fluorosulfonic acid.

2. The resist composition of claim 1 wherein the sulfonium salt and iodonium salt of iodized benzene ring-containing fluorosulfonic acid are a sulfonium salt having the formula (A-1) and an iodonium salt having the formula (A-2), respectively, (A-1)

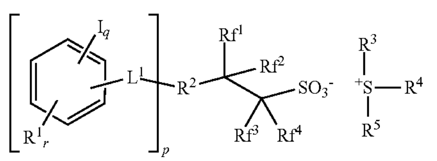

(A-2)

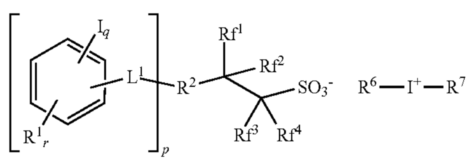

wherein $L^1$ is a single bond, ether bond, ester bond, or a $C_1$-$C_6$ alkylene group which may contain an ether bond or ester bond, $R^1$ is a hydroxyl, carboxyl, fluorine, chlorine, bromine, or amino group, or a $C_1$-$C_{20}$ alkyl, $C_1$-$C_{20}$ alkoxy, $C_2$-$C_{10}$ alkoxycarbonyl, $C_2$-$C_{20}$ acyloxy or $C_1$-$C_{20}$ alkylsulfonyloxy group, which may contain fluorine, chlorine, bromine, hydroxyl, amino or $C_1$-$C_{10}$ alkoxy moiety, or —$NR^8$—C(═O)—$R^9$ or —$NR^8$—C(═O)—O—$R^9$, $R^8$ is hydrogen, or a $C_1$-$C_6$ alkyl group which may contain halogen, hydroxyl, $C_1$-$C_6$ alkoxy, $C_2$-$C_6$ acyl or $C_2$-$C_6$ acyloxy moiety, $R^9$ is a $C_1$-$C_{16}$ alkyl, $C_2$-$C_{16}$ alkenyl, or $C_6$-$C_{12}$ aryl group, which may contain a halogen, hydroxyl, $C_1$-$C_6$ alkoxy, $C_2$-$C_6$ acyl or $C_2$-$C_6$ acyloxy moiety, $R^2$ is a single bond or $C_1$-$C_{20}$ divalent linking group when p=1, or a $C_1$-$C_{20}$ tri- or tetravalent linking group when p=2 or 3, the linking group optionally containing an oxygen, sulfur or nitrogen atom, $Rf^1$ to $Rf^4$ are each independently hydrogen, fluorine or trifluoromethyl, at least one of $Rf^1$ to $Rf^4$ being fluorine or trifluoromethyl, $Rf^1$ and $Rf^2$ taken together may form a carbonyl group, $R^3$, $R^4$, $R^5$, $R^6$ and $R^7$ are each independently a $C_1$-$C_{20}$ monovalent hydrocarbon group which may contain a heteroatom, any two of $R^3$, $R^4$, and $R^5$ may bond together to form a ring with the sulfur atom to which they are attached, p is an integer of 1 to 3, q is an integer of 1 to 5, r is an integer of 0 to 3, and $1 \le q+r \le 5$.

3. The resist composition of claim 1 wherein the iodized polymer comprises recurring units having the formula (a1) or (a2):

(a1)

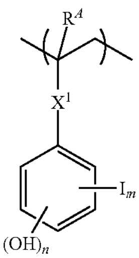

(a2)

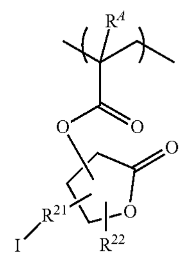

wherein $R^A$ is each independently hydrogen or methyl, $R^{21}$ is a single bond or methylene, $R^{22}$ is hydrogen or $C_1$-$C_4$ alkyl, $X^1$ is a single bond, ether bond, ester bond, amide bond, —C(═O)—O—$R^{23}$—, phenylene, -Ph-C(═O)—O—$R^{24}$—, or -Ph-$R^{25}$—O—C(═O)—$R^{26}$—, Ph is phenylene, $R^{23}$ is a $C_1$-$C_{10}$ alkylene group which may contain an ether bond or ester bond, $R^{24}$, $R^{25}$ and $R^{26}$ are each independently a single bond or a $C_1$-$C_6$ straight or branched alkylene group, m is an integer of 1 to 5, n is an integer of 0 to 4, and $1 \le m+n \le 5$.

4. The resist composition of claim 3 wherein n is an integer of 1 to 3.

5. The resist composition of claim 1, further comprising an organic solvent.

6. The resist composition of claim 1 wherein the iodized polymer further comprises recurring units having the formula (b1) or (b2):

(b1)

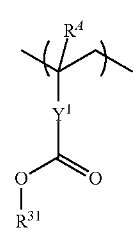

-continued (b2)

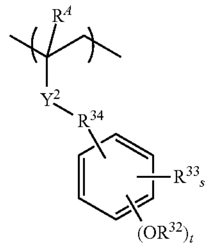

wherein $R^A$ is each independently hydrogen or methyl, $Y^1$ is a single bond, phenylene group, naphthylene group, or a $C_1$-$C_{12}$ linking group containing an ester bond or lactone ring, $Y^2$ is a single bond or ester bond, $R^{31}$ and $R^{32}$ are each independently an acid labile group, $R^{33}$ is fluorine, trifluoromethyl, cyano, $C_1$-$C_6$ alkyl, $C_1$-$C_6$ alkoxy, $C_2$-$C_7$ acyl, $C_2$-$C_7$ acyloxy, or $C_2$-$C_7$ alkoxycarbonyl group, $R^{34}$ is a single bond or a $C_1$-$C_6$ alkylene group in which at least one carbon may be substituted by an ether or ester bond, t is 1 or 2, s is an integer of 0 to 4, and $1 \le t+s \le 5$.

7. The resist composition of claim 6, further comprising a dissolution inhibitor.

8. The resist composition of claim 6 which is a chemically amplified positive resist composition.

9. The resist composition of claim 1 wherein the iodized polymer is free of an acid labile group.

10. The resist composition of claim 9, further comprising a crosslinker.

11. The resist composition of claim 9 which is a chemically amplified negative resist composition.

12. The resist composition of claim 1, further comprising a quencher.

13. The resist composition of claim 1, further comprising a surfactant.

14. The resist composition of claim 1 wherein the iodized polymer further comprises recurring units of at least one type selected from recurring units having the formulae (g1), (g2) and (g3):

(g1)

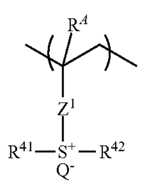

(g2)

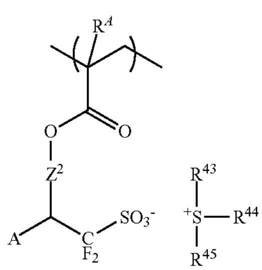

-continued (g3)

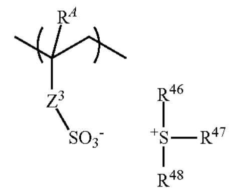

wherein $R^A$ is each independently hydrogen or methyl, $Z^1$ is a single bond, phenylene group, —O—$Z^{12}$—, or —C(=O)—$Z^{11}$—$Z^{12}$—, $Z^{11}$ is —O— or —NH—, $Z^{12}$ is a $C_1$-$C_6$ alkylene, $C_2$-$C_6$ alkenylene or phenylene group, which may contain a carbonyl, ester bond, ether bond or hydroxyl moiety, $Z^2$ is a single bond, —$Z^{21}$—C(=O)—O—, —$Z^{21}$—O— or —$Z^{21}$—O—C(=O)—, $Z^{21}$ is a $C_1$-$C_{12}$ alkylene group which may contain a carbonyl moiety, ester bond or ether bond, A is hydrogen or trifluoromethyl, $Z^3$ is a single bond, methylene, ethylene, phenylene or fluorinated phenylene group, —O—$Z^{32}$—, or —C(=O)—$Z^{31}$—$Z^{32}$—, $Z^{31}$ is —O— or —NH—, $Z^{32}$ is a $C_1$-$C_6$ alkylene, phenylene, fluorinated phenylene, trifluoromethyl-substituted phenylene, or $C_2$-$C_6$ alkenylene group, which may contain a carbonyl, ester bond, ether bond or hydroxyl moiety, $R^{41}$ to $R^{48}$ are each independently a $C_1$-$C_{20}$ monovalent hydrocarbon group which may contain a heteroatom, any two of $R^{43}$, $R^{44}$ and $R^{45}$ or any two of $R^{46}$, $R^{47}$ and $R^{48}$ may bond together to form a ring with the sulfur atom to which they are attached, and $Q^-$ is a non-nucleophilic counter ion.

15. A pattern forming process comprising the steps of coating the resist composition of claim 1 onto a substrate, baking to form a resist film, exposing the resist film to high-energy radiation, and developing the exposed resist film in a developer.

16. The process of claim 15 wherein the high-energy radiation is ArF excimer laser of wavelength 193 nm or KrF excimer laser of wavelength 248 nm.

17. The process of claim 15 wherein the high-energy radiation is EB or EUV of wavelength 3 to 15 nm.

18. The resist composition of claim 1 wherein $Rf^1$ is trifluoromethyl.

19. The resist composition of claim 1 wherein both $Rf^3$ and $Rf^4$ are fluorine.

* * * * *